US011963321B2

(12) United States Patent
Lotter et al.

(10) Patent No.: US 11,963,321 B2
(45) Date of Patent: Apr. 16, 2024

(54) LOW PROFILE LATCHING MECHANISM

(71) Applicant: Pure Storage, Inc., Mountain View, CA (US)

(72) Inventors: Eric Lotter, Gilroy, CA (US); Aditya Prabhakar, San Mateo, CA (US)

(73) Assignee: PURE STORAGE, INC., Santa Clara, CA (US)

( * ) Notice: Subject to any disclaimer, the term of this patent is extended or adjusted under 35 U.S.C. 154(b) by 1090 days.

(21) Appl. No.: 16/567,582

(22) Filed: Sep. 11, 2019

(65) Prior Publication Data
US 2021/0076518 A1 Mar. 11, 2021

(51) Int. Cl.
H05K 5/02 (2006.01)
E05B 15/16 (2006.01)
(Continued)

(52) U.S. Cl.
CPC ....... H05K 5/0221 (2013.01); E05B 15/1635 (2013.01); E05B 65/006 (2013.01);
(Continued)

(58) Field of Classification Search
CPC ...... H05K 5/0221; H05K 5/03; H05K 7/1488; E05B 15/1635; E05B 65/006; E05B 65/025; E05B 2015/165; E05B 55/00; E05B 63/244; E05C 1/04; E05C 1/00; E05C 1/004; E05C 1/08; E05C 1/085; E05C 1/10; E05C 7/04; E05C 7/045; E05Y 2900/208; Y10S 292/11; Y10T 292/096;
(Continued)

(56) References Cited

U.S. PATENT DOCUMENTS 5,208,813 A 5/1993 Stallmo
5,325,263 A * 6/1994 Singer ................ H01R 13/6315
439/157
(Continued)

FOREIGN PATENT DOCUMENTS

CN 103370685 A 10/2013
CN 103370686 A 10/2013
(Continued)

OTHER PUBLICATIONS

Microsoft Corporation, "GCSettings.IsServerGC Property", Retrieved Oct. 27, 2013 via the WayBack Machine, 3 pages.
(Continued)

*Primary Examiner* — Victor D Batson
*Assistant Examiner* — James Edward Ignaczewski

(57) ABSTRACT

A latching mechanism includes a latch housing comprising a plurality of standoffs, a mechanical energy storage component operatively coupled to the latch housing and a latch positioned inside the latch housing and operatively coupled to the mechanical energy storage component on a first side of the latch, the latch comprising a first opening positioned near the center of a body of the latch, a plurality of second openings positioned near the perimeter of the body of the latch and a ridge on a second side of the latch, wherein each of the plurality of standoffs protrude into a corresponding second opening of the plurality of second openings and wherein the latch moves in a lateral direction relative to the latch housing.

8 Claims, 25 Drawing Sheets

(51) Int. Cl.
  *E05B 65/00* (2006.01)
  *E05C 1/04* (2006.01)
  *H05K 5/03* (2006.01)
  *H05K 7/14* (2006.01)
(52) U.S. Cl.
  CPC .............. *E05C 1/04* (2013.01); *H05K 5/03* (2013.01); *H05K 7/1488* (2013.01); *E05B 2015/165* (2013.01); *E05Y 2900/208* (2013.01)
(58) Field of Classification Search
  CPC ......... Y10T 292/0969; Y10T 292/0997; Y10T 292/1022; Y10T 292/1023; Y10T 292/11; Y10T 292/21
  USPC ................ 292/341.15, 163, 164, 169, 170; 361/727, 801, 803
  See application file for complete search history.

(56) References Cited

U.S. PATENT DOCUMENTS

| | | | |
|---|---|---|---|
| 5,403,639 A | 4/1995 | Belsan | |
| 5,940,838 A | 8/1999 | Schmuck et al. | |
| 6,263,350 B1 | 7/2001 | Wollrath et al. | |
| 6,412,045 B1 | 6/2002 | DeKoning et al. | |
| 6,718,448 B1 | 4/2004 | Ofer | |
| 6,757,769 B1 | 6/2004 | Ofer | |
| 6,799,283 B1 | 9/2004 | Tamai et al. | |
| 6,817,637 B1 * | 11/2004 | Anderson | E05B 15/022 292/341.15 |
| 6,834,298 B1 | 12/2004 | Singer et al. | |
| 6,850,938 B1 | 2/2005 | Sadjadi | |
| 6,915,434 B1 | 7/2005 | Kuroda | |
| 6,973,549 B1 | 12/2005 | Testardi | |
| 7,028,216 B2 | 4/2006 | Aizawa et al. | |
| 7,028,218 B2 | 4/2006 | Schwarm et al. | |
| 7,039,827 B2 | 5/2006 | Meyer et al. | |
| 7,216,164 B1 | 5/2007 | Whitmore et al. | |
| 7,447,013 B2 * | 11/2008 | Shi | G06F 1/187 |
| 7,783,682 B1 | 8/2010 | Patterson | |
| 7,873,619 B1 | 1/2011 | Faibish et al. | |
| 7,913,300 B1 | 3/2011 | Flank et al. | |
| 7,933,936 B2 | 4/2011 | Aggarwal et al. | |
| 7,979,613 B2 | 7/2011 | Zohar et al. | |
| 8,086,652 B1 | 12/2011 | Bisson et al. | |
| 8,117,464 B1 | 2/2012 | Kogelnik | |
| 8,200,887 B2 | 6/2012 | Bennett | |
| 8,205,065 B2 | 6/2012 | Matze | |
| 8,352,540 B2 | 1/2013 | Anglin et al. | |
| 8,527,544 B1 | 9/2013 | Colgrove et al. | |
| 8,560,747 B1 | 10/2013 | Tan et al. | |
| 8,621,241 B1 | 12/2013 | Stephenson | |
| 8,700,875 B1 | 4/2014 | Barron et al. | |
| 8,751,463 B1 | 6/2014 | Chamness | |
| 8,806,160 B2 | 8/2014 | Colgrove et al. | |
| 8,874,850 B1 | 10/2014 | Goodson et al. | |
| 8,959,305 B1 | 2/2015 | Lecrone et al. | |
| 9,081,713 B1 | 7/2015 | Bennett | |
| 9,189,334 B2 | 11/2015 | Bennett | |
| 9,207,709 B2 * | 12/2015 | Xie | G06F 1/187 |
| 9,207,721 B2 * | 12/2015 | Conn | G06F 1/181 |
| 9,311,182 B2 | 4/2016 | Bennett | |
| 9,423,967 B2 | 8/2016 | Colgrove et al. | |
| 9,436,396 B2 | 9/2016 | Colgrove et al. | |
| 9,436,720 B2 | 9/2016 | Colgrove et al. | |
| 9,454,476 B2 | 9/2016 | Colgrove et al. | |
| 9,454,477 B2 | 9/2016 | Colgrove et al. | |
| 9,513,820 B1 | 12/2016 | Shalev | |
| 9,516,016 B2 | 12/2016 | Colgrove et al. | |
| 9,552,248 B2 | 1/2017 | Miller et al. | |
| 9,632,870 B2 | 4/2017 | Bennett | |
| 9,718,427 B2 * | 8/2017 | Szewczyk | E05B 85/04 |
| 2002/0038436 A1 | 3/2002 | Suzuki | |
| 2002/0087544 A1 | 7/2002 | Selkirk et al. | |
| 2002/0178335 A1 | 11/2002 | Selkirk et al. | |
| 2003/0140209 A1 | 7/2003 | Testardi | |
| 2004/0049572 A1 | 3/2004 | Yamamoto et al. | |
| 2005/0066095 A1 | 3/2005 | Mullick et al. | |
| 2005/0216535 A1 | 9/2005 | Saika et al. | |
| 2005/0223154 A1 | 10/2005 | Uemura | |
| 2006/0074940 A1 | 4/2006 | Craft et al. | |
| 2006/0093340 A1 * | 5/2006 | Yamaki | G03B 17/00 396/56 |
| 2006/0136365 A1 | 6/2006 | Kedem et al. | |
| 2006/0155946 A1 | 7/2006 | Ji | |
| 2007/0067585 A1 | 3/2007 | Ueda et al. | |
| 2007/0096477 A1 * | 5/2007 | Hirunuma | E05B 47/0002 292/150 |
| 2007/0109856 A1 | 5/2007 | Pellicone et al. | |
| 2007/0162954 A1 | 7/2007 | Pela | |
| 2007/0171562 A1 | 7/2007 | Maejima et al. | |
| 2007/0174673 A1 | 7/2007 | Kawaguchi et al. | |
| 2007/0220313 A1 | 9/2007 | Katsuragi et al. | |
| 2007/0245090 A1 | 10/2007 | King et al. | |
| 2007/0266179 A1 | 11/2007 | Chavan et al. | |
| 2008/0059699 A1 | 3/2008 | Kubo et al. | |
| 2008/0065852 A1 | 3/2008 | Moore et al. | |
| 2008/0134174 A1 | 6/2008 | Sheu et al. | |
| 2008/0155191 A1 | 6/2008 | Anderson et al. | |
| 2008/0178040 A1 | 7/2008 | Kobayashi | |
| 2008/0209096 A1 | 8/2008 | Lin et al. | |
| 2008/0244205 A1 | 10/2008 | Amano et al. | |
| 2008/0275928 A1 | 11/2008 | Shuster | |
| 2008/0282045 A1 | 11/2008 | Biswas et al. | |
| 2008/0285083 A1 | 11/2008 | Aonuma | |
| 2008/0307270 A1 | 12/2008 | Li | |
| 2009/0006587 A1 | 1/2009 | Richter | |
| 2009/0037662 A1 | 2/2009 | La Frese et al. | |
| 2009/0204858 A1 | 8/2009 | Kawaba | |
| 2009/0228648 A1 | 9/2009 | Wack | |
| 2009/0300084 A1 | 12/2009 | Whitehouse | |
| 2010/0057673 A1 | 3/2010 | Savov | |
| 2010/0058026 A1 | 3/2010 | Heil et al. | |
| 2010/0067706 A1 | 3/2010 | Anan et al. | |
| 2010/0077205 A1 | 3/2010 | Ekstrom et al. | |
| 2010/0082879 A1 | 4/2010 | McKean et al. | |
| 2010/0101285 A1 * | 4/2010 | Hsu | G06F 1/183 70/58 |
| 2010/0106905 A1 | 4/2010 | Kurashige et al. | |
| 2010/0153620 A1 | 6/2010 | McKean et al. | |
| 2010/0153641 A1 | 6/2010 | Jagadish et al. | |
| 2010/0191897 A1 | 7/2010 | Zhang et al. | |
| 2010/0250802 A1 | 9/2010 | Waugh et al. | |
| 2010/0250882 A1 | 9/2010 | Hutchison et al. | |
| 2010/0281225 A1 | 11/2010 | Chen et al. | |
| 2010/0287327 A1 | 11/2010 | Li et al. | |
| 2011/0072300 A1 | 3/2011 | Rousseau | |
| 2011/0121231 A1 | 6/2011 | Haas et al. | |
| 2011/0145598 A1 | 6/2011 | Smith et al. | |
| 2011/0161559 A1 | 6/2011 | Yurzola et al. | |
| 2011/0167221 A1 | 7/2011 | Pangal et al. | |
| 2011/0238634 A1 | 9/2011 | Kobara | |
| 2012/0023375 A1 | 1/2012 | Dutta et al. | |
| 2012/0036309 A1 | 2/2012 | Dillow et al. | |
| 2012/0117029 A1 | 5/2012 | Gold | |
| 2012/0198175 A1 | 8/2012 | Atkisson | |
| 2012/0330954 A1 | 12/2012 | Sivasubramanian et al. | |
| 2013/0042052 A1 | 2/2013 | Colgrove et al. | |
| 2013/0046995 A1 | 2/2013 | Movshovitz | |
| 2013/0047029 A1 | 2/2013 | Ikeuchi et al. | |
| 2013/0091102 A1 | 4/2013 | Nayak | |
| 2013/0205110 A1 | 8/2013 | Kettner | |
| 2013/0227236 A1 | 8/2013 | Flynn et al. | |
| 2013/0275391 A1 | 10/2013 | Batwara et al. | |
| 2013/0275656 A1 | 10/2013 | Talagala et al. | |
| 2013/0283058 A1 | 10/2013 | Fiske et al. | |
| 2013/0290648 A1 | 10/2013 | Shao et al. | |
| 2013/0318314 A1 | 11/2013 | Markus et al. | |
| 2013/0339303 A1 | 12/2013 | Potter et al. | |
| 2014/0052946 A1 | 2/2014 | Kimmel | |
| 2014/0068791 A1 | 3/2014 | Resch | |
| 2014/0089730 A1 | 3/2014 | Watanabe et al. | |
| 2014/0101361 A1 | 4/2014 | Gschwind | |
| 2014/0143517 A1 | 5/2014 | Jin et al. | |

(56) References Cited

U.S. PATENT DOCUMENTS

| | | |
|---|---|---|
| 2014/0172929 A1 | 6/2014 | Sedayao et al. |
| 2014/0201150 A1 | 7/2014 | Kumarasamy et al. |
| 2014/0215129 A1 | 7/2014 | Kuzmin et al. |
| 2014/0229131 A1 | 8/2014 | Cohen et al. |
| 2014/0229452 A1 | 8/2014 | Serita et al. |
| 2014/0281308 A1 | 9/2014 | Lango et al. |
| 2014/0325115 A1 | 10/2014 | Ramsundar et al. |
| 2015/0234709 A1 | 8/2015 | Koarashi |
| 2015/0244775 A1 | 8/2015 | Vibhor et al. |
| 2015/0278534 A1 | 10/2015 | Thiyagarajan et al. |
| 2016/0019114 A1 | 1/2016 | Han et al. |
| 2016/0098191 A1 | 4/2016 | Golden et al. |
| 2016/0098199 A1 | 4/2016 | Golden et al. |
| 2021/0134330 A1* | 5/2021 | Wu ........................ G11B 33/124 |
| 2021/0332616 A1* | 10/2021 | Burke ........................ E05C 1/12 |

FOREIGN PATENT DOCUMENTS

| | | |
|---|---|---|
| CN | 104025010 B | 11/2016 |
| EP | 3066610 A1 | 9/2016 |
| EP | 3082047 A1 | 10/2016 |
| EP | 3120235 A | 1/2017 |
| JP | 2007-087036 A | 4/2007 |
| JP | 2007-094472 A | 4/2007 |
| JP | 2008-250667 A | 10/2008 |
| JP | 2010-211681 A | 9/2010 |
| JP | 2020014433 A * | 1/2020 |
| WO | WO-1995/002349 A1 | 1/1995 |
| WO | WO-1999/013403 A1 | 3/1999 |
| WO | WO-2008/102347 A1 | 8/2008 |
| WO | WO-2010/071655 A1 | 6/2010 |

OTHER PUBLICATIONS

Microsoft Corporation, "Fundamentals of Garbage Collection", Retrieved Aug. 30, 2013 via the WayBack Machine, 11 pages.

* cited by examiner

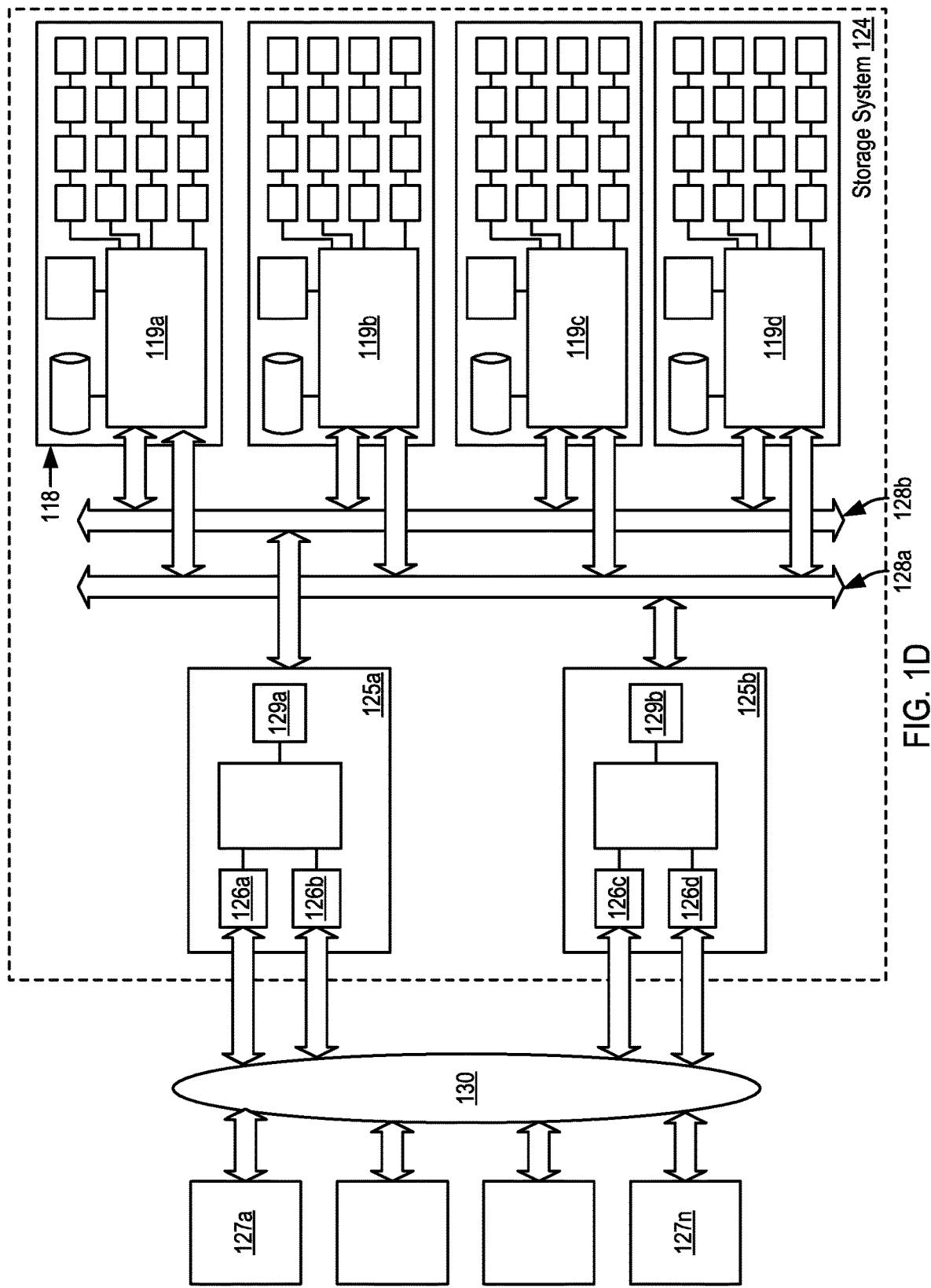

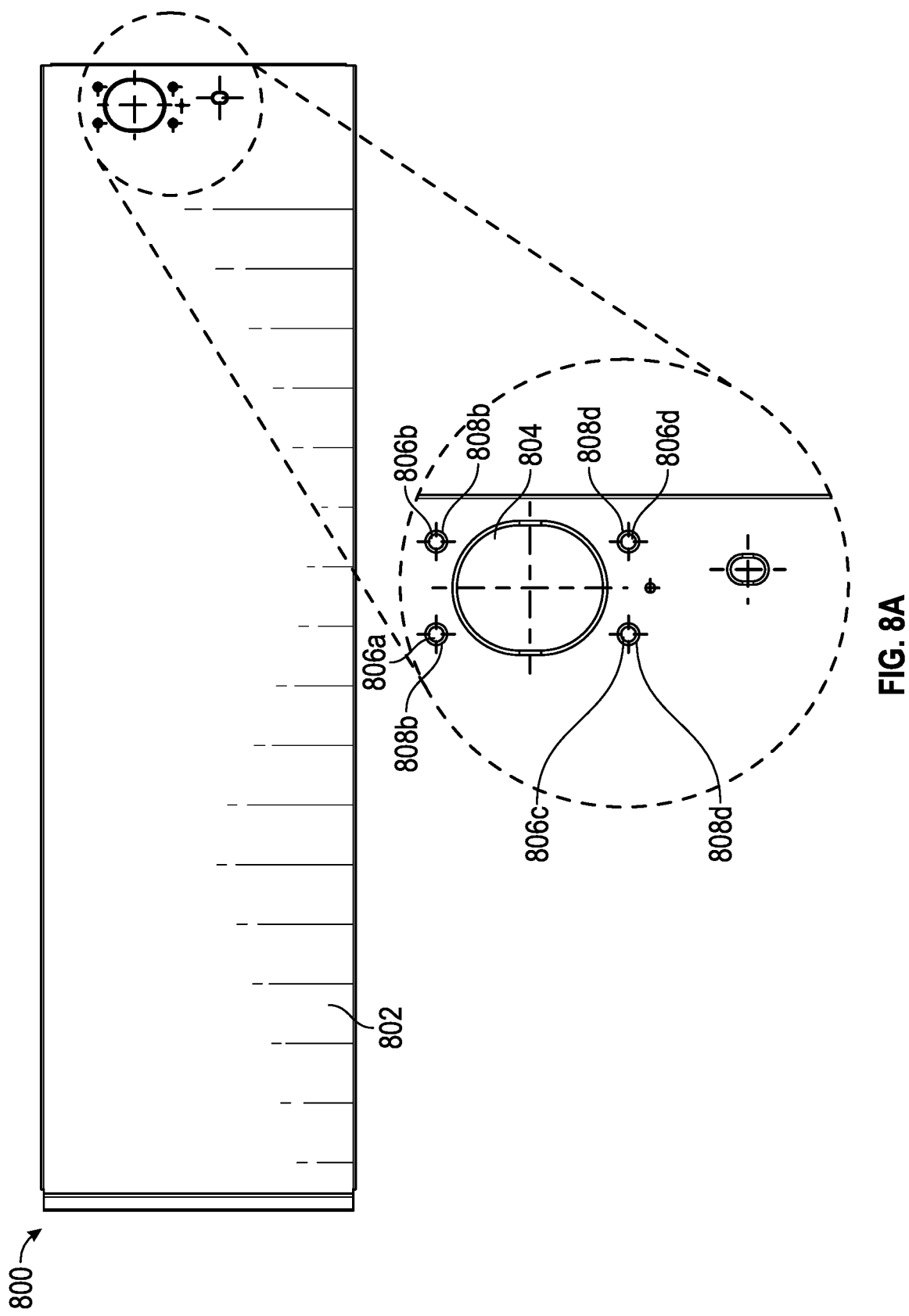

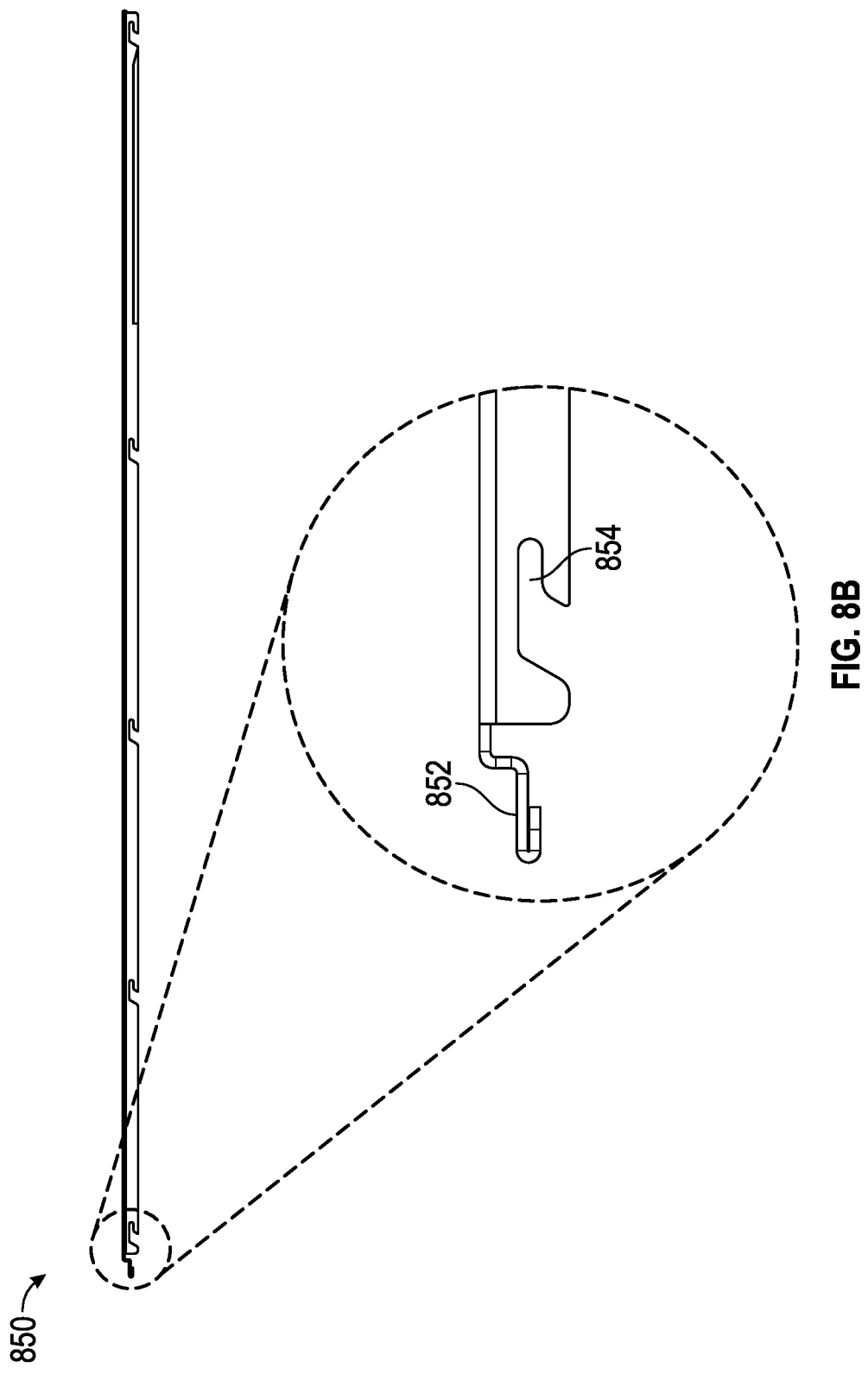

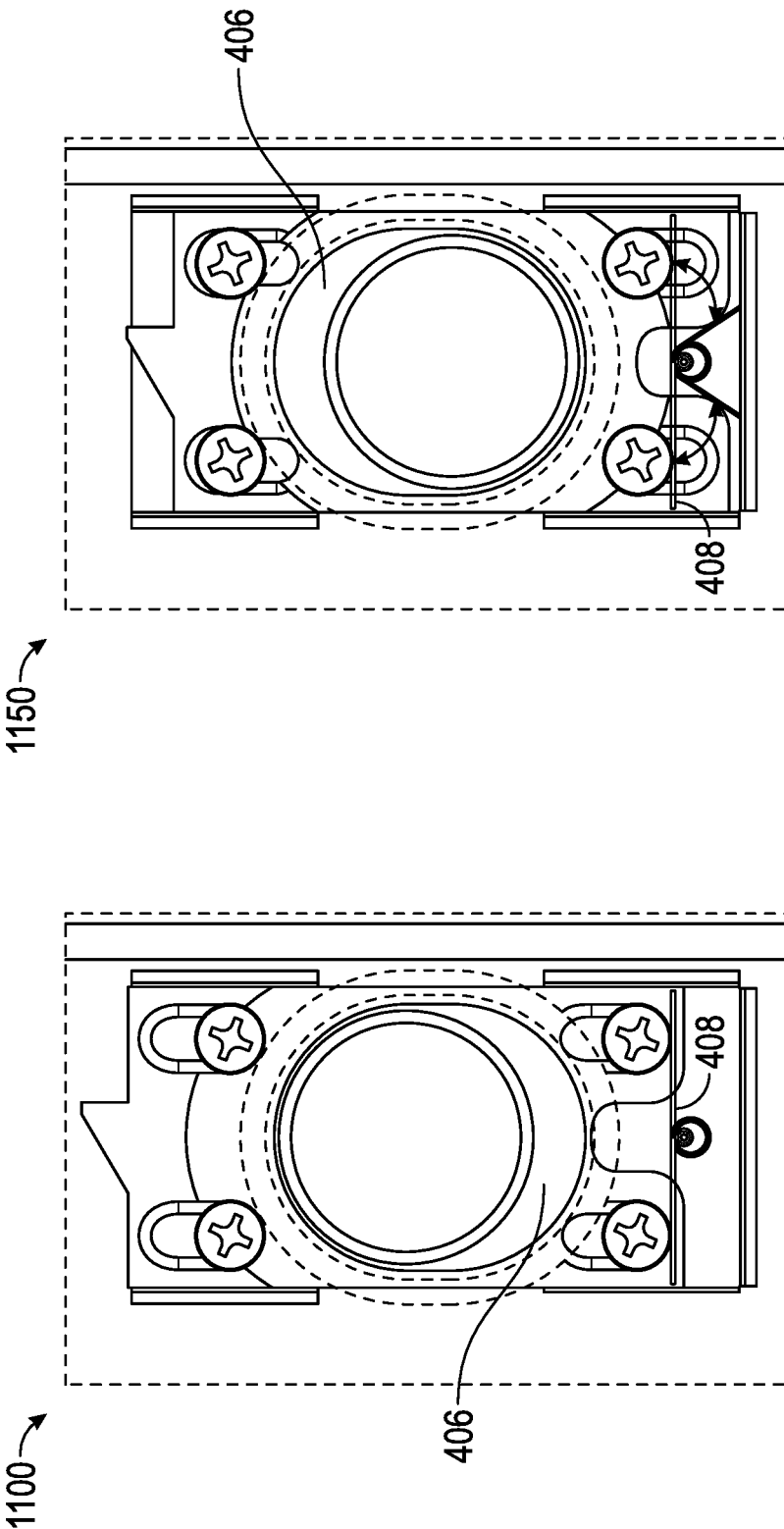

LOW PROFILE LATCHING MECHANISM

BACKGROUND

Storage systems, such as enterprise storage systems, may include a centralized or decentralized repository for data that provides common data management, data protection, and data sharing functions, for example, through connections to computer systems.

BRIEF DESCRIPTION OF DRAWINGS

FIG. 1D illustrates a fourth example system for data storage in accordance with some implementations.

FIG. 8A is a top-down view of an example of a cover of a storage system enclosure in accordance with embodiments of the disclosure.

FIG. 8B is a side-profile view of a cover of a storage system enclosure in accordance with embodiments of the disclosure.

FIG. 11A is an illustration of an example of a mechanical energy storage component providing mechanical energy to a latch of a low profile latching mechanism in accordance with embodiments of the disclosure.

FIG. 11B is an illustration of an example of a mechanical energy storage component storing mechanical energy generated by movement of a latch of a low profile latching mechanism in accordance with embodiments of the disclosure.

DETAILED DESCRIPTION

Figure 1A:
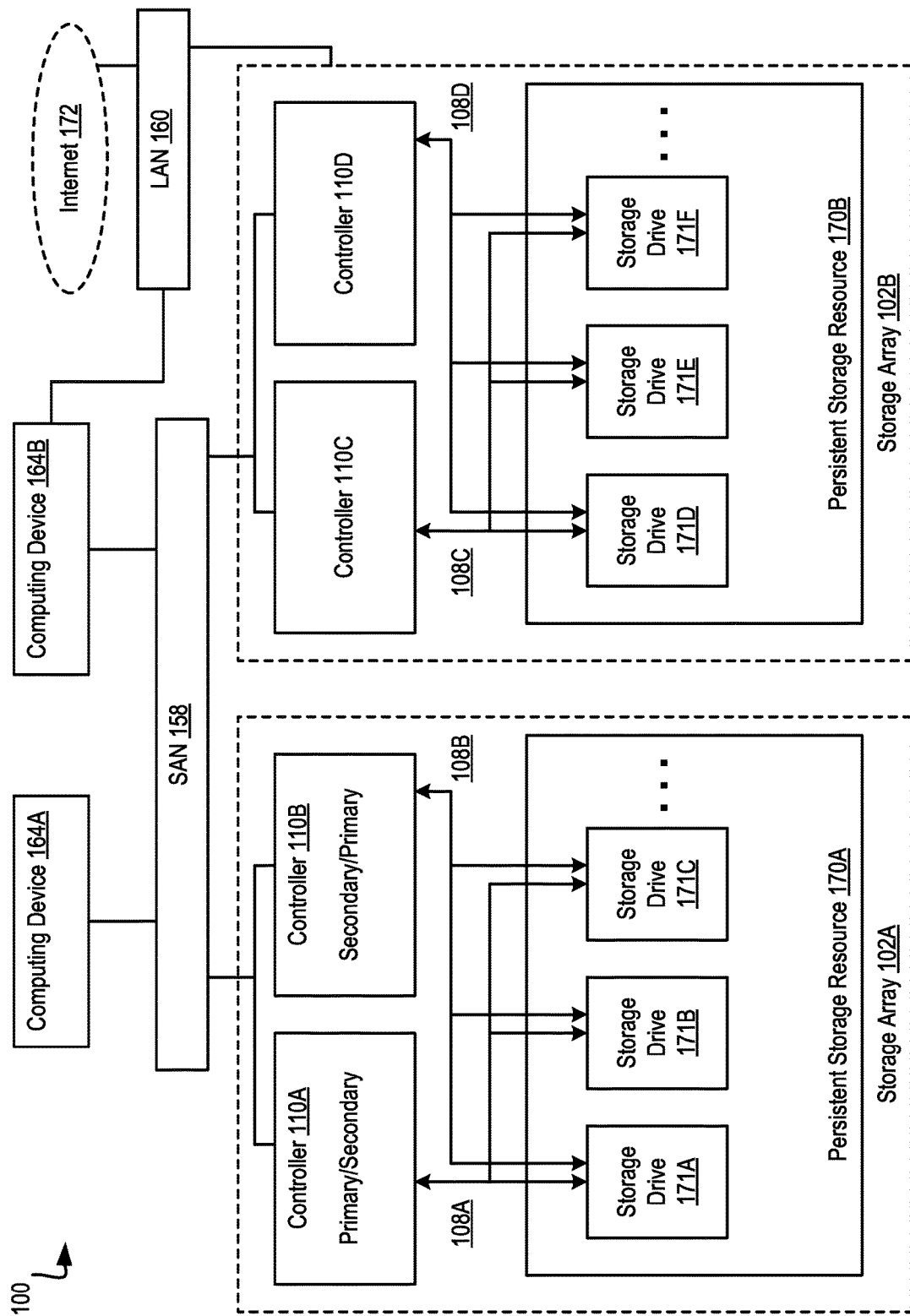
FIG. 1A illustrates a first example system for data storage in accordance with some implementations.

In embodiments, a storage system may include blade servers that utilize modular designs to save space in the storage system. Each of the blade servers includes functional components such that each of the blade servers may function as a computer. The blade servers are housed in a blade enclosure that holds multiple blade servers and provides power, cooling, networking and interconnects to the blade servers.

Each of the blade servers may include an enclosure/housing for the components of blade server. The enclosure may include a base and a cover to protect the components of the blade server. The cover may be removable to provide access to the components to identify failures, perform maintenance, replace components, etc. The cover may be secured using various mechanisms, such as latches or screws, to prevent the cover from opening. The different mechanisms used to secure the cover may each have different advantages and disadvantages. For example, latches may be quickly locked and unlocked, allowing for quick access to the components of the blade server, improving the serviceability and manufacturability of the blade server. However, when compared to other types of mechanisms, latches occupy a relatively large volume of space, leaving less room in the housing for components. Compared to latches, screws are relatively small, leaving more room in the housing for components. However, compared to latches, screws take a relatively long time to be removed or screwed in, reducing the serviceability and manufacturability of the blade servers.

As the number of components in a blade server increases and/or as the number of blade servers in a blade enclosure increases, it is becoming more important for a housing of a blade server to utilize a mechanism for securing the cover that does not occupy a large volume of space, while still providing quick access to the components of the blade server to make the blade servers easier to service and manufacture.

Turning now to embodiments of a low profile latching mechanism of a storage system. In embodiments, the low profile latching mechanism may be utilized in an enclosure/housing for the storage system. For example, the low profile latching mechanism (also referred to as "latching mechanism" hereafter) may be utilized in a blade server housing. The latching mechanism may include a latch housing that includes one or more standoffs for coupling the latch housing to a cover of the enclosure. In embodiments, the latch housing may have a height of less than 0.20 inches. A mechanical energy storage component may be operatively coupled and positioned within the latch housing. In embodiments, the mechanical energy storage component may be a torsion spring. The mechanical energy storage component may be operatively coupled to a latch and may absorb/provide mechanical energy to the latch to aid in the opening and closing of the latch.

The latch may include a circular opening near the center of the body of the latch. The circular opening may be used by a person to move the latch in a lateral direction relative to the latch housing to open and close the latching mechanism. The latch may include a ridge that interfaces with a locking pin on the base of the enclosure/housing for the storage system to secure the cover to the base. The latch may also include one or more elliptical openings near the perimeter of the body of the latch. The standoffs of the latch housing may protrude into the elliptical openings and act as guides for the latch as the latch travels laterally relative to the latch housing.

Accordingly, embodiments of the disclosure provide for an improved mechanism by providing a low profile latching mechanism. By reducing the volume of the latching mechanism compared to a conventional latch, additional space is available for components within the storage system enclosure while allowing for quick access to the components of the blade server, improving the serviceability and manufacturability of the storage system. Although described as being used as a latching mechanism for a storage system enclosure, such as a blade server housing, aspects of the present disclosure may be utilized in other applications requiring a low profile latching mechanism.

Example methods, apparatus, and products for a tiered caching system in accordance with embodiments of the present disclosure are described with reference to the accompanying drawings, beginning with FIG. 1A. FIG. 1A illustrates an example system for data storage, in accordance with some implementations. System 100 (also referred to as "storage system" herein) includes numerous elements for purposes of illustration rather than limitation. It may be noted that system 100 may include the same, more, or fewer elements configured in the same or different manner in other implementations.

System 100 includes a number of computing devices 164A-B. Computing devices (also referred to as "client devices" herein) may be embodied, for example, a server in a data center, a workstation, a personal computer, a notebook, or the like. Computing devices 164A-B may be coupled for data communications to one or more storage arrays 102A-B through a storage area network ('SAN') 158 or a local area network ('LAN') 160.

The SAN 158 may be implemented with a variety of data communications fabrics, devices, and protocols. For example, the fabrics for SAN 158 may include Fibre Channel, Ethernet, Infiniband, Serial Attached Small Computer System Interface ('SAS'), or the like. Data communications protocols for use with SAN 158 may include Advanced Technology Attachment ('ATA'), Fibre Channel Protocol, Small Computer System Interface ('SCSI'), Internet Small Computer System Interface ('iSCSI'), HyperSCSI, Non-Volatile Memory Express ('NVMe') over Fabrics, or the like. It may be noted that SAN 158 is provided for illustration, rather than limitation. Other data communication couplings may be implemented between computing devices 164A-B and storage arrays 102A-B.

The LAN 160 may also be implemented with a variety of fabrics, devices, and protocols. For example, the fabrics for LAN 160 may include Ethernet (802.3), wireless (802.11), or the like. Data communication protocols for use in LAN 160 may include Transmission Control Protocol ('TCP'), User Datagram Protocol ('UDP'), Internet Protocol ('IP'), HyperText Transfer Protocol ('HTTP'), Wireless Access Protocol ('WAP'), Handheld Device Transport Protocol ('HDTP'), Session Initiation Protocol ('SIP'), Real Time Protocol ('RTP'), or the like.

Storage arrays 102A-B may provide persistent data storage for the computing devices 164A-B. Storage array 102A may be contained in a chassis (not shown), and storage array 102B may be contained in another chassis (not shown), in implementations. Storage array 102A and 102B may include one or more storage array controllers 110A-D (also referred to as "controller" herein). A storage array controller 110A-D may be embodied as a module of automated computing machinery comprising computer hardware, computer software, or a combination of computer hardware and software. In some implementations, the storage array controllers 110A-D may be configured to carry out various storage tasks. Storage tasks may include writing data received from the computing devices 164A-B to storage array 102A-B, erasing data from storage array 102A-B, retrieving data from storage array 102A-B and providing data to computing devices 164A-B, monitoring and reporting of disk utilization and performance, performing redundancy operations, such as Redundant Array of Independent Drives ('RAID') or RAID-like data redundancy operations, compressing data, encrypting data, and so forth.

Storage array controller 110A-D may be implemented in a variety of ways, including as a Field Programmable Gate Array ('FPGA'), a Programmable Logic Chip ('PLC'), an Application Specific Integrated Circuit ('ASIC'), System-on-Chip ('SOC'), or any computing device that includes discrete components such as a processing device, central processing unit, computer memory, or various adapters. Storage array controller 110A-D may include, for example, a data communications adapter configured to support communications via the SAN 158 or LAN 160. In some implementations, storage array controller 110A-D may be independently coupled to the LAN 160. In implementations, storage array controller 110A-D may include an I/O controller or the like that couples the storage array controller 110A-D for data communications, through a midplane (not shown), to a persistent storage resource 170A-B (also referred to as a "storage resource" herein). The persistent storage resource 170A-B main include any number of storage drives 171A-F (also referred to as "storage devices" herein) and any number of non-volatile Random Access Memory ('NVRAM') devices (not shown).

In some implementations, the NVRAM devices of a persistent storage resource 170A-B may be configured to receive, from the storage array controller 110A-D, data to be stored in the storage drives 171A-F. In some examples, the data may originate from computing devices 164A-B. In some examples, writing data to the NVRAM device may be carried out more quickly than directly writing data to the storage drive 171A-F. In implementations, the storage array controller 110A-D may be configured to utilize the NVRAM devices as a quickly accessible buffer for data destined to be written to the storage drives 171A-F. Latency for write requests using NVRAM devices as a buffer may be improved relative to a system in which a storage array controller 110A-D writes data directly to the storage drives 171A-F. In some implementations, the NVRAM devices may be implemented with computer memory in the form of high bandwidth, low latency RAM. The NVRAM device is referred to as "non-volatile" because the NVRAM device may receive or include a unique power source that maintains the state of the RAM after main power loss to the NVRAM device. Such a power source may be a battery, one or more capacitors, or the like. In response to a power loss, the NVRAM device may be configured to write the contents of the RAM to a persistent storage, such as the storage drives 171A-F.

In implementations, storage drive 171A-F may refer to any device configured to record data persistently, where "persistently" or "persistent" refers as to a device's ability to maintain recorded data after loss of power. In some implementations, storage drive 171A-F may correspond to non-disk storage media. For example, the storage drive 171A-F may be one or more solid-state drives ('SSDs'), flash memory based storage, any type of solid-state non-volatile memory, or any other type of non-mechanical storage device. In other implementations, storage drive 171A-F may include mechanical or spinning hard disk, such as hard-disk drives ('HDD').

In some implementations, the storage array controllers 110A-D may be configured for offloading device management responsibilities from storage drive 171A-F in storage array 102A-B. For example, storage array controllers 110A-D may manage control information that may describe the state of one or more memory blocks in the storage drives 171A-F. The control information may indicate, for example, that a particular memory block has failed and should no longer be written to, that a particular memory block contains boot code for a storage array controller 110A-D, the number of program-erase ('P/E') cycles that have been performed on a particular memory block, the age of data stored in a particular memory block, the type of data that is stored in a particular memory block, and so forth. In some implementations, the control information may be stored with an associated memory block as metadata. In other implementations, the control information for the storage drives 171A-F may be stored in one or more particular memory blocks of the storage drives 171A-F that are selected by the storage array controller 110A-D. The selected memory blocks may be tagged with an identifier indicating that the selected memory block contains control information. The identifier may be utilized by the storage array controllers 110A-D in conjunction with storage drives 171A-F to quickly identify the memory blocks that contain control information. For example, the storage controllers 110A-D may issue a command to locate memory blocks that contain control information. It may be noted that control information may be so large that parts of the control information may be stored in multiple locations, that the control information may be stored in multiple locations for purposes of redundancy, for example, or that the control information may otherwise be distributed across multiple memory blocks in the storage drive 171A-F.

In implementations, storage array controllers 110A-D may offload device management responsibilities from storage drives 171A-F of storage array 102A-B by retrieving, from the storage drives 171A-F, control information describing the state of one or more memory blocks in the storage drives 171A-F. Retrieving the control information from the storage drives 171A-F may be carried out, for example, by the storage array controller 110A-D querying the storage drives 171A-F for the location of control information for a particular storage drive 171A-F. The storage drives 171A-F may be configured to execute instructions that enable the storage drive 171A-F to identify the location of the control information. The instructions may be executed by a controller (not shown) associated with or otherwise located on the storage drive 171A-F and may cause the storage drive 171A-F to scan a portion of each memory block to identify the memory blocks that store control information for the storage drives 171A-F. The storage drives 171A-F may respond by sending a response message to the storage array controller 110A-D that includes the location of control information for the storage drive 171A-F. Responsive to receiving the response message, storage array controllers 110A-D may issue a request to read data stored at the address associated with the location of control information for the storage drives 171A-F.

In other implementations, the storage array controllers 110A-D may further offload device management responsibilities from storage drives 171A-F by performing, in response to receiving the control information, a storage drive management operation. A storage drive management operation may include, for example, an operation that is typically performed by the storage drive 171A-F (e.g., the controller (not shown) associated with a particular storage drive 171A-F). A storage drive management operation may include, for example, ensuring that data is not written to failed memory blocks within the storage drive 171A-F, ensuring that data is written to memory blocks within the storage drive 171A-F in such a way that adequate wear leveling is achieved, and so forth.

In implementations, storage array 102A-B may implement two or more storage array controllers 110A-D. For example, storage array 102A may include storage array controllers 110A and storage array controllers 110B. At a given instance, a single storage array controller 110A-D (e.g., storage array controller 110A) of a storage system 100 may be designated with primary status (also referred to as "primary controller" herein), and other storage array controllers 110A-D (e.g., storage array controller 110A) may be designated with secondary status (also referred to as "secondary controller" herein). The primary controller may have particular rights, such as permission to alter data in persistent storage resource 170A-B (e.g., writing data to persistent storage resource 170A-B). At least some of the rights of the primary controller may supersede the rights of the secondary controller. For instance, the secondary controller may not have permission to alter data in persistent storage resource 170A-B when the primary controller has the right. The status of storage array controllers 110A-D may change. For example, storage array controller 110A may be designated with secondary status, and storage array controller 110B may be designated with primary status.

In some implementations, a primary controller, such as storage array controller 110A, may serve as the primary controller for one or more storage arrays 102A-B, and a second controller, such as storage array controller 110B, may serve as the secondary controller for the one or more storage arrays 102A-B. For example, storage array controller 110A may be the primary controller for storage array 102A and storage array 102B, and storage array controller 110B may be the secondary controller for storage array 102A and 102B. In some implementations, storage array controllers 110C and 110D (also referred to as "storage processing modules") may neither have primary or secondary status. Storage array controllers 110C and 110D, implemented as storage processing modules, may act as a communication interface between the primary and secondary controllers (e.g., storage array controllers 110A and 110B, respectively) and storage array 102B. For example, storage array controller 110A of storage array 102A may send a write request, via SAN 158, to storage array 102B. The write request may be received by both storage array controllers 110C and 110D of storage array 102B. Storage array controllers 110C and 110D facilitate the communication, e.g., send the write request to the appropriate storage drive 171A-F. It may be noted that in some implementations storage processing modules may be used to increase the number of storage drives controlled by the primary and secondary controllers.

In implementations, storage array controllers 110A-D are communicatively coupled, via a midplane (not shown), to one or more storage drives 171A-F and to one or more NVRAM devices (not shown) that are included as part of a storage array 102A-B. The storage array controllers 110A-D may be coupled to the midplane via one or more data communication links and the midplane may be coupled to the storage drives 171A-F and the NVRAM devices via one or more data communications links. The data communications links described herein are collectively illustrated by data communications links 108A-D and may include a Peripheral Component Interconnect Express ('PCIe') bus, for example.

Figure 1B:
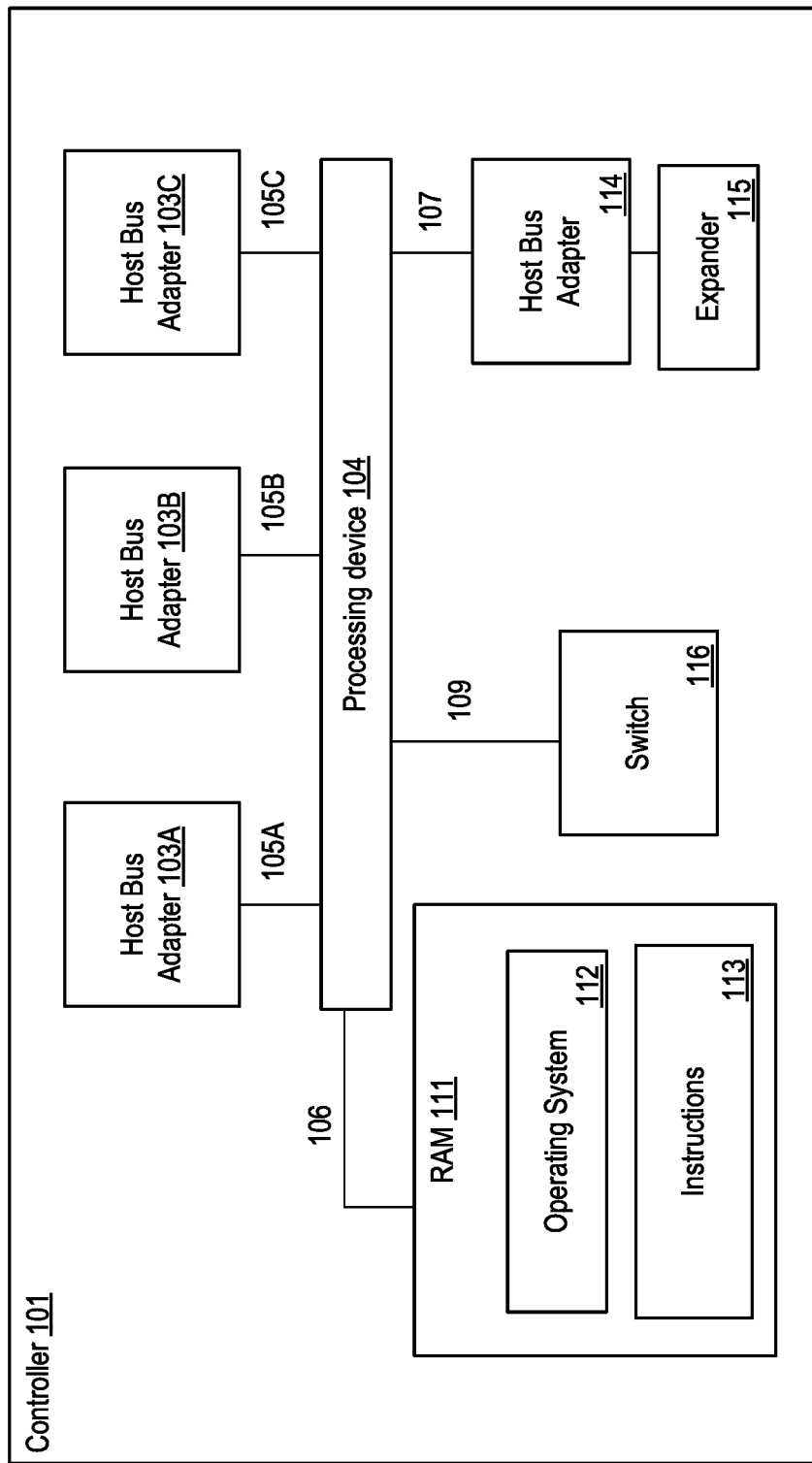
FIG. 1B illustrates a second example system for data storage in accordance with some implementations.

FIG. 1B illustrates an example system for data storage, in accordance with some implementations. Storage array controller 101 illustrated in FIG. 1B may similar to the storage array controllers 110A-D described with respect to FIG. 1A. In one example, storage array controller 101 may be similar to storage array controller 110A or storage array controller 110B. Storage array controller 101 includes numerous elements for purposes of illustration rather than limitation. It may be noted that storage array controller 101 may include the same, more, or fewer elements configured in the same or different manner in other implementations. It may be noted that elements of FIG. 1A may be included below to help illustrate features of storage array controller 101.

Storage array controller 101 may include one or more processing devices 104 and random access memory ('RAM') 111. Processing device 104 (or controller 101) represents one or more general-purpose processing devices such as a microprocessor, central processing unit, or the like. More particularly, the processing device 104 (or controller 101) may be a complex instruction set computing ('CISC') microprocessor, reduced instruction set computing ('RISC') microprocessor, very long instruction word ('VLIW') microprocessor, or a processor implementing other instruction sets or processors implementing a combination of instruction sets. The processing device 104 (or controller 101) may also be one or more special-purpose processing devices such as an application specific integrated circuit ('ASIC'), a field programmable gate array ('FPGA'), a digital signal processor ('DSP'), network processor, or the like.

The processing device 104 may be connected to the RAM 111 via a data communications link 106, which may be embodied as a high speed memory bus such as a Double-Data Rate 4 ('DDR4') bus. Stored in RAM 111 is an operating system 112. In some implementations, instructions 113 are stored in RAM 111. Instructions 113 may include computer program instructions for performing operations in in a direct-mapped flash storage system. In one embodiment, a direct-mapped flash storage system is one that that addresses data blocks within flash drives directly and without an address translation performed by the storage controllers of the flash drives.

In implementations, storage array controller 101 includes one or more host bus adapters 103A-C that are coupled to the processing device 104 via a data communications link 105A-C. In implementations, host bus adapters 103A-C may be computer hardware that connects a host system (e.g., the storage array controller) to other network and storage arrays. In some examples, host bus adapters 103A-C may be a Fibre Channel adapter that enables the storage array controller 101 to connect to a SAN, an Ethernet adapter that enables the storage array controller 101 to connect to a LAN, or the like. Host bus adapters 103A-C may be coupled to the processing device 104 via a data communications link 105A-C such as, for example, a PCIe bus.

In implementations, storage array controller 101 may include a host bus adapter 114 that is coupled to an expander 115. The expander 115 may be used to attach a host system to a larger number of storage drives. The expander 115 may, for example, be a SAS expander utilized to enable the host bus adapter 114 to attach to storage drives in an implementation where the host bus adapter 114 is embodied as a SAS controller.

In implementations, storage array controller 101 may include a switch 116 coupled to the processing device 104 via a data communications link 109. The switch 116 may be a computer hardware device that can create multiple endpoints out of a single endpoint, thereby enabling multiple devices to share a single endpoint. The switch 116 may, for example, be a PCIe switch that is coupled to a PCIe bus (e.g., data communications link 109) and presents multiple PCIe connection points to the midplane.

In implementations, storage array controller 101 includes a data communications link 107 for coupling the storage array controller 101 to other storage array controllers. In some examples, data communications link 107 may be a QuickPath Interconnect (QPI) interconnect.

A traditional storage system that uses traditional flash drives may implement a process across the flash drives that are part of the traditional storage system. For example, a higher level process of the storage system may initiate and control a process across the flash drives. However, a flash drive of the traditional storage system may include its own storage controller that also performs the process. Thus, for the traditional storage system, a higher level process (e.g., initiated by the storage system) and a lower level process (e.g., initiated by a storage controller of the storage system) may both be performed.

To resolve various deficiencies of a traditional storage system, operations may be performed by higher level processes and not by the lower level processes. For example, the flash storage system may include flash drives that do not include storage controllers that provide the process. Thus, the operating system of the flash storage system itself may initiate and control the process. This may be accomplished by a direct-mapped flash storage system that addresses data blocks within the flash drives directly and without an address translation performed by the storage controllers of the flash drives.

The operating system of the flash storage system may identify and maintain a list of allocation units across multiple flash drives of the flash storage system. The allocation units may be entire erase blocks or multiple erase blocks. The operating system may maintain a map or address range that directly maps addresses to erase blocks of the flash drives of the flash storage system.

Direct mapping to the erase blocks of the flash drives may be used to rewrite data and erase data. For example, the operations may be performed on one or more allocation units that include a first data and a second data where the first data is to be retained and the second data is no longer being used by the flash storage system. The operating system may initiate the process to write the first data to new locations within other allocation units and erasing the second data and marking the allocation units as being available for use for subsequent data. Thus, the process may only be performed by the higher level operating system of the flash storage system without an additional lower level process being performed by controllers of the flash drives.

Advantages of the process being performed only by the operating system of the flash storage system include increased reliability of the flash drives of the flash storage system as unnecessary or redundant write operations are not being performed during the process. One possible point of novelty here is the concept of initiating and controlling the process at the operating system of the flash storage system. In addition, the process can be controlled by the operating system across multiple flash drives. This is contrast to the process being performed by a storage controller of a flash drive.

A storage system can consist of two storage array controllers that share a set of drives for failover purposes, or it could consist of a single storage array controller that provides a storage service that utilizes multiple drives, or it could consist of a distributed network of storage array controllers each with some number of drives or some amount of Flash storage where the storage array controllers in the network collaborate to provide a complete storage service and collaborate on various aspects of a storage service including storage allocation and garbage collection.

Figure 1C:
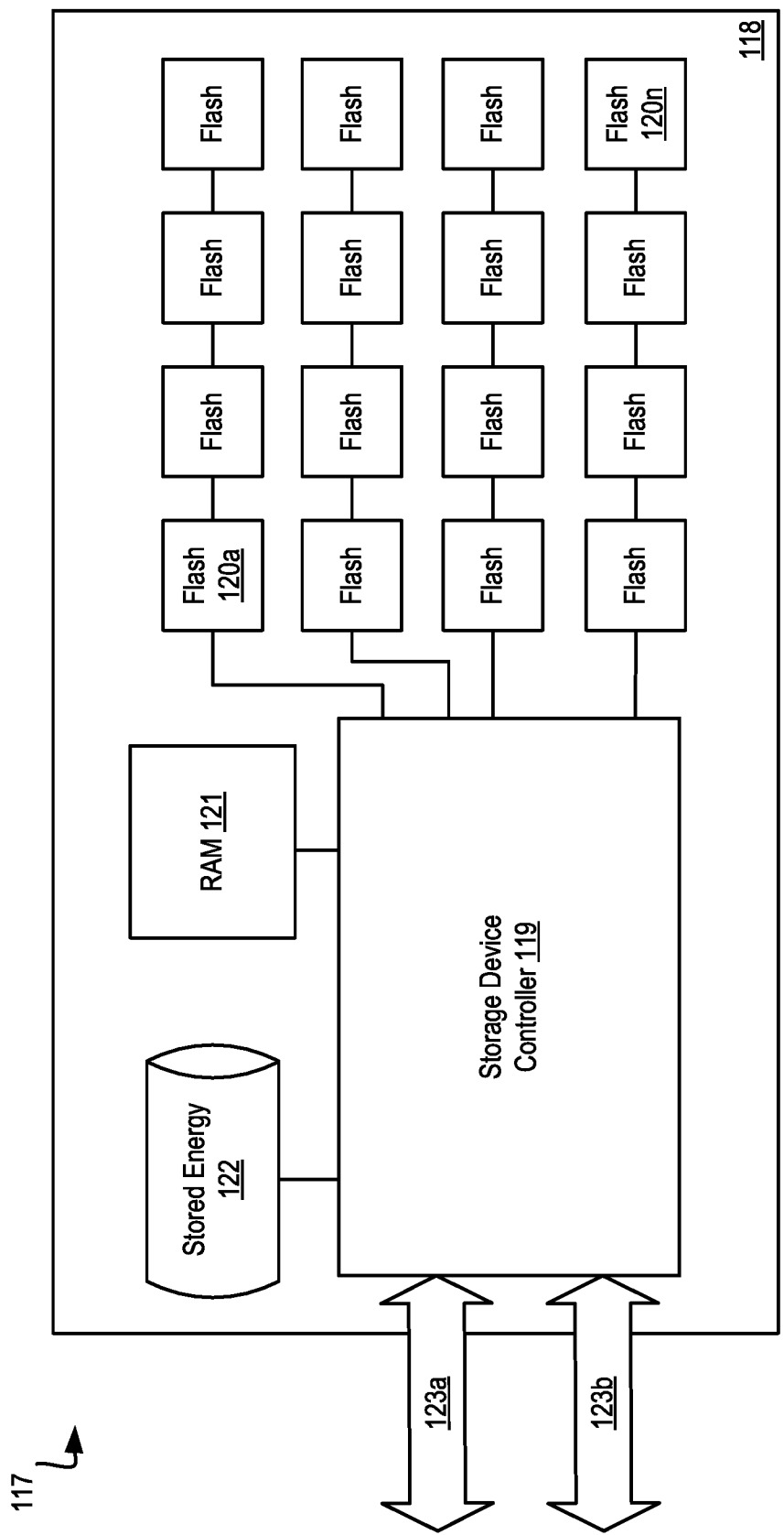
FIG. 1C illustrates a third example system for data storage in accordance with some implementations.

FIG. 1C illustrates a third example system 117 for data storage in accordance with some implementations. System 117 (also referred to as "storage system" herein) includes numerous elements for purposes of illustration rather than limitation. It may be noted that system 117 may include the same, more, or fewer elements configured in the same or different manner in other implementations.

In one embodiment, system 117 includes a dual Peripheral Component Interconnect ('PCI') flash storage device 118 with separately addressable fast write storage. System 117 may include a storage controller 119. In one embodiment, storage controller 119A-D may be a CPU, ASIC, FPGA, or any other circuitry that may implement control structures necessary according to the present disclosure. In one embodiment, system 117 includes flash memory devices (e.g., including flash memory devices 120a-n), operatively coupled to various channels of the storage device controller 119. Flash memory devices 120a-n, may be presented to the controller 119A-D as an addressable collection of Flash pages, erase blocks, and/or control elements sufficient to allow the storage device controller 119A-D to program and retrieve various aspects of the Flash. In one embodiment, storage device controller 119A-D may perform operations on flash memory devices 120a-n including storing and retrieving data content of pages, arranging and erasing any blocks, tracking statistics related to the use and reuse of Flash memory pages, erase blocks, and cells, tracking and predicting error codes and faults within the Flash memory, controlling voltage levels associated with programming and retrieving contents of Flash cells, etc.

In one embodiment, system 117 may include RAM 121 to store separately addressable fast-write data. In one embodiment, RAM 121 may be one or more separate discrete devices. In another embodiment, RAM 121 may be integrated into storage device controller 119A-D or multiple storage device controllers. The RAM 121 may be utilized for other purposes as well, such as temporary program memory for a processing device (e.g., a CPU) in the storage device controller 119.

In one embodiment, system 117 may include a stored energy device 122, such as a rechargeable battery or a capacitor. Stored energy device 122 may store energy sufficient to power the storage device controller 119, some amount of the RAM (e.g., RAM 121), and some amount of Flash memory (e.g., Flash memory 120a-120n) for sufficient time to write the contents of RAM to Flash memory. In one embodiment, storage device controller 119A-D may write the contents of RAM to Flash Memory if the storage device controller detects loss of external power.

In one embodiment, system 117 includes two data communications links 123a, 123b. In one embodiment, data communications links 123a, 123b may be PCI interfaces. In another embodiment, data communications links 123a, 123b may be based on other communications standards (e.g., HyperTransport, InfiniBand, etc.). Data communications links 123a, 123b may be based on non-volatile memory express ('NVMe') or NVMe over fabrics ('NVMf') specifications that allow external connection to the storage device controller 119A-D from other components in the storage system 117. It should be noted that data communications links may be interchangeably referred to herein as PCI buses for convenience.

System 117 may also include an external power source (not shown), which may be provided over one or both data communications links 123a, 123b, or which may be provided separately. An alternative embodiment includes a separate Flash memory (not shown) dedicated for use in storing the content of RAM 121. The storage device controller 119A-D may present a logical device over a PCI bus which may include an addressable fast-write logical device, or a distinct part of the logical address space of the storage device 118, which may be presented as PCI memory or as persistent storage. In one embodiment, operations to store into the device are directed into the RAM 121. On power failure, the storage device controller 119A-D may write stored content associated with the addressable fast-write logical storage to Flash memory (e.g., Flash memory 120a-n) for long-term persistent storage.

In one embodiment, the logical device may include some presentation of some or all of the content of the Flash memory devices 120a-n, where that presentation allows a storage system including a storage device 118 (e.g., storage system 117) to directly address Flash memory pages and directly reprogram erase blocks from storage system components that are external to the storage device through the PCI bus. The presentation may also allow one or more of the external components to control and retrieve other aspects of the Flash memory including some or all of: tracking statistics related to use and reuse of Flash memory pages, erase blocks, and cells across all the Flash memory devices; tracking and predicting error codes and faults within and across the Flash memory devices; controlling voltage levels associated with programming and retrieving contents of Flash cells; etc.

In one embodiment, the stored energy device 122 may be sufficient to ensure completion of in-progress operations to the Flash memory devices 120a-120n stored energy device 122 may power storage device controller 119A-D and associated Flash memory devices (e.g., 120a-n) for those operations, as well as for the storing of fast-write RAM to Flash memory. Stored energy device 122 may be used to store accumulated statistics and other parameters kept and tracked by the Flash memory devices 120a-n and/or the storage device controller 119. Separate capacitors or stored energy devices (such as smaller capacitors near or embedded within the Flash memory devices themselves) may be used for some or all of the operations described herein.

Various schemes may be used to track and optimize the life span of the stored energy component, such as adjusting voltage levels over time, partially discharging the storage energy device 122 to measure corresponding discharge characteristics, etc. If the available energy decreases over time, the effective available capacity of the addressable fast-write storage may be decreased to ensure that it can be written safely based on the currently available stored energy.

FIG. 1D illustrates a third example system 124 for data storage in accordance with some implementations. In one embodiment, system 124 includes storage controllers 125a, 125b. In one embodiment, storage controllers 125a, 125b are operatively coupled to Dual PCI storage devices 119a, 119b and 119c, 119d, respectively. Storage controllers 125a, 125b may be operatively coupled (e.g., via a storage network 130) to some number of host computers 127a-n.

In one embodiment, two storage controllers (e.g., 125a and 125b) provide storage services, such as a SCS) block storage array, a file server, an object server, a database or data analytics service, etc. The storage controllers 125a, 125b may provide services through some number of network interfaces (e.g., 126a-d) to host computers 127a-n outside of the storage system 124. Storage controllers 125a, 125b may provide integrated services or an application entirely within the storage system 124, forming a converged storage and compute system. The storage controllers 125a, 125b may utilize the fast write memory within or across storage devices 119a-d to journal in progress operations to ensure the operations are not lost on a power failure, storage controller removal, storage controller or storage system shutdown, or some fault of one or more software or hardware components within the storage system 124.

In one embodiment, controllers 125a, 125b operate as PCI masters to one or the other PCI buses 128a, 128b. In another embodiment, 128a and 128b may be based on other communications standards (e.g., HyperTransport, InfiniBand, etc.). Other storage system embodiments may operate storage controllers 125a, 125b as multi-masters for both PCI buses 128a, 128b. Alternately, a PCI/NVMe/NVMf switching infrastructure or fabric may connect multiple storage controllers. Some storage system embodiments may allow storage devices to communicate with each other directly rather than communicating only with storage controllers. In one embodiment, a storage device controller 119a may be operable under direction from a storage controller 125a to synthesize and transfer data to be stored into Flash memory devices from data that has been stored in RAM (e.g., RAM 121 of FIG. 1C). For example, a recalculated version of RAM content may be transferred after a storage controller has determined that an operation has fully committed across the storage system, or when fast-write memory on the device has reached a certain used capacity, or after a certain amount of time, to ensure improve safety of the data or to release addressable fast-write capacity for reuse. This mechanism may be used, for example, to avoid a second transfer over a bus (e.g., 128a, 128b) from the storage controllers 125a, 125b. In one embodiment, a recalculation may include compressing data, attaching indexing or other metadata, combining multiple data segments together, performing erasure code calculations, etc.

In one embodiment, under direction from a storage controller 125a, 125b, a storage device controller 119a, 119b may be operable to calculate and transfer data to other storage devices from data stored in RAM (e.g., RAM 121 of FIG. 1C) without involvement of the storage controllers 125a, 125b. This operation may be used to mirror data stored in one controller 125a to another controller 125b, or it could be used to offload compression, data aggregation, and/or erasure coding calculations and transfers to storage devices to reduce load on storage controllers or the storage controller interface 129a, 129b to the PCI bus 128a, 128b.

A storage device controller 119A-D may include mechanisms for implementing high availability primitives for use by other parts of a storage system external to the Dual PCI storage device 118. For example, reservation or exclusion primitives may be provided so that, in a storage system with two storage controllers providing a highly available storage service, one storage controller may prevent the other storage controller from accessing or continuing to access the storage device. This could be used, for example, in cases where one controller detects that the other controller is not functioning properly or where the interconnect between the two storage controllers may itself not be functioning properly.

In one embodiment, a storage system for use with Dual PCI direct mapped storage devices with separately addressable fast write storage includes systems that manage erase blocks or groups of erase blocks as allocation units for storing data on behalf of the storage service, or for storing metadata (e.g., indexes, logs, etc.) associated with the storage service, or for proper management of the storage system itself. Flash pages, which may be a few kilobytes in size, may be written as data arrives or as the storage system is to persist data for long intervals of time (e.g., above a defined threshold of time). To commit data more quickly, or to reduce the number of writes to the Flash memory devices, the storage controllers may first write data into the separately addressable fast write storage on one more storage devices.

In one embodiment, the storage controllers 125a, 125b may initiate the use of erase blocks within and across storage devices (e.g., 118) in accordance with an age and expected remaining lifespan of the storage devices, or based on other statistics. The storage controllers 125a, 125b may initiate garbage collection and data migration data between storage devices in accordance with pages that are no longer needed as well as to manage Flash page and erase block lifespans and to manage overall system performance.

In one embodiment, the storage system 124 may utilize mirroring and/or erasure coding schemes as part of storing data into addressable fast write storage and/or as part of writing data into allocation units associated with erase blocks. Erasure codes may be used across storage devices, as well as within erase blocks or allocation units, or within and across Flash memory devices on a single storage device, to provide redundancy against single or multiple storage device failures or to protect against internal corruptions of Flash memory pages resulting from Flash memory operations or from degradation of Flash memory cells. Mirroring and erasure coding at various levels may be used to recover from multiple types of failures that occur separately or in combination.

The embodiments depicted with reference to FIGS. 2A-G illustrate a storage cluster that stores user data, such as user data originating from one or more user or client systems or other sources external to the storage cluster. The storage cluster distributes user data across storage nodes housed within a chassis, or across multiple chassis, using erasure coding and redundant copies of metadata. Erasure coding refers to a method of data protection or reconstruction in which data is stored across a set of different locations, such as disks, storage nodes or geographic locations. Flash memory is one type of solid-state memory that may be integrated with the embodiments, although the embodiments may be extended to other types of solid-state memory or other storage medium, including non-solid state memory. Control of storage locations and workloads are distributed across the storage locations in a clustered peer-to-peer system. Tasks such as mediating communications between the various storage nodes, detecting when a storage node has become unavailable, and balancing I/Os (inputs and outputs) across the various storage nodes, are all handled on a distributed basis. Data is laid out or distributed across multiple storage nodes in data fragments or stripes that support data recovery in some embodiments. Ownership of data can be reassigned within a cluster, independent of input and output patterns. This architecture described in more detail below allows a storage node in the cluster to fail, with the system remaining operational, since the data can be reconstructed from other storage nodes and thus remain available for input and output operations. In various embodiments, a storage node may be referred to as a cluster node, a blade, or a server.

The storage cluster may be contained within a chassis, i.e., an enclosure housing one or more storage nodes. A mechanism to provide power to each storage node, such as a power distribution bus, and a communication mechanism, such as a communication bus that enables communication between the storage nodes are included within the chassis. The storage cluster can run as an independent system in one location according to some embodiments. In one embodiment, a chassis contains at least two instances of both the power distribution and the communication bus which may be enabled or disabled independently. The internal communication bus may be an Ethernet bus, however, other technologies such as PCIe, InfiniBand, and others, are equally suitable. The chassis provides a port for an external communication bus for enabling communication between multiple chassis, directly or through a switch, and with client systems. The external communication may use a technology such as Ethernet, InfiniBand, Fibre Channel, etc. In some embodiments, the external communication bus uses different communication bus technologies for inter-chassis and client communication. If a switch is deployed within or between chassis, the switch may act as a translation between multiple protocols or technologies. When multiple chassis are connected to define a storage cluster, the storage cluster may be accessed by a client using either proprietary interfaces or standard interfaces such as network file system ('NFS'), common internet file system ('CIFS'), small computer system interface ('SCSI') or hypertext transfer protocol ('HTTP'). Translation from the client protocol may occur at the switch, chassis external communication bus or within each storage node. In some embodiments, multiple chassis may be coupled or connected to each other through an aggregator switch. A portion and/or all of the coupled or connected chassis may be designated as a storage cluster. As discussed above, each chassis can have multiple blades, each blade has a media access control ('MAC') address, but the storage cluster is presented to an external network as having a single cluster IP address and a single MAC address in some embodiments.

Each storage node may be one or more storage servers and each storage server is connected to one or more non-volatile solid state memory units, which may be referred to as storage units or storage devices. One embodiment includes a single storage server in each storage node and between one to eight non-volatile solid state memory units, however this one example is not meant to be limiting. The storage server may include a processor, DRAM and interfaces for the internal communication bus and power distribution for each of the power buses. Inside the storage node, the interfaces and storage unit share a communication bus, e.g., PCI Express, in some embodiments. The non-volatile solid state memory units may directly access the internal communication bus interface through a storage node communication bus, or request the storage node to access the bus interface. The non-volatile solid state memory unit contains an embedded CPU, solid state storage controller, and a quantity of solid state mass storage, e.g., between 2-32 terabytes ('TB') in some embodiments. An embedded volatile storage medium, such as DRAM, and an energy reserve apparatus are included in the non-volatile solid state memory unit. In some embodiments, the energy reserve apparatus is a capacitor, super-capacitor, or battery that enables transferring a subset of DRAM contents to a stable storage medium in the case of power loss. In some embodiments, the non-volatile solid state memory unit is constructed with a storage class memory, such as phase change or magnetoresistive random access memory ('MRAM') that substitutes for DRAM and enables a reduced power hold-up apparatus.

One of many features of the storage nodes and non-volatile solid state storage is the ability to proactively rebuild data in a storage cluster. The storage nodes and non-volatile solid state storage can determine when a storage node or non-volatile solid state storage in the storage cluster is unreachable, independent of whether there is an attempt to read data involving that storage node or non-volatile solid state storage. The storage nodes and non-volatile solid state storage then cooperate to recover and rebuild the data in at least partially new locations. This constitutes a proactive rebuild, in that the system rebuilds data without waiting until the data is needed for a read access initiated from a client system employing the storage cluster. These and further details of the storage memory and operation thereof are discussed below.

Figure 2A:
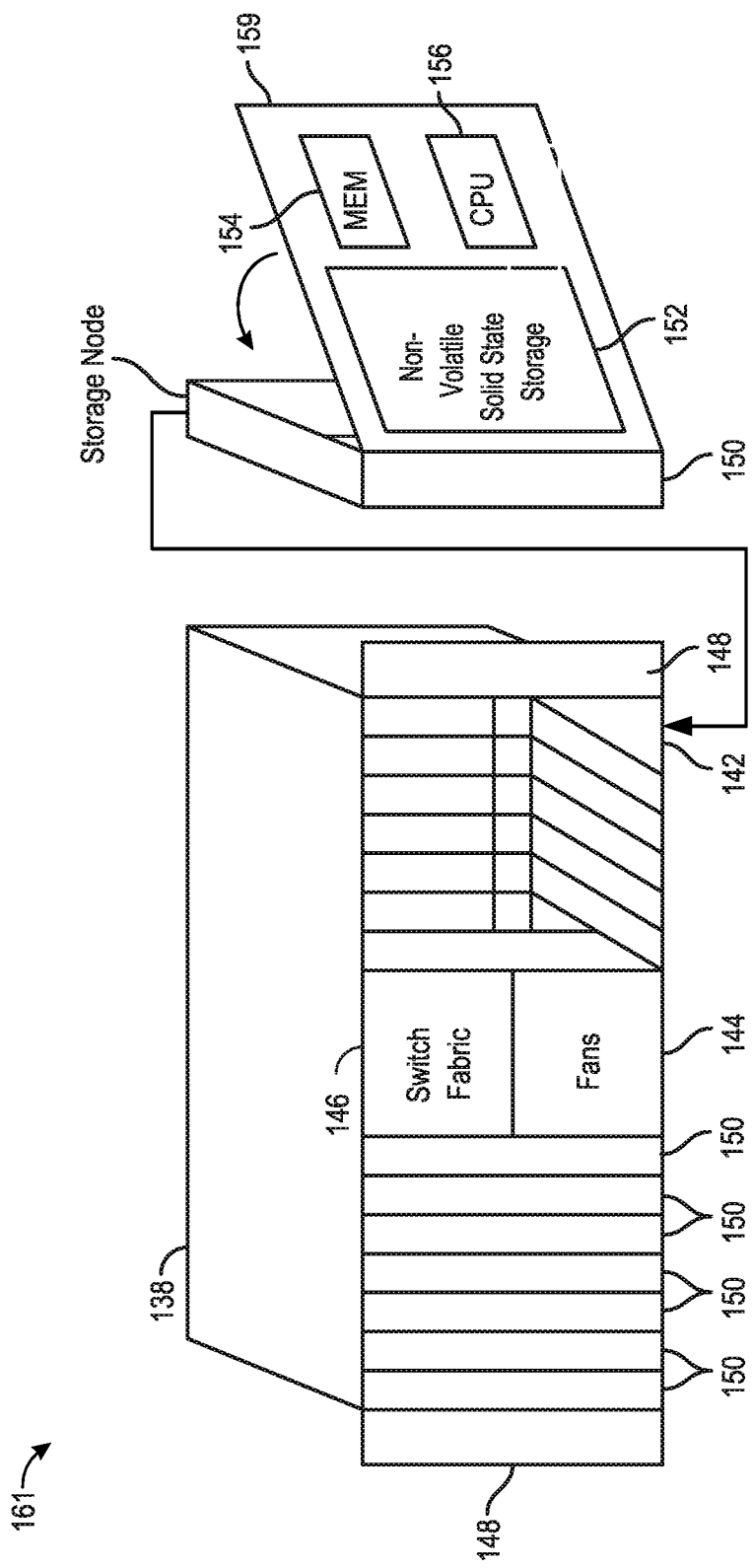
FIG. 2A is a perspective view of a storage cluster with multiple storage nodes and internal storage coupled to each storage node to provide network attached storage, in accordance with some embodiments.

FIG. 2A is a perspective view of a storage cluster 161, with multiple storage nodes 150 and internal solid-state memory coupled to each storage node to provide network attached storage or storage area network, in accordance with some embodiments. A network attached storage, storage area network, or a storage cluster, or other storage memory, could include one or more storage clusters 161, each having one or more storage nodes 150, in a flexible and reconfigurable arrangement of both the physical components and the amount of storage memory provided thereby. The storage cluster 161 is designed to fit in a rack, and one or more racks can be set up and populated as desired for the storage memory. The storage cluster 161 has a chassis 138 having multiple slots 142. It should be appreciated that chassis 138 may be referred to as a housing, enclosure, or rack unit. In one embodiment, the chassis 138 has fourteen slots 142, although other numbers of slots are readily devised. For example, some embodiments have four slots, eight slots, sixteen slots, thirty-two slots, or other suitable number of slots. Each slot 142 can accommodate one storage node 150 in some embodiments. Chassis 138 includes flaps 148 that can be utilized to mount the chassis 138 on a rack. Fans 144 provide air circulation for cooling of the storage nodes 150 and components thereof, although other cooling components could be used, or an embodiment could be devised without cooling components. A switch fabric 146 couples storage nodes 150 within chassis 138 together and to a network for communication to the memory. In an embodiment depicted in herein, the slots 142 to the left of the switch fabric 146 and fans 144 are shown occupied by storage nodes 150, while the slots 142 to the right of the switch fabric 146 and fans 144 are empty and available for insertion of storage node 150 for illustrative purposes. This configuration is one example, and one or more storage nodes 150 could occupy the slots 142 in various further arrangements. The storage node arrangements need not be sequential or adjacent in some embodiments. Storage nodes 150 are hot pluggable, meaning that a storage node 150 can be inserted into a slot 142 in the chassis 138, or removed from a slot 142, without stopping or powering down the system. Upon insertion or removal of storage node 150 from slot 142, the system automatically reconfigures in order to recognize and adapt to the change. Reconfiguration, in some embodiments, includes restoring redundancy and/or rebalancing data or load.

Each storage node 150 can have multiple components. In the embodiment shown here, the storage node 150 includes a printed circuit board 159 populated by a CPU 156, i.e., processor, a memory 154 coupled to the CPU 156, and a non-volatile solid state storage 152 coupled to the CPU 156, although other mountings and/or components could be used in further embodiments. The memory 154 has instructions which are executed by the CPU 156 and/or data operated on by the CPU 156. As further explained below, the non-volatile solid state storage 152 includes flash or, in further embodiments, other types of solid-state memory.

Referring to FIG. 2A, storage cluster 161 is scalable, meaning that storage capacity with non-uniform storage sizes is readily added, as described above. One or more storage nodes 150 can be plugged into or removed from each chassis and the storage cluster self-configures in some embodiments. Plug-in storage nodes 150, whether installed in a chassis as delivered or later added, can have different sizes. For example, in one embodiment a storage node 150 can have any multiple of 4 TB, e.g., 8 TB, 12 TB, 16 TB, 32 TB, etc. In further embodiments, a storage node 150 could have any multiple of other storage amounts or capacities. Storage capacity of each storage node 150 is broadcast, and influences decisions of how to stripe the data. For maximum storage efficiency, an embodiment can self-configure as wide as possible in the stripe, subject to a predetermined requirement of continued operation with loss of up to one, or up to two, non-volatile solid state storage units 152 or storage nodes 150 within the chassis.

Figure 2B:
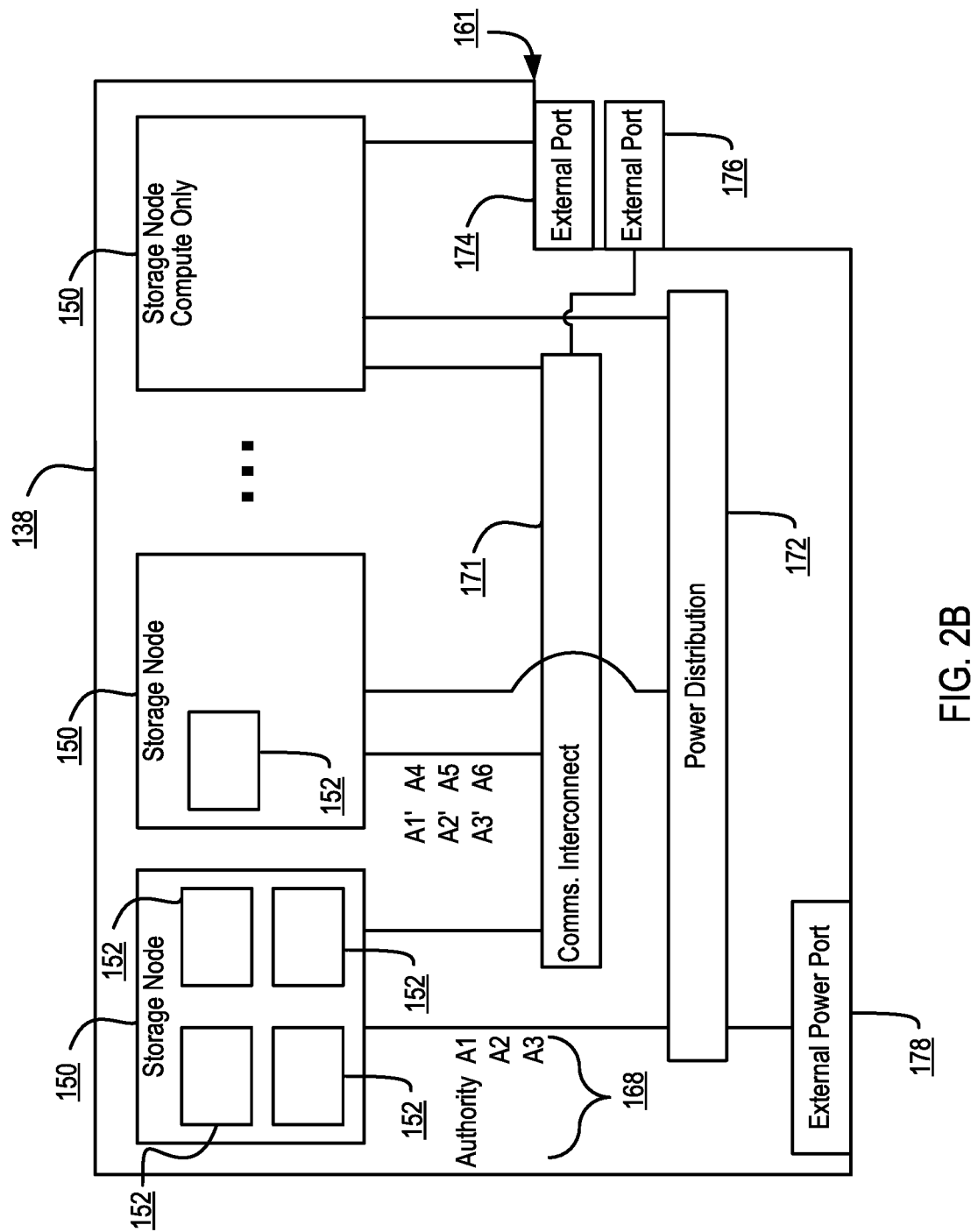
FIG. 2B is a block diagram showing an interconnect switch coupling multiple storage nodes in accordance with some embodiments.

FIG. 2B is a block diagram showing a communications interconnect 173 and power distribution bus 172 coupling multiple storage nodes 150. Referring back to FIG. 2A, the communications interconnect 173 can be included in or implemented with the switch fabric 146 in some embodiments. Where multiple storage clusters 161 occupy a rack, the communications interconnect 173 can be included in or implemented with a top of rack switch, in some embodiments. As illustrated in FIG. 2B, storage cluster 161 is enclosed within a single chassis 138. External port 176 is coupled to storage nodes 150 through communications interconnect 173, while external port 174 is coupled directly to a storage node. External power port 178 is coupled to power distribution bus 172. Storage nodes 150 may include varying amounts and differing capacities of non-volatile solid state storage 152 as described with reference to FIG. 2A. In addition, one or more storage nodes 150 may be a compute only storage node as illustrated in FIG. 2B. Authorities 168 are implemented on the non-volatile solid state storages 152, for example as lists or other data structures stored in memory. In some embodiments the authorities are stored within the non-volatile solid state storage 152 and supported by software executing on a controller or other processor of the non-volatile solid state storage 152. In a further embodiment, authorities 168 are implemented on the storage nodes 150, for example as lists or other data structures stored in the memory 154 and supported by software executing on the CPU 156 of the storage node 150. Authorities 168 control how and where data is stored in the non-volatile solid state storages 152 in some embodiments. This control assists in determining which type of erasure coding scheme is applied to the data, and which storage nodes 150 have which portions of the data. Each authority 168 may be assigned to a non-volatile solid state storage 152. Each authority may control a range of inode numbers, segment numbers, or other data identifiers which are assigned to data by a file system, by the storage nodes 150, or by the non-volatile solid state storage 152, in various embodiments.

Every piece of data, and every piece of metadata, has redundancy in the system in some embodiments. In addition, every piece of data and every piece of metadata has an owner, which may be referred to as an authority. If that authority is unreachable, for example through failure of a storage node, there is a plan of succession for how to find that data or that metadata. In various embodiments, there are redundant copies of authorities 168. Authorities 168 have a relationship to storage nodes 150 and non-volatile solid state storage 152 in some embodiments. Each authority 168, covering a range of data segment numbers or other identifiers of the data, may be assigned to a specific non-volatile solid state storage 152. In some embodiments the authorities 168 for all of such ranges are distributed over the non-volatile solid state storages 152 of a storage cluster. Each storage node 150 has a network port that provides access to the non-volatile solid state storage(s) 152 of that storage node 150. Data can be stored in a segment, which is associated with a segment number and that segment number is an indirection for a configuration of a RAID (redundant array of independent disks) stripe in some embodiments. The assignment and use of the authorities 168 thus establishes an indirection to data. Indirection may be referred to as the ability to reference data indirectly, in this case via an authority 168, in accordance with some embodiments. A segment identifies a set of non-volatile solid state storage 152 and a local identifier into the set of non-volatile solid state storage 152 that may contain data. In some embodiments, the local identifier is an offset into the device and may be reused sequentially by multiple segments. In other embodiments the local identifier is unique for a specific segment and never reused. The offsets in the non-volatile solid state storage 152 are applied to locating data for writing to or reading from the non-volatile solid state storage 152 (in the form of a RAID stripe). Data is striped across multiple units of non-volatile solid state storage 152, which may include or be different from the non-volatile solid state storage 152 having the authority 168 for a particular data segment.

If there is a change in where a particular segment of data is located, e.g., during a data move or a data reconstruction, the authority 168 for that data segment should be consulted, at that non-volatile solid state storage 152 or storage node 150 having that authority 168. In order to locate a particular piece of data, embodiments calculate a hash value for a data segment or apply an inode number or a data segment number. The output of this operation points to a non-volatile solid state storage 152 having the authority 168 for that particular piece of data. In some embodiments there are two stages to this operation. The first stage maps an entity identifier (ID), e.g., a segment number, inode number, or directory number to an authority identifier. This mapping may include a calculation such as a hash or a bit mask. The second stage is mapping the authority identifier to a particular non-volatile solid state storage 152, which may be done through an explicit mapping. The operation is repeatable, so that when the calculation is performed, the result of the calculation repeatably and reliably points to a particular non-volatile solid state storage 152 having that authority 168. The operation may include the set of reachable storage nodes as input. If the set of reachable non-volatile solid state storage units changes the optimal set changes. In some embodiments, the persisted value is the current assignment (which is always true) and the calculated value is the target assignment the cluster will attempt to reconfigure towards. This calculation may be used to determine the optimal non-volatile solid state storage 152 for an authority in the presence of a set of non-volatile solid state storage 152 that are reachable and constitute the same cluster. The calculation also determines an ordered set of peer non-volatile solid state storage 152 that will also record the authority to non-volatile solid state storage mapping so that the authority may be determined even if the assigned non-volatile solid state storage is unreachable. A duplicate or substitute authority 168 may be consulted if a specific authority 168 is unavailable in some embodiments.

With reference to FIGS. 2A and 2B, two of the many tasks of the CPU 156 on a storage node 150 are to break up write data, and reassemble read data. When the system has determined that data is to be written, the authority 168 for that data is located as above. When the segment ID for data is already determined the request to write is forwarded to the non-volatile solid state storage 152 currently determined to be the host of the authority 168 determined from the segment. The host CPU 156 of the storage node 150, on which the non-volatile solid state storage 152 and corresponding authority 168 reside, then breaks up or shards the data and transmits the data out to various non-volatile solid state storage 152. The transmitted data is written as a data stripe in accordance with an erasure coding scheme. In some embodiments, data is requested to be pulled, and in other embodiments, data is pushed. In reverse, when data is read, the authority 168 for the segment ID containing the data is located as described above. The host CPU 156 of the storage node 150 on which the non-volatile solid state storage 152 and corresponding authority 168 reside requests the data from the non-volatile solid state storage and corresponding storage nodes pointed to by the authority. In some embodiments the data is read from flash storage as a data stripe. The host CPU 156 of storage node 150 then reassembles the read data, correcting any errors (if present) according to the appropriate erasure coding scheme, and forwards the reassembled data to the network. In further embodiments, some or all of these tasks can be handled in the non-volatile solid state storage 152. In some embodiments, the segment host requests the data be sent to storage node 150 by requesting pages from storage and then sending the data to the storage node making the original request.

In some systems, for example in UNIX-style file systems, data is handled with an index node or inode, which specifies a data structure that represents an object in a file system. The object could be a file or a directory, for example. Metadata may accompany the object, as attributes such as permission data and a creation timestamp, among other attributes. A segment number could be assigned to all or a portion of such an object in a file system. In other systems, data segments are handled with a segment number assigned elsewhere. For purposes of discussion, the unit of distribution is an entity, and an entity can be a file, a directory or a segment. That is, entities are units of data or metadata stored by a storage system. Entities are grouped into sets called authorities. Each authority has an authority owner, which is a storage node that has the exclusive right to update the entities in the authority. In other words, a storage node contains the authority, and that the authority, in turn, contains entities.

A segment is a logical container of data in accordance with some embodiments. A segment is an address space between medium address space and physical flash locations, i.e., the data segment number, are in this address space. Segments may also contain meta-data, which enable data redundancy to be restored (rewritten to different flash locations or devices) without the involvement of higher level software. In one embodiment, an internal format of a segment contains client data and medium mappings to determine the position of that data. Each data segment is protected, e.g., from memory and other failures, by breaking the segment into a number of data and parity shards, where applicable. The data and parity shards are distributed, i.e., striped, across non-volatile solid state storage 152 coupled to the host CPUs 156 (See FIGS. 2E and 2G) in accordance with an erasure coding scheme. Usage of the term segments refers to the container and its place in the address space of segments in some embodiments. Usage of the term stripe refers to the same set of shards as a segment and includes how the shards are distributed along with redundancy or parity information in accordance with some embodiments.

A series of address-space transformations takes place across an entire storage system. At the top are the directory entries (file names) which link to an inode. Inodes point into medium address space, where data is logically stored. Medium addresses may be mapped through a series of indirect mediums to spread the load of large files, or implement data services like deduplication or snapshots. Medium addresses may be mapped through a series of indirect mediums to spread the load of large files, or implement data services like deduplication or snapshots. Segment addresses are then translated into physical flash locations. Physical flash locations have an address range bounded by the amount of flash in the system in accordance with some embodiments. Medium addresses and segment addresses are logical containers, and in some embodiments use a 128 bit or larger identifier so as to be practically infinite, with a likelihood of reuse calculated as longer than the expected life of the system. Addresses from logical containers are allocated in a hierarchical fashion in some embodiments. Initially, each non-volatile solid state storage unit 152 may be assigned a range of address space. Within this assigned range, the non-volatile solid state storage 152 is able to allocate addresses without synchronization with other non-volatile solid state storage 152.

Data and metadata is stored by a set of underlying storage layouts that are optimized for varying workload patterns and storage devices. These layouts incorporate multiple redundancy schemes, compression formats and index algorithms. Some of these layouts store information about authorities and authority masters, while others store file metadata and file data. The redundancy schemes include error correction codes that tolerate corrupted bits within a single storage device (such as a NAND flash chip), erasure codes that tolerate the failure of multiple storage nodes, and replication schemes that tolerate data center or regional failures. In some embodiments, low density parity check ('LDPC') code is used within a single storage unit. Reed-Solomon encoding is used within a storage cluster, and mirroring is used within a storage grid in some embodiments. Metadata may be stored using an ordered log structured index (such as a Log Structured Merge Tree), and large data may not be stored in a log structured layout.

In order to maintain consistency across multiple copies of an entity, the storage nodes agree implicitly on two things through calculations: (1) the authority that contains the entity, and (2) the storage node that contains the authority. The assignment of entities to authorities can be done by pseudo randomly assigning entities to authorities, by splitting entities into ranges based upon an externally produced key, or by placing a single entity into each authority. Examples of pseudorandom schemes are linear hashing and the Replication Under Scalable Hashing ('RUSH') family of hashes, including Controlled Replication Under Scalable Hashing ('CRUSH'). In some embodiments, pseudo-random assignment is utilized only for assigning authorities to nodes because the set of nodes can change. The set of authorities cannot change so any subjective function may be applied in these embodiments. Some placement schemes automatically place authorities on storage nodes, while other placement schemes rely on an explicit mapping of authorities to storage nodes. In some embodiments, a pseudorandom scheme is utilized to map from each authority to a set of candidate authority owners. A pseudorandom data distribution function related to CRUSH may assign authorities to storage nodes and create a list of where the authorities are assigned. Each storage node has a copy of the pseudorandom data distribution function, and can arrive at the same calculation for distributing, and later finding or locating an authority. Each of the pseudorandom schemes requires the reachable set of storage nodes as input in some embodiments in order to conclude the same target nodes. Once an entity has been placed in an authority, the entity may be stored on physical devices so that no expected failure will lead to unexpected data loss. In some embodiments, rebalancing algorithms attempt to store the copies of all entities within an authority in the same layout and on the same set of machines.

Examples of expected failures include device failures, stolen machines, datacenter fires, and regional disasters, such as nuclear or geological events. Different failures lead to different levels of acceptable data loss. In some embodiments, a stolen storage node impacts neither the security nor the reliability of the system, while depending on system configuration, a regional event could lead to no loss of data, a few seconds or minutes of lost updates, or even complete data loss.

In the embodiments, the placement of data for storage redundancy is independent of the placement of authorities for data consistency. In some embodiments, storage nodes that contain authorities do not contain any persistent storage. Instead, the storage nodes are connected to non-volatile solid state storage units that do not contain authorities. The communications interconnect between storage nodes and non-volatile solid state storage units consists of multiple communication technologies and has non-uniform performance and fault tolerance characteristics. In some embodiments, as mentioned above, non-volatile solid state storage units are connected to storage nodes via PCI express, storage nodes are connected together within a single chassis using Ethernet backplane, and chassis are connected together to form a storage cluster. Storage clusters are connected to clients using Ethernet or fiber channel in some embodiments. If multiple storage clusters are configured into a storage grid, the multiple storage clusters are connected using the Internet or other long-distance networking links, such as a "metro scale" link or private link that does not traverse the internet.

Authority owners have the exclusive right to modify entities, to migrate entities from one non-volatile solid state storage unit to another non-volatile solid state storage unit, and to add and remove copies of entities. This allows for maintaining the redundancy of the underlying data. When an authority owner fails, is going to be decommissioned, or is overloaded, the authority is transferred to a new storage node. Transient failures make it non-trivial to ensure that all non-faulty machines agree upon the new authority location. The ambiguity that arises due to transient failures can be achieved automatically by a consensus protocol such as Paxos, hot-warm failover schemes, via manual intervention by a remote system administrator, or by a local hardware administrator (such as by physically removing the failed machine from the cluster, or pressing a button on the failed machine). In some embodiments, a consensus protocol is used, and failover is automatic. If too many failures or replication events occur in too short a time period, the system goes into a self-preservation mode and halts replication and data movement activities until an administrator intervenes in accordance with some embodiments.

As authorities are transferred between storage nodes and authority owners update entities in their authorities, the system transfers messages between the storage nodes and non-volatile solid state storage units. With regard to persistent messages, messages that have different purposes are of different types. Depending on the type of the message, the system maintains different ordering and durability guarantees. As the persistent messages are being processed, the messages are temporarily stored in multiple durable and non-durable storage hardware technologies. In some embodiments, messages are stored in RAM, NVRAM and on NAND flash devices, and a variety of protocols are used in order to make efficient use of each storage medium. Latency-sensitive client requests may be persisted in replicated NVRAM, and then later NAND, while background rebalancing operations are persisted directly to NAND.

Persistent messages are persistently stored prior to being transmitted. This allows the system to continue to serve client requests despite failures and component replacement. Although many hardware components contain unique identifiers that are visible to system administrators, manufacturer, hardware supply chain and ongoing monitoring quality control infrastructure, applications running on top of the infrastructure address virtualize addresses. These virtualized addresses do not change over the lifetime of the storage system, regardless of component failures and replacements. This allows each component of the storage system to be replaced over time without reconfiguration or disruptions of client request processing, i.e., the system supports non-disruptive upgrades.

In some embodiments, the virtualized addresses are stored with sufficient redundancy. A continuous monitoring system correlates hardware and software status and the hardware identifiers. This allows detection and prediction of failures due to faulty components and manufacturing details. The monitoring system also enables the proactive transfer of authorities and entities away from impacted devices before failure occurs by removing the component from the critical path in some embodiments.

Figure 2C:
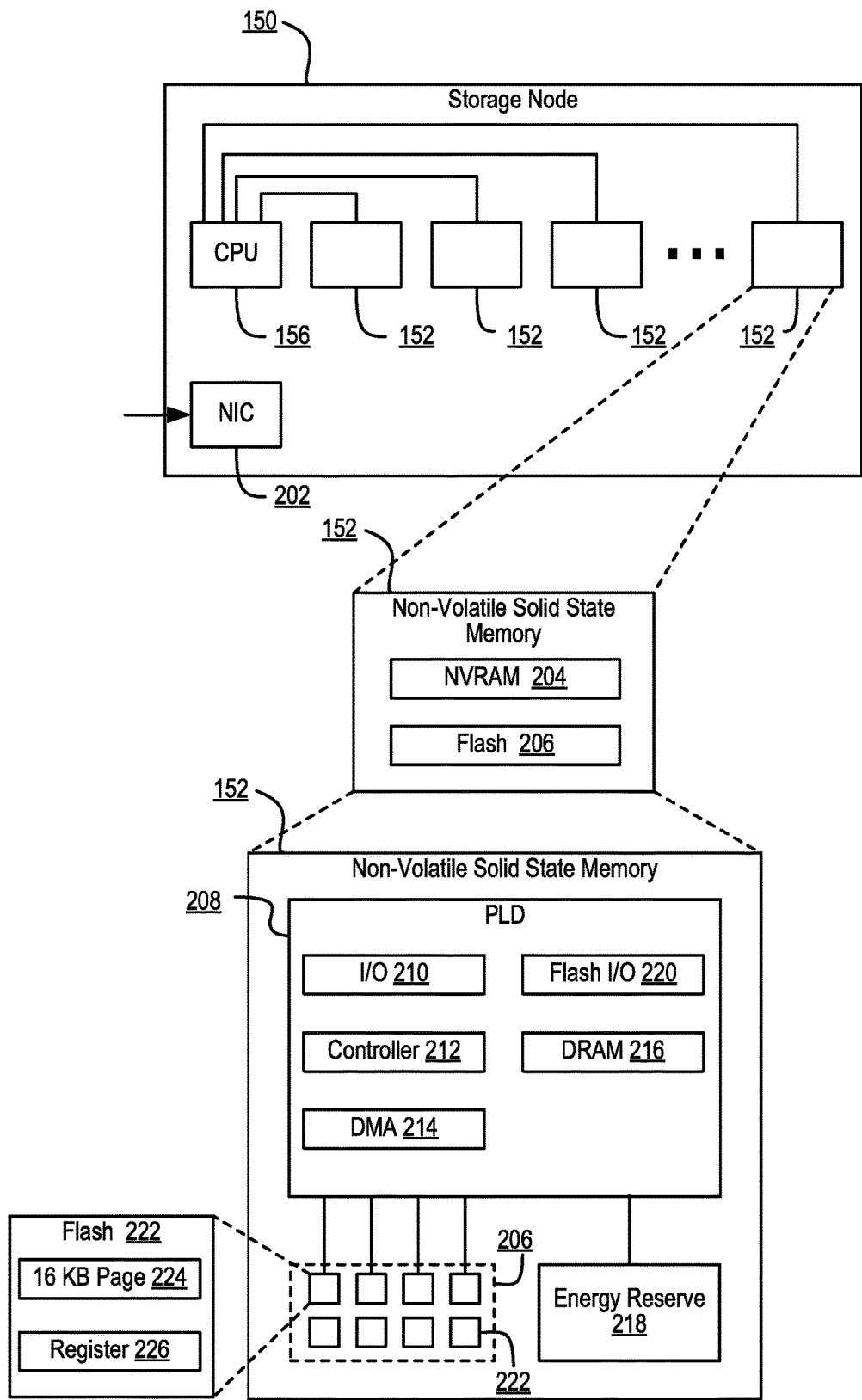
FIG. 2C is a multiple level block diagram, showing contents of a storage node and contents of one of the non-volatile solid state storage units in accordance with some embodiments.

FIG. 2C is a multiple level block diagram, showing contents of a storage node 150 and contents of a non-volatile solid state storage 152 of the storage node 150. Data is communicated to and from the storage node 150 by a network interface controller ('NIC') 202 in some embodiments. Each storage node 150 has a CPU 156, and one or more non-volatile solid state storage 152, as discussed above. Moving down one level in FIG. 2C, each non-volatile solid state storage 152 has a relatively fast non-volatile solid state memory, such as nonvolatile random access memory ('NVRAM') 204, and flash memory 206. In some embodiments, NVRAM 204 may be a component that does not require program/erase cycles (DRAM, MRAM, PCM), and can be a memory that can support being written vastly more often than the memory is read from. Moving down another level in FIG. 2C, the NVRAM 204 is implemented in one embodiment as high speed volatile memory, such as dynamic random access memory (DRAM) 216, backed up by energy reserve 218. Energy reserve 218 provides sufficient electrical power to keep the DRAM 216 powered long enough for contents to be transferred to the flash memory 206 in the event of power failure. In some embodiments, energy reserve 218 is a capacitor, super-capacitor, battery, or other device, that supplies a suitable supply of energy sufficient to enable the transfer of the contents of DRAM 216 to a stable storage medium in the case of power loss. The flash memory 206 is implemented as multiple flash dies 222, which may be referred to as packages of flash dies 222 or an array of flash dies 222. It should be appreciated that the flash dies 222 could be packaged in any number of ways, with a single die per package, multiple dies per package (i.e. multichip packages), in hybrid packages, as bare dies on a printed circuit board or other substrate, as encapsulated dies, etc. In the embodiment shown, the non-volatile solid state storage 152 has a controller 212 or other processor, and an input output (I/O) port 210 coupled to the controller 212. I/O port 210 is coupled to the CPU 156 and/or the network interface controller 202 of the flash storage node 150. Flash input output (I/O) port 220 is coupled to the flash dies 222, and a direct memory access unit (DMA) 214 is coupled to the controller 212, the DRAM 216 and the flash dies 222. In the embodiment shown, the I/O port 210, controller 212, DMA unit 214 and flash I/O port 220 are implemented on a programmable logic device ('PLD') 208, e.g., a field programmable gate array (FPGA). In this embodiment, each flash die 222 has pages, organized as sixteen kB (kilobyte) pages 224, and a register 226 through which data can be written to or read from the flash die 222. In further embodiments, other types of solid-state memory are used in place of, or in addition to flash memory illustrated within flash die 222.

Storage clusters 161, in various embodiments as disclosed herein, can be contrasted with storage arrays in general. The storage nodes 150 are part of a collection that creates the storage cluster 161. Each storage node 150 owns a slice of data and computing required to provide the data. Multiple storage nodes 150 cooperate to store and retrieve the data. Storage memory or storage devices, as used in storage arrays in general, are less involved with processing and manipulating the data. Storage memory or storage devices in a storage array receive commands to read, write, or erase data. The storage memory or storage devices in a storage array are not aware of a larger system in which they are embedded, or what the data means. Storage memory or storage devices in storage arrays can include various types of storage memory, such as RAM, solid state drives, hard disk drives, etc. The storage units 152 described herein have multiple interfaces active simultaneously and serving multiple purposes. In some embodiments, some of the functionality of a storage node 150 is shifted into a storage unit 152, transforming the storage unit 152 into a combination of storage unit 152 and storage node 150. Placing computing (relative to storage data) into the storage unit 152 places this computing closer to the data itself. The various system embodiments have a hierarchy of storage node layers with different capabilities. By contrast, in a storage array, a controller owns and knows everything about all of the data that the controller manages in a shelf or storage devices. In a storage cluster 161, as described herein, multiple controllers in multiple storage units 152 and/or storage nodes 150 cooperate in various ways (e.g., for erasure coding, data sharding, metadata communication and redundancy, storage capacity expansion or contraction, data recovery, and so on).

Figure 2D:
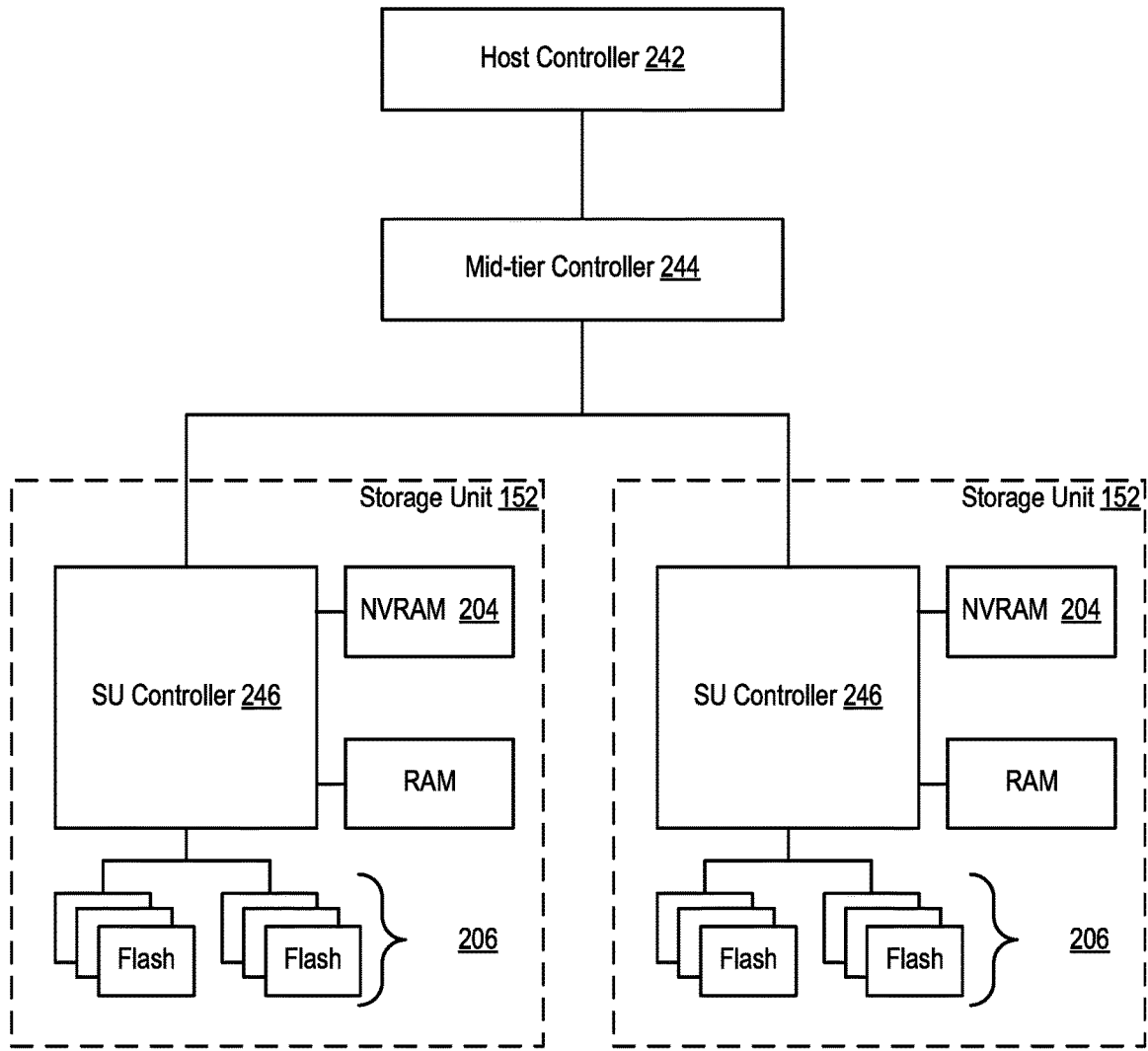
FIG. 2D shows a storage server environment, which uses embodiments of the storage nodes and storage units of some previous figures in accordance with some embodiments.

FIG. 2D shows a storage server environment, which uses embodiments of the storage nodes 150 and storage units 152 of FIGS. 2A-C. In this version, each storage unit 152 has a processor such as controller 212 (see FIG. 2C), an FPGA (field programmable gate array), flash memory 206, and NVRAM 204 (which is super-capacitor backed DRAM 216, see FIGS. 2B and 2C) on a PCIe (peripheral component interconnect express) board in a chassis 138 (see FIG. 2A). The storage unit 152 may be implemented as a single board containing storage, and may be the largest tolerable failure domain inside the chassis. In some embodiments, up to two storage units 152 may fail and the device will continue with no data loss.

The physical storage is divided into named regions based on application usage in some embodiments. The NVRAM 204 is a contiguous block of reserved memory in the storage unit 152 DRAM 216, and is backed by NAND flash. NVRAM 204 is logically divided into multiple memory regions written for two as spool (e.g., spool_region). Space within the NVRAM 204 spools is managed by each authority 168 independently. Each device provides an amount of storage space to each authority 168. That authority 168 further manages lifetimes and allocations within that space. Examples of a spool include distributed transactions or notions. When the primary power to a storage unit 152 fails, onboard super-capacitors provide a short duration of power hold up. During this holdup interval, the contents of the NVRAM 204 are flushed to flash memory 206. On the next power-on, the contents of the NVRAM 204 are recovered from the flash memory 206.

As for the storage unit controller, the responsibility of the logical "controller" is distributed across each of the blades containing authorities 168. This distribution of logical control is shown in FIG. 2D as a host controller 242, mid-tier controller 244 and storage unit controller(s) 246. Management of the control plane and the storage plane are treated independently, although parts may be physically co-located on the same blade. Each authority 168 effectively serves as an independent controller. Each authority 168 provides its own data and metadata structures, its own background workers, and maintains its own lifecycle.

Figure 2E:
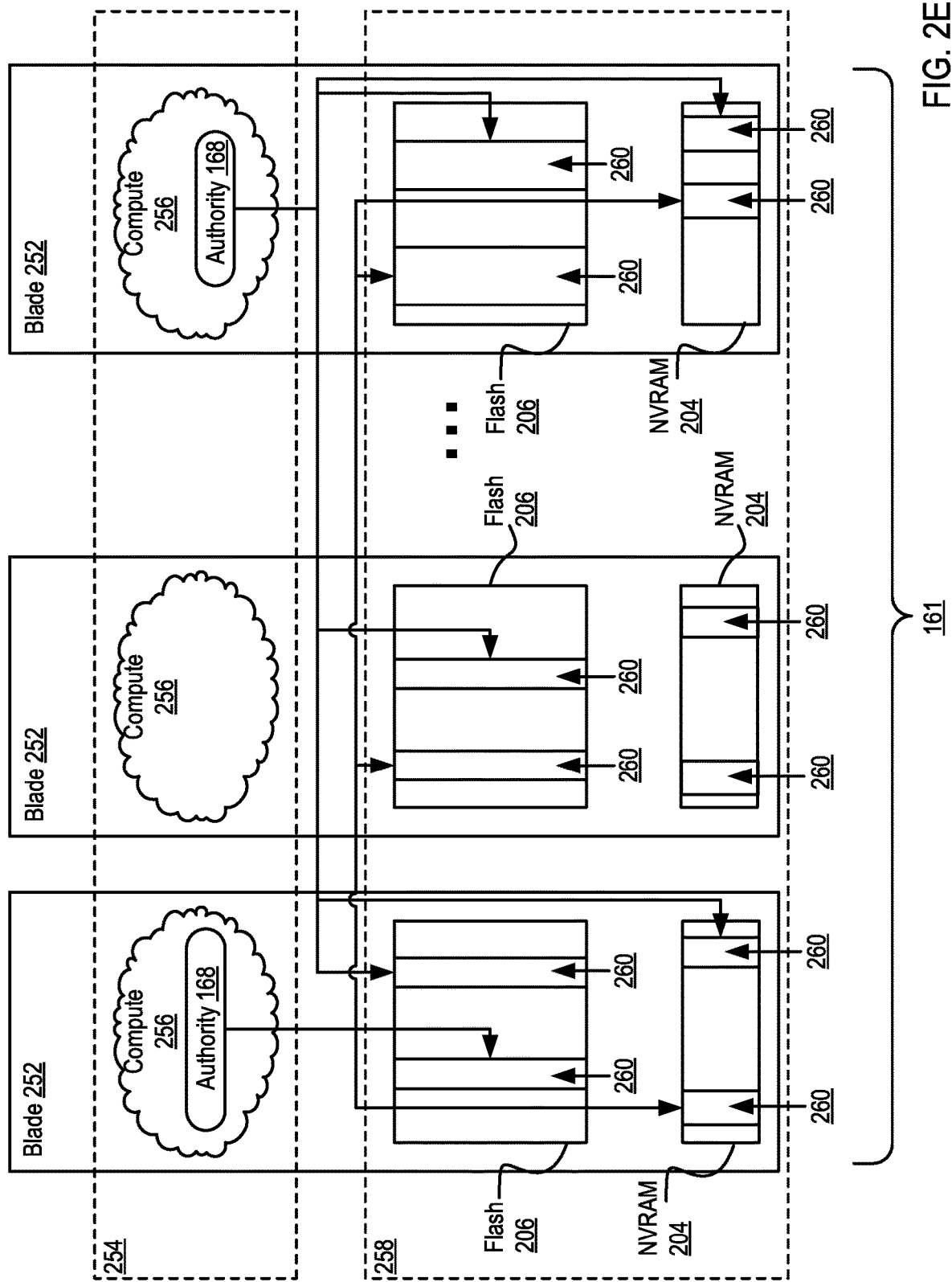
FIG. 2E is a blade hardware block diagram, showing a control plane, compute and storage planes, and authorities interacting with underlying physical resources, in accordance with some embodiments.

FIG. 2E is a blade 252 hardware block diagram, showing a control plane 254, compute and storage planes 256, 258, and authorities 168 interacting with underlying physical resources, using embodiments of the storage nodes 150 and storage units 152 of FIGS. 2A-C in the storage server environment of FIG. 2D. The control plane 254 is partitioned into a number of authorities 168 which can use the compute resources in the compute plane 256 to run on any of the blades 252. The storage plane 258 is partitioned into a set of devices, each of which provides access to flash 206 and NVRAM 204 resources. In one embodiment, the compute plane 256 may perform the operations of a storage array controller, as described herein, on one or more devices of the storage plane 258 (e.g., a storage array).

In the compute and storage planes 256, 258 of FIG. 2E, the authorities 168 interact with the underlying physical resources (i.e., devices). From the point of view of an authority 168, its resources are striped over all of the physical devices. From the point of view of a device, it provides resources to all authorities 168, irrespective of where the authorities happen to run. Each authority 168 has allocated or has been allocated one or more partitions 260 of storage memory in the storage units 152, e.g. partitions 260 in flash memory 206 and NVRAM 204. Each authority 168 uses those allocated partitions 260 that belong to it, for writing or reading user data. Authorities can be associated with differing amounts of physical storage of the system. For example, one authority 168 could have a larger number of partitions 260 or larger sized partitions 260 in one or more storage units 152 than one or more other authorities 168.

Figure 2F:
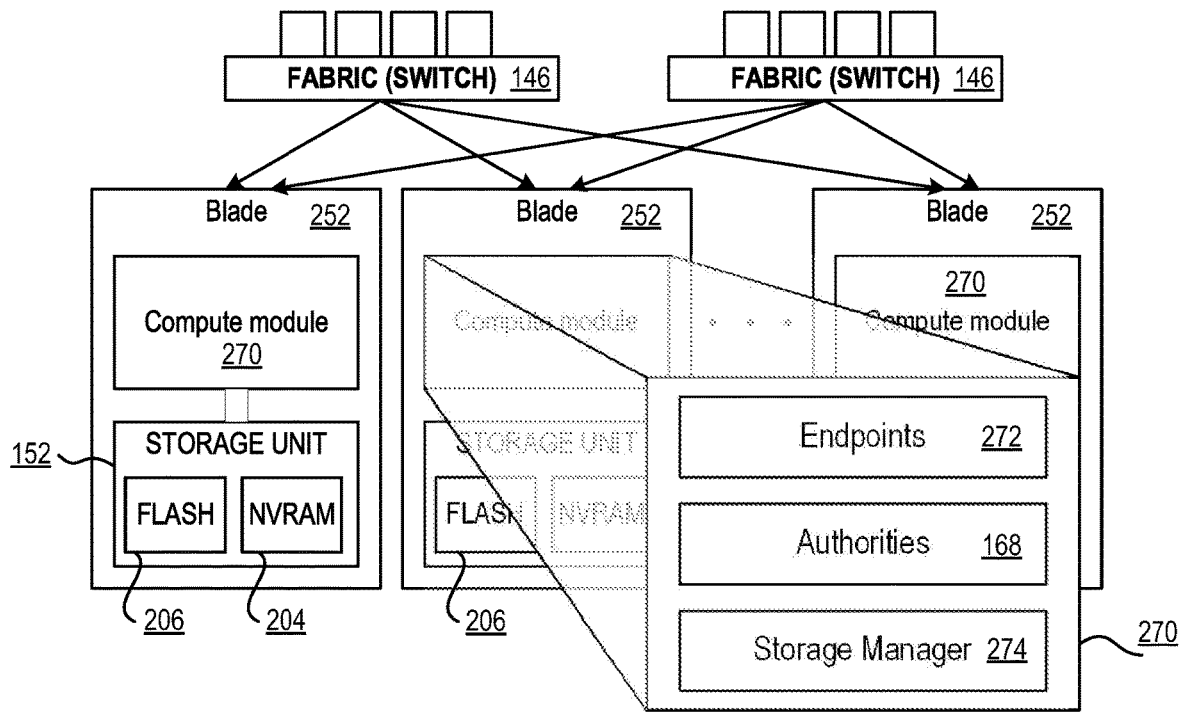
FIG. 2F depicts elasticity software layers in blades of a storage cluster, in accordance with some embodiments.

FIG. 2F depicts elasticity software layers in blades 252 of a storage cluster, in accordance with some embodiments. In the elasticity structure, elasticity software is symmetric, i.e., each blade's compute module 270 runs the three identical layers of processes depicted in FIG. 2F. Storage managers 274 execute read and write requests from other blades 252 for data and metadata stored in local storage unit 152 NVRAM 204 and flash 206. Authorities 168 fulfill client requests by issuing the necessary reads and writes to the blades 252 on whose storage units 152 the corresponding data or metadata resides. Endpoints 272 parse client connection requests received from switch fabric 146 supervisory software, relay the client connection requests to the authorities 168 responsible for fulfillment, and relay the authorities' 168 responses to clients. The symmetric three-layer structure enables the storage system's high degree of concurrency. Elasticity scales out efficiently and reliably in these embodiments. In addition, elasticity implements a unique scale-out technique that balances work evenly across all resources regardless of client access pattern, and maximizes concurrency by eliminating much of the need for inter-blade coordination that typically occurs with conventional distributed locking.

Still referring to FIG. 2F, authorities 168 running in the compute modules 270 of a blade 252 perform the internal operations required to fulfill client requests. One feature of elasticity is that authorities 168 are stateless, i.e., they cache active data and metadata in their own blades' 252 DRAMs for fast access, but the authorities store every update in their NVRAM 204 partitions on three separate blades 252 until the update has been written to flash 206. All the storage system writes to NVRAM 204 are in triplicate to partitions on three separate blades 252 in some embodiments. With triple-mirrored NVRAM 204 and persistent storage protected by parity and Reed-Solomon RAID checksums, the storage system can survive concurrent failure of two blades 252 with no loss of data, metadata, or access to either.

Because authorities 168 are stateless, they can migrate between blades 252. Each authority 168 has a unique identifier. NVRAM 204 and flash 206 partitions are associated with authorities' 168 identifiers, not with the blades 252 on which they are running in some. Thus, when an authority 168 migrates, the authority 168 continues to manage the same storage partitions from its new location. When a new blade 252 is installed in an embodiment of the storage cluster, the system automatically rebalances load by: partitioning the new blade's 252 storage for use by the system's authorities 168, migrating selected authorities 168 to the new blade 252, starting endpoints 272 on the new blade 252 and including them in the switch fabric's 146 client connection distribution algorithm.

From their new locations, migrated authorities 168 persist the contents of their NVRAM 204 partitions on flash 206, process read and write requests from other authorities 168, and fulfill the client requests that endpoints 272 direct to them. Similarly, if a blade 252 fails or is removed, the system redistributes its authorities 168 among the system's remaining blades 252. The redistributed authorities 168 continue to perform their original functions from their new locations.

Figure 2G:
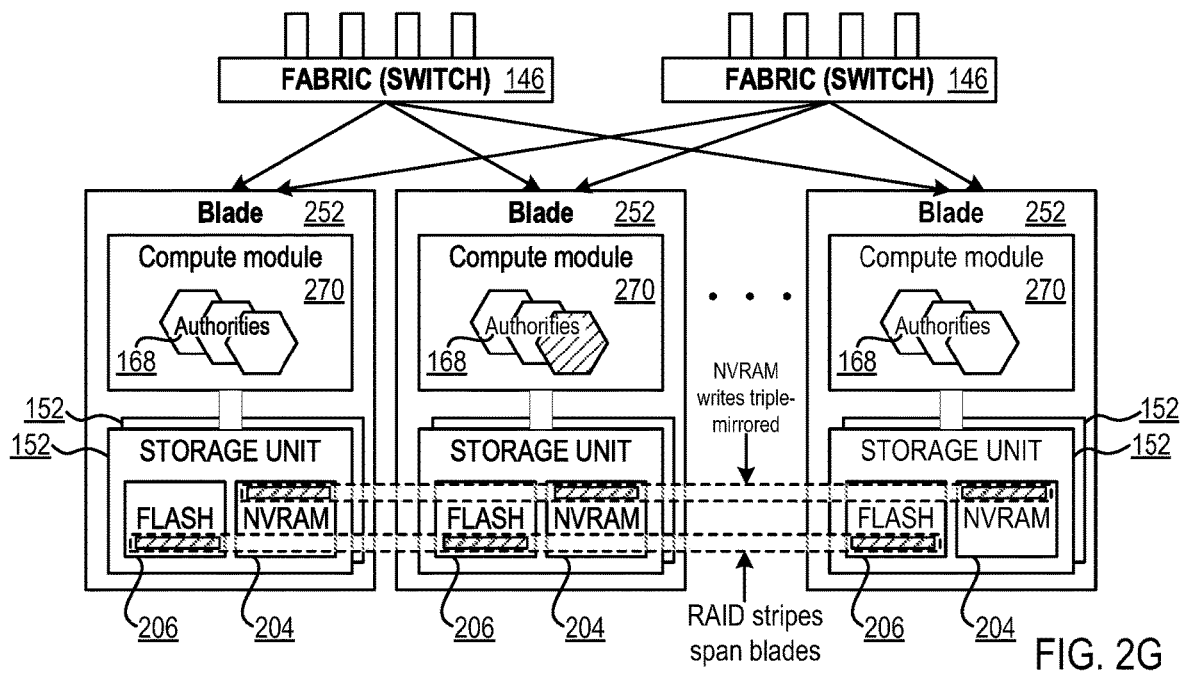
FIG. 2G depicts authorities and storage resources in blades of a storage cluster, in accordance with some embodiments.

FIG. 2G depicts authorities 168 and storage resources in blades 252 of a storage cluster, in accordance with some embodiments. Each authority 168 is exclusively responsible for a partition of the flash 206 and NVRAM 204 on each blade 252. The authority 168 manages the content and integrity of its partitions independently of other authorities 168. Authorities 168 compress incoming data and preserve it temporarily in their NVRAM 204 partitions, and then consolidate, RAID-protect, and persist the data in segments of the storage in their flash 206 partitions. As the authorities 168 write data to flash 206, storage managers 274 perform the necessary flash translation to optimize write performance and maximize media longevity. In the background, authorities 168 "garbage collect," or reclaim space occupied by data that clients have made obsolete by overwriting the data. It should be appreciated that since authorities' 168 partitions are disjoint, there is no need for distributed locking to execute client and writes or to perform background functions.

The embodiments described herein may utilize various software, communication and/or networking protocols. In addition, the configuration of the hardware and/or software may be adjusted to accommodate various protocols. For example, the embodiments may utilize Active Directory, which is a database based system that provides authentication, directory, policy, and other services in a WINDOWS' environment. In these embodiments, LDAP (Lightweight Directory Access Protocol) is one example application protocol for querying and modifying items in directory service providers such as Active Directory. In some embodiments, a network lock manager ('NLM') is utilized as a facility that works in cooperation with the Network File System ('NFS') to provide a System V style of advisory file and record locking over a network. The Server Message Block ('SMB') protocol, one version of which is also known as Common Internet File System ('CIFS'), may be integrated with the storage systems discussed herein. SMP operates as an application-layer network protocol typically used for providing shared access to files, printers, and serial ports and miscellaneous communications between nodes on a network. SMB also provides an authenticated inter-process communication mechanism. AMAZON™ S3 (Simple Storage Service) is a web service offered by Amazon Web Services, and the systems described herein may interface with Amazon S3 through web services interfaces (REST (representational state transfer), SOAP (simple object access protocol), and BitTorrent). A RESTful API (application programming interface) breaks down a transaction to create a series of small modules. Each module addresses a particular underlying part of the transaction. The control or permissions provided with these embodiments, especially for object data, may include utilization of an access control list ('ACL'). The ACL is a list of permissions attached to an object and the ACL specifies which users or system processes are granted access to objects, as well as what operations are allowed on given objects. The systems may utilize Internet Protocol version 6 ('IPv6'), as well as IPv4, for the communications protocol that provides an identification and location system for computers on networks and routes traffic across the Internet. The routing of packets between networked systems may include Equal-cost multi-path routing ('ECMP'), which is a routing strategy where next-hop packet forwarding to a single destination can occur over multiple "best paths" which tie for top place in routing metric calculations. Multi-path routing can be used in conjunction with most routing protocols, because it is a per-hop decision limited to a single router. The software may support Multi-tenancy, which is an architecture in which a single instance of a software application serves multiple customers. Each customer may be referred to as a tenant. Tenants may be given the ability to customize some parts of the application, but may not customize the application's code, in some embodiments. The embodiments may maintain audit logs. An audit log is a document that records an event in a computing system. In addition to documenting what resources were accessed, audit log entries typically include destination and source addresses, a timestamp, and user login information for compliance with various regulations. The embodiments may support various key management policies, such as encryption key rotation. In addition, the system may support dynamic root passwords or some variation dynamically changing passwords.

Figure 3A:
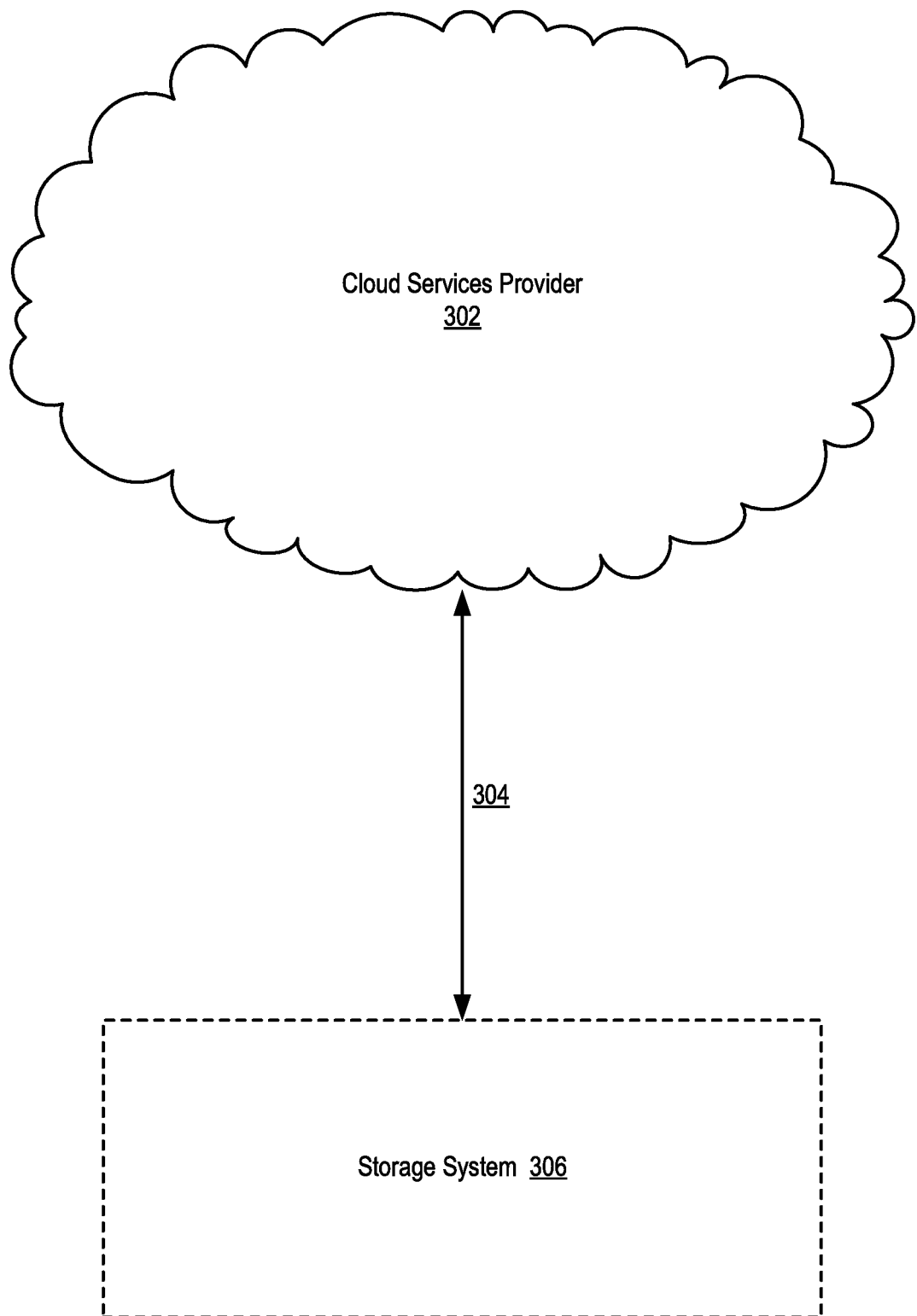
FIG. 3A sets forth a diagram of a storage system that is coupled for data communications with a cloud services provider in accordance with some embodiments of the present disclosure.

FIG. 3A sets forth a diagram of a storage system 306 that is coupled for data communications with a cloud services provider 302 in accordance with some embodiments of the present disclosure. Although depicted in less detail, the storage system 306 depicted in FIG. 3A may be similar to the storage systems described above with reference to FIGS. 1A-1D and FIGS. 2A-2G. In some embodiments, the storage system 306 depicted in FIG. 3A may be embodied as a storage system that includes imbalanced active/active controllers, as a storage system that includes balanced active/active controllers, as a storage system that includes active/active controllers where less than all of each controller's resources are utilized such that each controller has reserve resources that may be used to support failover, as a storage system that includes fully active/active controllers, as a storage system that includes dataset-segregated controllers, as a storage system that includes dual-layer architectures with front-end controllers and back-end integrated storage controllers, as a storage system that includes scale-out clusters of dual-controller arrays, as well as combinations of such embodiments.

In the example depicted in FIG. 3A, the storage system 306 is coupled to the cloud services provider 302 via a data communications link 304. The data communications link 304 may be embodied as a dedicated data communications link, as a data communications pathway that is provided through the use of one or data communications networks such as a wide area network ('WAN') or local area network ('LAN'), or as some other mechanism capable of transporting digital information between the storage system 306 and the cloud services provider 302. Such a data communications link 304 may be fully wired, fully wireless, or some aggregation of wired and wireless data communications pathways. In such an example, digital information may be exchanged between the storage system 306 and the cloud services provider 302 via the data communications link 304 using one or more data communications protocols. For example, digital information may be exchanged between the storage system 306 and the cloud services provider 302 via the data communications link 304 using the handheld device transfer protocol ('HDTP'), hypertext transfer protocol ('HTTP'), internet protocol ('IP'), real-time transfer protocol ('RTP'), transmission control protocol ('TCP'), user datagram protocol ('UDP'), wireless application protocol ('WAP'), or other protocol.

The cloud services provider 302 depicted in FIG. 3A may be embodied, for example, as a system and computing environment that provides a vast array of services to users of the cloud services provider 302 through the sharing of computing resources via the data communications link 304. The cloud services provider 302 may provide on-demand access to a shared pool of configurable computing resources such as computer networks, servers, storage, applications and services, and so on. The shared pool of configurable resources may be rapidly provisioned and released to a user of the cloud services provider 302 with minimal management effort. Generally, the user of the cloud services provider 302 is unaware of the exact computing resources utilized by the cloud services provider 302 to provide the services. Although in many cases such a cloud services provider 302 may be accessible via the Internet, readers of skill in the art will recognize that any system that abstracts the use of shared resources to provide services to a user through any data communications link may be considered a cloud services provider 302.

In the example depicted in FIG. 3A, the cloud services provider 302 may be configured to provide a variety of services to the storage system 306 and users of the storage system 306 through the implementation of various service models. For example, the cloud services provider 302 may be configured to provide services through the implementation of an infrastructure as a service ('IaaS') service model where the cloud services provider 302 offers computing infrastructure such as virtual machines and other resources as a service to subscribers, through the implementation of a platform as a service ('PaaS') service model where the cloud services provider 302 offers a development environment to application developers, or in other ways. Such a development environment may include, for example, an operating system, programming-language execution environment, database, web server, or other components that may be utilized by application developers to develop and run software solutions on a cloud platform. Furthermore, the cloud services provider 302 may be configured to provide services through the implementation of a software as a service ('SaaS') service model where the cloud services provider 302 offers application software, databases, as well as the platforms that are used to run the applications to the storage system 306 and users of the storage system 306, providing the storage system 306 and users of the storage system 306 with on-demand software and eliminating the need to install and run the application on local computers, which may simplify maintenance and support of the application. The cloud services provider 302 may be further configured to provide services through the implementation of an authentication as a service ('AaaS') service model where the cloud services provider 302 offers authentication services that can be used to secure access to applications, data sources, or other resources. The cloud services provider 302 may also be configured to provide services to the storage system 306 and users of the storage system 306 through the implementation of a storage as a service model where the cloud services provider 302 offers access to its storage infrastructure for use by the storage system 306 and users of the storage system 306. Readers will appreciate that the cloud services provider 302 may be configured to provide additional services to the storage system 306 and users of the storage system 306 through the implementation of additional service models, as the service models described above are included only for explanatory purposes and in no way represent a limitation of the services that may be offered by the cloud services provider 302 or a limitation as to the service models that may be implemented by the cloud services provider 302.

In the example depicted in FIG. 3A, the cloud services provider 302 may be embodied, for example, as a private cloud, as a public cloud, or as a combination of a private cloud and public cloud. In an embodiment in which the cloud services provider 302 is embodied as a private cloud, the cloud services provider 302 may be dedicated to providing services to a single organization rather than providing services to multiple organizations. In an embodiment where the cloud services provider 302 is embodied as a public cloud, the cloud services provider 302 may provide services to multiple organizations. Public cloud and private cloud deployment models may differ and may come with various advantages and disadvantages. For example, because a public cloud deployment involves the sharing of a computing infrastructure across different organization, such a deployment may not be ideal for organizations with security concerns, mission-critical workloads, uptime requirements demands, and so on. While a private cloud deployment can address some of these issues, a private cloud deployment may require on-premises staff to manage the private cloud. In still alternative embodiments, the cloud services provider 302 may be embodied as a mix of a private and public cloud services with a hybrid cloud deployment.

Although not explicitly depicted in FIG. 3A, readers will appreciate that a vast amount of additional hardware components and additional software components may be necessary to facilitate the delivery of cloud services to the storage system 306 and users of the storage system 306. For example, the storage system 306 may be coupled to (or even include) a cloud storage gateway. Such a cloud storage gateway may be embodied, for example, as hardware-based or software-based appliance that is located on premise with the storage system 306. Such a cloud storage gateway may operate as a bridge between local applications that are executing on the storage array 306 and remote, cloud-based storage that is utilized by the storage array 306. Through the use of a cloud storage gateway, organizations may move primary iSCSI or NAS to the cloud services provider 302, thereby enabling the organization to save space on their on-premises storage systems. Such a cloud storage gateway may be configured to emulate a disk array, a block-based device, a file server, or other storage system that can translate the SCSI commands, file server commands, or other appropriate command into REST-space protocols that facilitate communications with the cloud services provider 302.

In order to enable the storage system 306 and users of the storage system 306 to make use of the services provided by the cloud services provider 302, a cloud migration process may take place during which data, applications, or other elements from an organization's local systems (or even from another cloud environment) are moved to the cloud services provider 302. In order to successfully migrate data, applications, or other elements to the cloud services provider's 302 environment, middleware such as a cloud migration tool may be utilized to bridge gaps between the cloud services provider's 302 environment and an organization's environment. Such cloud migration tools may also be configured to address potentially high network costs and long transfer times associated with migrating large volumes of data to the cloud services provider 302, as well as addressing security concerns associated with sensitive data to the cloud services provider 302 over data communications networks. In order to further enable the storage system 306 and users of the storage system 306 to make use of the services provided by the cloud services provider 302, a cloud orchestrator may also be used to arrange and coordinate automated tasks in pursuit of creating a consolidated process or workflow. Such a cloud orchestrator may perform tasks such as configuring various components, whether those components are cloud components or on-premises components, as well as managing the interconnections between such components. The cloud orchestrator can simplify the inter-component communication and connections to ensure that links are correctly configured and maintained.

In the example depicted in FIG. 3A, and as described briefly above, the cloud services provider 302 may be configured to provide services to the storage system 306 and users of the storage system 306 through the usage of a SaaS service model where the cloud services provider 302 offers application software, databases, as well as the platforms that are used to run the applications to the storage system 306 and users of the storage system 306, providing the storage system 306 and users of the storage system 306 with on-demand software and eliminating the need to install and run the application on local computers, which may simplify maintenance and support of the application. Such applications may take many forms in accordance with various embodiments of the present disclosure. For example, the cloud services provider 302 may be configured to provide access to data analytics applications to the storage system 306 and users of the storage system 306. Such data analytics applications may be configured, for example, to receive vast amounts of telemetry data phoned home by the storage system 306. Such telemetry data may describe various operating characteristics of the storage system 306 and may be analyzed for a vast array of purposes including, for example, to determine the health of the storage system 306, to identify workloads that are executing on the storage system 306, to predict when the storage system 306 will run out of various resources, to recommend configuration changes, hardware or software upgrades, workflow migrations, or other actions that may improve the operation of the storage system 306.

The cloud services provider 302 may also be configured to provide access to virtualized computing environments to the storage system 306 and users of the storage system 306. Such virtualized computing environments may be embodied, for example, as a virtual machine or other virtualized computer hardware platforms, virtual storage devices, virtualized computer network resources, and so on. Examples of such virtualized environments can include virtual machines that are created to emulate an actual computer, virtualized desktop environments that separate a logical desktop from a physical machine, virtualized file systems that allow uniform access to different types of concrete file systems, and many others.

Figure 3B:
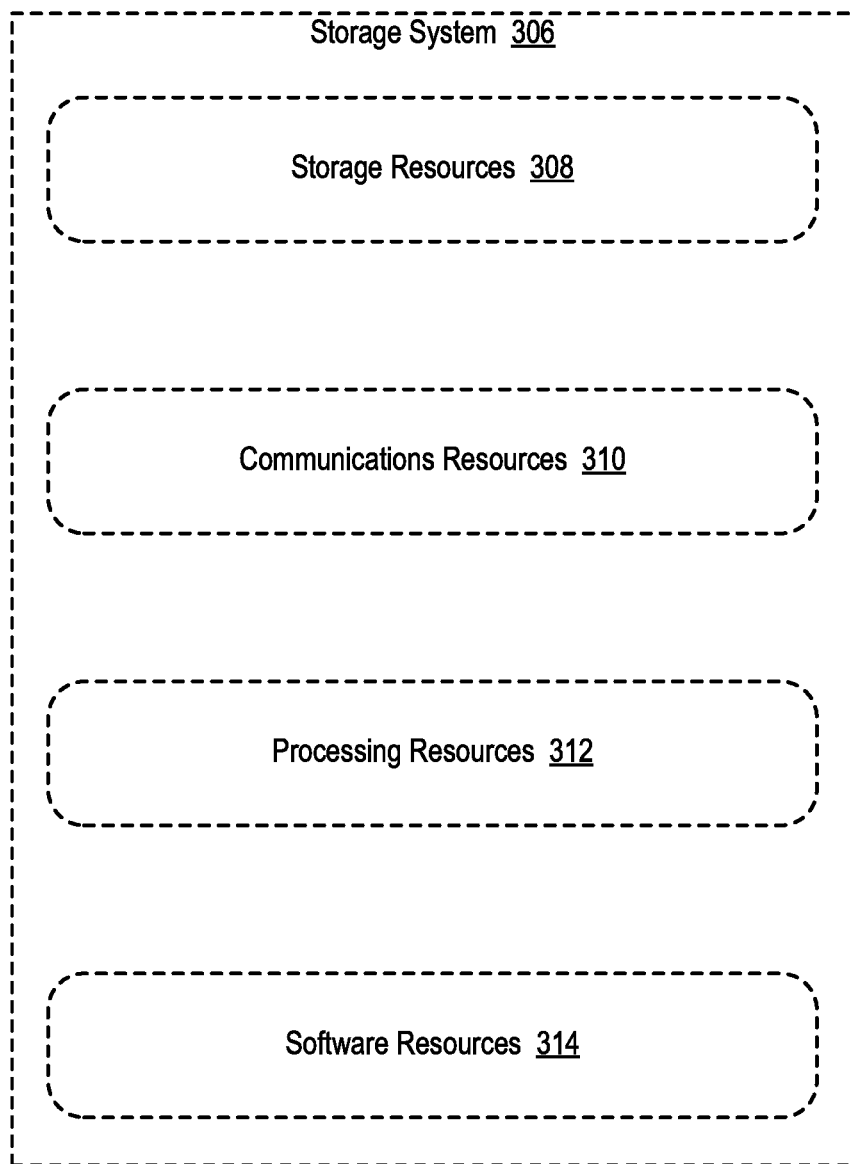
FIG. 3B sets forth a diagram of a storage system in accordance with some embodiments of the present disclosure.

For further explanation, FIG. 3B sets forth a diagram of a storage system 306 in accordance with some embodiments of the present disclosure. Although depicted in less detail, the storage system 306 depicted in FIG. 3B may be similar to the storage systems described above with reference to FIGS. 1A-1D and FIGS. 2A-2G as the storage system may include many of the components described above.

The storage system 306 depicted in FIG. 3B may include a vast amount of storage resources 308, which may be embodied in many forms. For example, the storage resources 308 can include nano-RAM or another form of nonvolatile random access memory that utilizes carbon nanotubes deposited on a substrate, 3D crosspoint non-volatile memory, flash memory including single-level cell ('SLC') NAND flash, multi-level cell ('MLC') NAND flash, triple-level cell ('TLC') NAND flash, quad-level cell ('QLC') NAND flash, or others. Likewise, the storage resources 308 may include non-volatile magnetoresistive random-access memory ('MRAM'), including spin transfer torque ('STT') MRAM. The example storage resources 308 may alternatively include non-volatile phase-change memory ('PCM'), quantum memory that allows for the storage and retrieval of photonic quantum information, resistive random-access memory ('ReRAM'), storage class memory ('SCM'), or other form of storage resources, including any combination of resources described herein. Readers will appreciate that other forms of computer memories and storage devices may be utilized by the storage systems described above, including DRAM, SRAM, EEPROM, universal memory, and many others. The storage resources 308 depicted in FIG. 3A may be embodied in a variety of form factors, including but not limited to, dual in-line memory modules ('DIMMs'), non-volatile dual in-line memory modules ('NVDIMMs'), M.2, U.2, and others.

The storage resources 308 depicted in FIG. 3A may include various forms of storage-class memory ('SCM'). SCM may effectively treat fast, non-volatile memory (e.g., NAND flash) as an extension of DRAM such that an entire dataset may be treated as an in-memory dataset that resides entirely in DRAM. SCM may include non-volatile media such as, for example, NAND flash. Such NAND flash may be accessed utilizing NVMe that can use the PCIe bus as its transport, providing for relatively low access latencies compared to older protocols. In fact, the network protocols used for SSDs in all-flash arrays can include NVMe using Ethernet (ROCE, NVME TCP), Fibre Channel (NVMe FC), InfiniBand (iWARP), and others that make it possible to treat fast, non-volatile memory as an extension of DRAM. In view of the fact that DRAM is often byte-addressable and fast, non-volatile memory such as NAND flash is block-addressable, a controller software/hardware stack may be needed to convert the block data to the bytes that are stored in the media. Examples of media and software that may be used as SCM can include, for example, 3D XPoint, Intel Memory Drive Technology, Samsung's Z-SSD, and others.

The example storage system 306 depicted in FIG. 3B may implement a variety of storage architectures. For example, storage systems in accordance with some embodiments of the present disclosure may utilize block storage where data is stored in blocks, and each block essentially acts as an individual hard drive. Storage systems in accordance with some embodiments of the present disclosure may utilize object storage, where data is managed as objects. Each object may include the data itself, a variable amount of metadata, and a globally unique identifier, where object storage can be implemented at multiple levels (e.g., device level, system level, interface level). Storage systems in accordance with some embodiments of the present disclosure utilize file storage in which data is stored in a hierarchical structure. Such data may be saved in files and folders, and presented to both the system storing it and the system retrieving it in the same format.

The example storage system 306 depicted in FIG. 3B may be embodied as a storage system in which additional storage resources can be added through the use of a scale-up model, additional storage resources can be added through the use of a scale-out model, or through some combination thereof. In a scale-up model, additional storage may be added by adding additional storage devices. In a scale-out model, however, additional storage nodes may be added to a cluster of storage nodes, where such storage nodes can include additional processing resources, additional networking resources, and so on.

The storage system 306 depicted in FIG. 3B also includes communications resources 310 that may be useful in facilitating data communications between components within the storage system 306, as well as data communications between the storage system 306 and computing devices that are outside of the storage system 306, including embodiments where those resources are separated by a relatively vast expanse. The communications resources 310 may be configured to utilize a variety of different protocols and data communication fabrics to facilitate data communications between components within the storage systems as well as computing devices that are outside of the storage system. For example, the communications resources 310 can include fibre channel ('FC') technologies such as FC fabrics and FC protocols that can transport SCSI commands over FC networks. The communications resources 310 can also include FC over ethernet ('FCoE') technologies through which FC frames are encapsulated and transmitted over Ethernet networks. The communications resources 310 can also include InfiniBand ('IB') technologies in which a switched fabric topology is utilized to facilitate transmissions between channel adapters. The communications resources 310 can also include NVM Express ('NVMe') technologies and NVMe over fabrics ('NVMeoF') technologies through which non-volatile storage media attached via a PCI express ('PCIe') bus may be accessed. The communications resources 310 can also include mechanisms for accessing storage resources 308 within the storage system 306 utilizing serial attached SCSI ('SAS'), serial ATA ('SATA') bus interfaces for connecting storage resources 308 within the storage system 306 to host bus adapters within the storage system 306, internet small computer systems interface ('iSCSI') technologies to provide block-level access to storage resources 308 within the storage system 306, and other communications resources that that may be useful in facilitating data communications between components within the storage system 306, as well as data communications between the storage system 306 and computing devices that are outside of the storage system 306.

The storage system 306 depicted in FIG. 3B also includes processing resources 312 that may be useful in useful in executing computer program instructions and performing other computational tasks within the storage system 306. The processing resources 312 may include one or more application-specific integrated circuits ('ASICs') that are customized for some particular purpose as well as one or more central processing units ('CPUs'). The processing resources 312 may also include one or more digital signal processors ('DSPs'), one or more field-programmable gate arrays ('FPGAs'), one or more systems on a chip ('SoCs'), or other form of processing resources 312. The storage system 306 may utilize the storage resources 312 to perform a variety of tasks including, but not limited to, supporting the execution of software resources 314 that will be described in greater detail below.

The storage system 306 depicted in FIG. 3B also includes software resources 314 that, when executed by processing resources 312 within the storage system 306, may perform a vast array of tasks. The software resources 314 may include, for example, one or more modules of computer program instructions that when executed by processing resources 312 within the storage system 306 are useful in carrying out various data protection techniques to preserve the integrity of data that is stored within the storage systems. Readers will appreciate that such data protection techniques may be carried out, for example, by system software executing on computer hardware within the storage system, by a cloud services provider, or in other ways. Such data protection techniques can include, for example, data archiving techniques that cause data that is no longer actively used to be moved to a separate storage device or separate storage system for long-term retention, data backup techniques through which data stored in the storage system may be copied and stored in a distinct location to avoid data loss in the event of equipment failure or some other form of catastrophe with the storage system, data replication techniques through which data stored in the storage system is replicated to another storage system such that the data may be accessible via multiple storage systems, data snapshotting techniques through which the state of data within the storage system is captured at various points in time, data and database cloning techniques through which duplicate copies of data and databases may be created, and other data protection techniques. Through the use of such data protection techniques, business continuity and disaster recovery objectives may be met as a failure of the storage system may not result in the loss of data stored in the storage system.

The software resources 314 may also include software that is useful in implementing software-defined storage ('SDS'). In such an example, the software resources 314 may include one or more modules of computer program instructions that, when executed, are useful in policy-based provisioning and management of data storage that is independent of the underlying hardware. Such software resources 314 may be useful in implementing storage virtualization to separate the storage hardware from the software that manages the storage hardware.

The software resources 314 may also include software that is useful in facilitating and optimizing I/O operations that are directed to the storage resources 308 in the storage system 306. For example, the software resources 314 may include software modules that perform carry out various data reduction techniques such as, for example, data compression, data deduplication, and others. The software resources 314 may include software modules that intelligently group together I/O operations to facilitate better usage of the underlying storage resource 308, software modules that perform data migration operations to migrate from within a storage system, as well as software modules that perform other functions. Such software resources 314 may be embodied as one or more software containers or in many other ways.

Readers will appreciate that the presence of such software resources 314 may provide for an improved user experience of the storage system 306, an expansion of functionality supported by the storage system 306, and many other benefits. Consider the specific example of the software resources 314 carrying out data backup techniques through which data stored in the storage system may be copied and stored in a distinct location to avoid data loss in the event of equipment failure or some other form of catastrophe. In such an example, the systems described herein may more reliably (and with less burden placed on the user) perform backup operations relative to interactive backup management systems that require high degrees of user interactivity, offer less robust automation and feature sets, and so on.

Figure 3C:
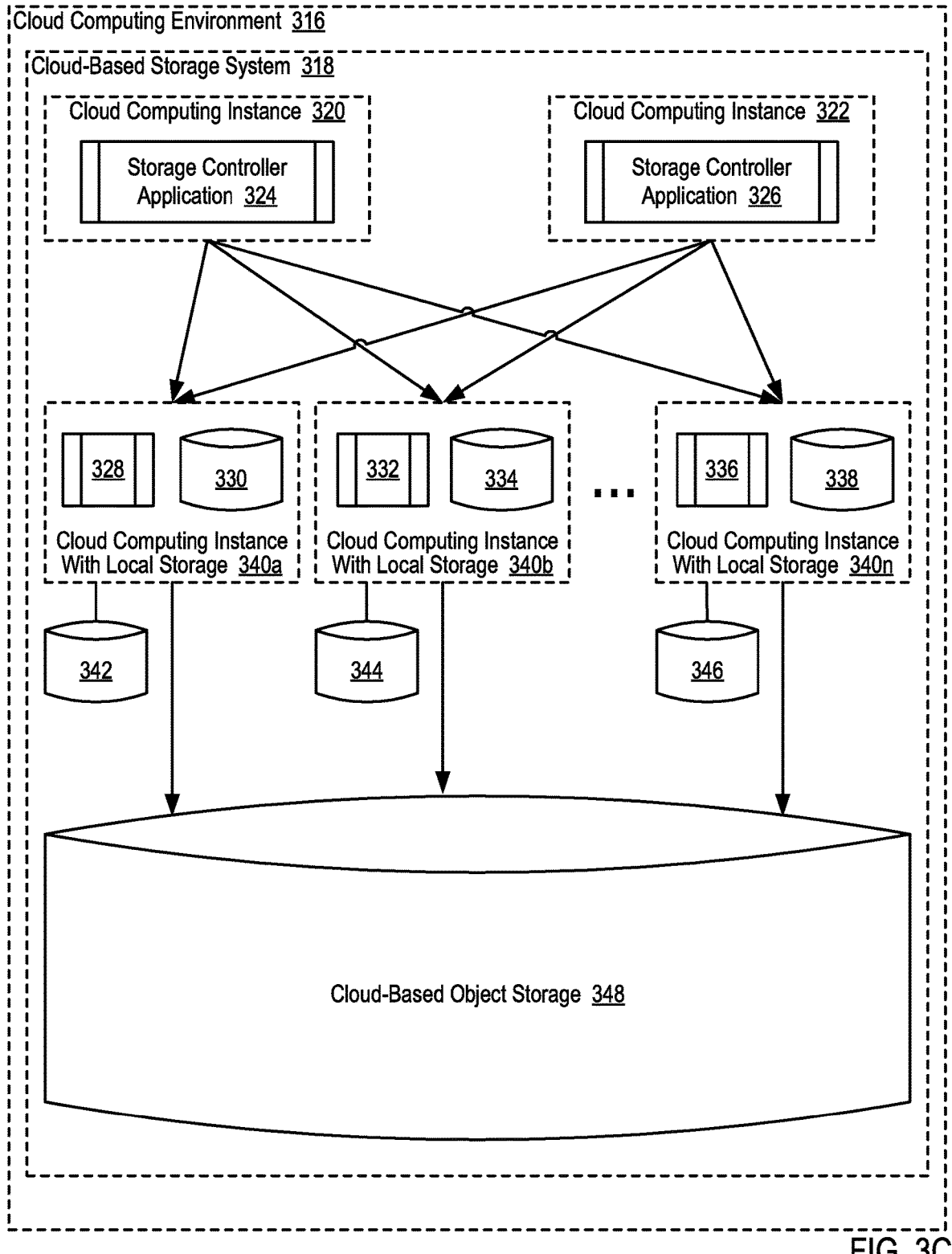
FIG. 3C sets forth an example of a cloud-based storage system in accordance with some embodiments of the present disclosure.

For further explanation, FIG. 3C sets forth an example of a cloud-based storage system 318 in accordance with some embodiments of the present disclosure. In the example depicted in FIG. 3C, the cloud-based storage system 318 is created entirely in a cloud computing environment 316 such as, for example, Amazon Web Services ('AWS'), Microsoft Azure, Google Cloud Platform, IBM Cloud, Oracle Cloud, and others. The cloud-based storage system 318 may be used to provide services similar to the services that may be provided by the storage systems described above. For example, the cloud-based storage system 318 may be used to provide block storage services to users of the cloud-based storage system 318, the cloud-based storage system 318 may be used to provide storage services to users of the cloud-based storage system 318 through the use of solid-state storage, and so on.

The cloud-based storage system 318 depicted in FIG. 3C includes two cloud computing instances 320, 322 that each are used to support the execution of a storage controller application 324, 326. The cloud computing instances 320, 322 may be embodied, for example, as instances of cloud computing resources (e.g., virtual machines) that may be provided by the cloud computing environment 316 to support the execution of software applications such as the storage controller application 324, 326. In one embodiment, the cloud computing instances 320, 322 may be embodied as Amazon Elastic Compute Cloud ('EC2') instances. In such an example, an Amazon Machine Image ('AMI') that includes the storage controller application 324, 326 may be booted to create and configure a virtual machine that may execute the storage controller application 324, 326.

In the example method depicted in FIG. 3C, the storage controller application 324, 326 may be embodied as a module of computer program instructions that, when executed, carries out various storage tasks. For example, the storage controller application 324, 326 may be embodied as a module of computer program instructions that, when executed, carries out the same tasks as the controllers 110A, 110B in FIG. 1A described above such as writing data received from the users of the cloud-based storage system 318 to the cloud-based storage system 318, erasing data from the cloud-based storage system 318, retrieving data from the cloud-based storage system 318 and providing such data to users of the cloud-based storage system 318, monitoring and reporting of disk utilization and performance, performing redundancy operations, such as RAID or RAID-like data redundancy operations, compressing data, encrypting data, deduplicating data, and so forth. Readers will appreciate that because there are two cloud computing instances 320, 322 that each include the storage controller application 324, 326, in some embodiments one cloud computing instance 320 may operate as the primary controller as described above while the other cloud computing instance 322 may operate as the secondary controller as described above. In such an example, in order to save costs, the cloud computing instance 320 that operates as the primary controller may be deployed on a relatively high-performance and relatively expensive cloud computing instance while the cloud computing instance 322 that operates as the secondary controller may be deployed on a relatively low-performance and relatively inexpensive cloud computing instance. Readers will appreciate that the storage controller application 324, 326 depicted in FIG. 3C may include identical source code that is executed within different cloud computing instances 320, 322.

Consider an example in which the cloud computing environment 316 is embodied as AWS and the cloud computing instances are embodied as EC2 instances. In such an example, AWS offers many types of EC2 instances. For example, AWS offers a suite of general purpose EC2 instances that include varying levels of memory and processing power. In such an example, the cloud computing instance 320 that operates as the primary controller may be deployed on one of the instance types that has a relatively large amount of memory and processing power while the cloud computing instance 322 that operates as the secondary controller may be deployed on one of the instance types that has a relatively small amount of memory and processing power. In such an example, upon the occurrence of a failover event where the roles of primary and secondary are switched, a double failover may actually be carried out such that: 1) a first failover event where the cloud computing instance 322 that formerly operated as the secondary controller begins to operate as the primary controller, and 2) a third cloud computing instance (not shown) that is of an instance type that has a relatively large amount of memory and processing power is spun up with a copy of the storage controller application, where the third cloud computing instance begins operating as the primary controller while the cloud computing instance 322 that originally operated as the secondary controller begins operating as the secondary controller again. In such an example, the cloud computing instance 320 that formerly operated as the primary controller may be terminated. Readers will appreciate that in alternative embodiments, the cloud computing instance 320 that is operating as the secondary controller after the failover event may continue to operate as the secondary controller and the cloud computing instance 322 that operated as the primary controller after the occurrence of the failover event may be terminated once the primary role has been assumed by the third cloud computing instance (not shown).

Readers will appreciate that while the embodiments described above relate to embodiments where one cloud computing instance 320 operates as the primary controller and the second cloud computing instance 322 operates as the secondary controller, other embodiments are within the scope of the present disclosure. For example, each cloud computing instance 320, 322 may operate as a primary controller for some portion of the address space supported by the cloud-based storage system 318, each cloud computing instance 320, 322 may operate as a primary controller where the servicing of I/O operations directed to the cloud-based storage system 318 are divided in some other way, and so on. In fact, in other embodiments where costs savings may be prioritized over performance demands, only a single cloud computing instance may exist that contains the storage controller application. In such an example, a controller failure may take more time to recover from as a new cloud computing instance that includes the storage controller application would need to be spun up rather than having an already created cloud computing instance take on the role of servicing I/O operations that would have otherwise been handled by the failed cloud computing instance.

The cloud-based storage system 318 depicted in FIG. 3C includes cloud computing instances 340a, 340b, 340n with local storage 330, 334, 338. The cloud computing instances 340a, 340b, 340n depicted in FIG. 3C may be embodied, for example, as instances of cloud computing resources that may be provided by the cloud computing environment 316 to support the execution of software applications. The cloud computing instances 340a, 340b, 340n of FIG. 3C may differ from the cloud computing instances 320, 322 described above as the cloud computing instances 340a, 340b, 340n of FIG. 3C have local storage 330, 334, 338 resources whereas the cloud computing instances 320, 322 that support the execution of the storage controller application 324, 326 need not have local storage resources. The cloud computing instances 340a, 340b, 340n with local storage 330, 334, 338 may be embodied, for example, as EC2 M5 instances that include one or more SSDs, as EC2 R5 instances that include one or more SSDs, as EC2 I3 instances that include one or more SSDs, and so on. In some embodiments, the local storage 330, 334, 338 must be embodied as solid-state storage (e.g., SSDs) rather than storage that makes use of hard disk drives.

In the example depicted in FIG. 3C, each of the cloud computing instances 340a, 340b, 340n with local storage 330, 334, 338 can include a software daemon 328, 332, 336 that, when executed by a cloud computing instance 340a, 340b, 340n can present itself to the storage controller applications 324, 326 as if the cloud computing instance 340a, 340b, 340n were a physical storage device (e.g., one or more SSDs). In such an example, the software daemon 328, 332, 336 may include computer program instructions similar to those that would normally be contained on a storage device such that the storage controller applications 324, 326 can send and receive the same commands that a storage controller would send to storage devices. In such a way, the storage controller applications 324, 326 may include code that is identical to (or substantially identical to) the code that would be executed by the controllers in the storage systems described above. In these and similar embodiments, communications between the storage controller applications 324, 326 and the cloud computing instances 340a, 340b, 340n with local storage 330, 334, 338 may utilize iSCSI, NVMe over TCP, messaging, a custom protocol, or in some other mechanism.

In the example depicted in FIG. 3C, each of the cloud computing instances 340a, 340b, 340n with local storage 330, 334, 338 may also be coupled to block-storage 342, 344, 346 that is offered by the cloud computing environment 316. The block-storage 342, 344, 346 that is offered by the cloud computing environment 316 may be embodied, for example, as Amazon Elastic Block Store ('EBS') volumes. For example, a first EBS volume may be coupled to a first cloud computing instance 340a, a second EBS volume may be coupled to a second cloud computing instance 340b, and a third EBS volume may be coupled to a third cloud computing instance 340*n*. In such an example, the block-storage 342, 344, 346 that is offered by the cloud computing environment 316 may be utilized in a manner that is similar to how the NVRAM devices described above are utilized, as the software daemon 328, 332, 336 (or some other module) that is executing within a particular cloud comping instance 340*a*, 340*b*, 340*n* may, upon receiving a request to write data, initiate a write of the data to its attached EBS volume as well as a write of the data to its local storage 330, 334, 338 resources. In some alternative embodiments, data may only be written to the local storage 330, 334, 338 resources within a particular cloud comping instance 340*a*, 340*b*, 340*n*. In an alternative embodiment, rather than using the block-storage 342, 344, 346 that is offered by the cloud computing environment 316 as NVRAM, actual RAM on each of the cloud computing instances 340*a*, 340*b*, 340*n* with local storage 330, 334, 338 may be used as NVRAM, thereby decreasing network utilization costs that would be associated with using an EBS volume as the NVRAM.

In the example depicted in FIG. 3C, the cloud computing instances 340*a*, 340*b*, 340*n* with local storage 330, 334, 338 may be utilized, by cloud computing instances (320, 322) that support the execution of the storage controller application 324, 326 to service I/O operations that are directed to the cloud-based storage system 318. Consider an example in which a first cloud computing instance 320 that is executing the storage controller application 324 is operating as the primary controller. In such an example, the first cloud computing instance 320 that is executing the storage controller application 324 may receive (directly or indirectly via the secondary controller) requests to write data to the cloud-based storage system 318 from users of the cloud-based storage system 318. In such an example, the first cloud computing instance 320 that is executing the storage controller application 324 may perform various tasks such as, for example, deduplicating the data contained in the request, compressing the data contained in the request, determining where to the write the data contained in the request, and so on, before ultimately sending a request to write a deduplicated, encrypted, or otherwise possibly updated version of the data to one or more of the cloud computing instances 340*a*, 340*b*, 340*n* with local storage 330, 334, 338. Either cloud computing instance 320, 322, in some embodiments, may receive a request to read data from the cloud-based storage system 318 and may ultimately send a request to read data to one or more of the cloud computing instances 340*a*, 340*b*, 340*n* with local storage 330, 334, 338.

Readers will appreciate that when a request to write data is received by a particular cloud computing instance 340*a*, 340*b*, 340*n* with local storage 330, 334, 338, the software daemon 328, 332, 336 or some other module of computer program instructions that is executing on the particular cloud computing instance 340*a*, 340*b*, 340*n* may be configured to not only write the data to its own local storage 330, 334, 338 resources and any appropriate block-storage 342, 344, 346 that are offered by the cloud computing environment 316, but the software daemon 328, 332, 336 or some other module of computer program instructions that is executing on the particular cloud computing instance 340*a*, 340*b*, 340*n* may also be configured to write the data to cloud-based object storage 348 that is attached to the particular cloud computing instance 340*a*, 340*b*, 340*n*. The cloud-based object storage 348 that is attached to the particular cloud computing instance 340*a*, 340*b*, 340*n* may be embodied, for example, as Amazon Simple Storage Service ('S3') storage that is accessible by the particular cloud computing instance 340*a*, 340*b*, 340*n*. In other embodiments, the cloud computing instances 320, 322 that each include the storage controller application 324, 326 may initiate the storage of the data in the local storage 330, 334, 338 of the cloud computing instances 340*a*, 340*b*, 340*n* and the cloud-based object storage 348.

Readers will appreciate that, as described above, the cloud-based storage system 318 may be used to provide block storage services to users of the cloud-based storage system 318. While the local storage 330, 334, 338 resources and the block-storage 342, 344, 346 resources that are utilized by the cloud computing instances 340*a*, 340*b*, 340*n* may support block-level access, the cloud-based object storage 348 that is attached to the particular cloud computing instance 340*a*, 340*b*, 340*n* supports only object-based access. In order to address this, the software daemon 328, 332, 336 or some other module of computer program instructions that is executing on the particular cloud computing instance 340*a*, 340*b*, 340*n* may be configured to take blocks of data, package those blocks into objects, and write the objects to the cloud-based object storage 348 that is attached to the particular cloud computing instance 340*a*, 340*b*, 340*n*.

Consider an example in which data is written to the local storage 330, 334, 338 resources and the block-storage 342, 344, 346 resources that are utilized by the cloud computing instances 340*a*, 340*b*, 340*n* in 1 MB blocks. In such an example, assume that a user of the cloud-based storage system 318 issues a request to write data that, after being compressed and deduplicated by the storage controller application 324, 326 results in the need to write 5 MB of data. In such an example, writing the data to the local storage 330, 334, 338 resources and the block-storage 342, 344, 346 resources that are utilized by the cloud computing instances 340*a*, 340*b*, 340*n* is relatively straightforward as 5 blocks that are 1 MB in size are written to the local storage 330, 334, 338 resources and the block-storage 342, 344, 346 resources that are utilized by the cloud computing instances 340*a*, 340*b*, 340*n*. In such an example, the software daemon 328, 332, 336 or some other module of computer program instructions that is executing on the particular cloud computing instance 340*a*, 340*b*, 340*n* may be configured to: 1) create a first object that includes the first 1 MB of data and write the first object to the cloud-based object storage 348, 2) create a second object that includes the second 1 MB of data and write the second object to the cloud-based object storage 348, 3) create a third object that includes the third 1 MB of data and write the third object to the cloud-based object storage 348, and so on. As such, in some embodiments, each object that is written to the cloud-based object storage 348 may be identical (or nearly identical) in size. Readers will appreciate that in such an example, metadata that is associated with the data itself may be included in each object (e.g., the first 1 MB of the object is data and the remaining portion is metadata associated with the data).

Readers will appreciate that the cloud-based object storage 348 may be incorporated into the cloud-based storage system 318 to increase the durability of the cloud-based storage system 318. Continuing with the example described above where the cloud computing instances 340*a*, 340*b*, 340*n* are EC2 instances, readers will understand that EC2 instances are only guaranteed to have a monthly uptime of 99.9% and data stored in the local instance store only persists during the lifetime of the EC2 instance. As such, relying on the cloud computing instances 340*a*, 340*b*, 340*n* with local storage 330, 334, 338 as the only source of persistent data storage in the cloud-based storage system 318 may result in a relatively unreliable storage system. Likewise, EBS volumes are designed for 99.999% availability. As such, even relying on EBS as the persistent data store in the cloud-based storage system 318 may result in a storage system that is not sufficiently durable. Amazon S3, however, is designed to provide 99.999999999% durability, meaning that a cloud-based storage system 318 that can incorporate S3 into its pool of storage is substantially more durable than various other options.

Readers will appreciate that while a cloud-based storage system 318 that can incorporate S3 into its pool of storage is substantially more durable than various other options, utilizing S3 as the primary pool of storage may result in storage system that has relatively slow response times and relatively long I/O latencies. As such, the cloud-based storage system 318 depicted in FIG. 3C not only stores data in S3 but the cloud-based storage system 318 also stores data in local storage 330, 334, 338 resources and block-storage 342, 344, 346 resources that are utilized by the cloud computing instances 340*a*, 340*b*, 340*n*, such that read operations can be serviced from local storage 330, 334, 338 resources and the block-storage 342, 344, 346 resources that are utilized by the cloud computing instances 340*a*, 340*b*, 340*n*, thereby reducing read latency when users of the cloud-based storage system 318 attempt to read data from the cloud-based storage system 318.

In some embodiments, all data that is stored by the cloud-based storage system 318 may be stored in both: 1) the cloud-based object storage 348, and 2) at least one of the local storage 330, 334, 338 resources or block-storage 342, 344, 346 resources that are utilized by the cloud computing instances 340*a*, 340*b*, 340*n*. In such embodiments, the local storage 330, 334, 338 resources and block-storage 342, 344, 346 resources that are utilized by the cloud computing instances 340*a*, 340*b*, 340*n* may effectively operate as cache that generally includes all data that is also stored in S3, such that all reads of data may be serviced by the cloud computing instances 340*a*, 340*b*, 340*n* without requiring the cloud computing instances 340*a*, 340*b*, 340*n* to access the cloud-based object storage 348. Readers will appreciate that in other embodiments, however, all data that is stored by the cloud-based storage system 318 may be stored in the cloud-based object storage 348, but less than all data that is stored by the cloud-based storage system 318 may be stored in at least one of the local storage 330, 334, 338 resources or block-storage 342, 344, 346 resources that are utilized by the cloud computing instances 340*a*, 340*b*, 340*n*. In such an example, various policies may be utilized to determine which subset of the data that is stored by the cloud-based storage system 318 should reside in both: 1) the cloud-based object storage 348, and 2) at least one of the local storage 330, 334, 338 resources or block-storage 342, 344, 346 resources that are utilized by the cloud computing instances 340*a*, 340*b*, 340*n*.

As described above, when the cloud computing instances 340*a*, 340*b*, 340*n* with local storage 330, 334, 338 are embodied as EC2 instances, the cloud computing instances 340*a*, 340*b*, 340*n* with local storage 330, 334, 338 are only guaranteed to have a monthly uptime of 99.9% and data stored in the local instance store only persists during the lifetime of each cloud computing instance 340*a*, 340*b*, 340*n* with local storage 330, 334, 338. As such, one or more modules of computer program instructions that are executing within the cloud-based storage system 318 (e.g., a monitoring module that is executing on its own EC2 instance) may be designed to handle the failure of one or more of the cloud computing instances 340*a*, 340*b*, 340*n* with local storage 330, 334, 338. In such an example, the monitoring module may handle the failure of one or more of the cloud computing instances 340*a*, 340*b*, 340*n* with local storage 330, 334, 338 by creating one or more new cloud computing instances with local storage, retrieving data that was stored on the failed cloud computing instances 340*a*, 340*b*, 340*n* from the cloud-based object storage 348, and storing the data retrieved from the cloud-based object storage 348 in local storage on the newly created cloud computing instances. Readers will appreciate that many variants of this process may be implemented.

Consider an example in which all cloud computing instances 340*a*, 340*b*, 340*n* with local storage 330, 334, 338 failed. In such an example, the monitoring module may create new cloud computing instances with local storage, where high-bandwidth instances types are selected that allow for the maximum data transfer rates between the newly created high-bandwidth cloud computing instances with local storage and the cloud-based object storage 348. Readers will appreciate that instances types are selected that allow for the maximum data transfer rates between the new cloud computing instances and the cloud-based object storage 348 such that the new high-bandwidth cloud computing instances can be rehydrated with data from the cloud-based object storage 348 as quickly as possible. Once the new high-bandwidth cloud computing instances are rehydrated with data from the cloud-based object storage 348, less expensive lower-bandwidth cloud computing instances may be created, data may be migrated to the less expensive lower-bandwidth cloud computing instances, and the high-bandwidth cloud computing instances may be terminated.

Readers will appreciate that in some embodiments, the number of new cloud computing instances that are created may substantially exceed the number of cloud computing instances that are needed to locally store all of the data stored by the cloud-based storage system 318. The number of new cloud computing instances that are created may substantially exceed the number of cloud computing instances that are needed to locally store all of the data stored by the cloud-based storage system 318 in order to more rapidly pull data from the cloud-based object storage 348 and into the new cloud computing instances, as each new cloud computing instance can (in parallel) retrieve some portion of the data stored by the cloud-based storage system 318. In such embodiments, once the data stored by the cloud-based storage system 318 has been pulled into the newly created cloud computing instances, the data may be consolidated within a subset of the newly created cloud computing instances and those newly created cloud computing instances that are excessive may be terminated.

Consider an example in which 1000 cloud computing instances are needed in order to locally store all valid data that users of the cloud-based storage system 318 have written to the cloud-based storage system 318. In such an example, assume that all 1,000 cloud computing instances fail. In such an example, the monitoring module may cause 100,000 cloud computing instances to be created, where each cloud computing instance is responsible for retrieving, from the cloud-based object storage 348, distinct $1/100,000$th chunks of the valid data that users of the cloud-based storage system 318 have written to the cloud-based storage system 318 and locally storing the distinct chunk of the dataset that it retrieved. In such an example, because each of the 100,000 cloud computing instances can retrieve data from the cloud-based object storage 348 in parallel, the caching layer may be restored 100 times faster as compared to an embodiment where the monitoring module only create 1000 replacement cloud computing instances. In such an example, over time the data that is stored locally in the 100,000 could be consolidated into 1,000 cloud computing instances and the remaining 99,000 cloud computing instances could be terminated.

Readers will appreciate that various performance aspects of the cloud-based storage system 318 may be monitored (e.g., by a monitoring module that is executing in an EC2 instance) such that the cloud-based storage system 318 can be scaled-up or scaled-out as needed. Consider an example in which the monitoring module monitors the performance of the could-based storage system 318 via communications with one or more of the cloud computing instances 320, 322 that each are used to support the execution of a storage controller application 324, 326, via monitoring communications between cloud computing instances 320, 322, 340a, 340b, 340n, via monitoring communications between cloud computing instances 320, 322, 340a, 340b, 340n and the cloud-based object storage 348, or in some other way. In such an example, assume that the monitoring module determines that the cloud computing instances 320, 322 that are used to support the execution of a storage controller application 324, 326 are undersized and not sufficiently servicing the I/O requests that are issued by users of the cloud-based storage system 318. In such an example, the monitoring module may create a new, more powerful cloud computing instance (e.g., a cloud computing instance of a type that includes more processing power, more memory, etc. . . . ) that includes the storage controller application such that the new, more powerful cloud computing instance can begin operating as the primary controller. Likewise, if the monitoring module determines that the cloud computing instances 320, 322 that are used to support the execution of a storage controller application 324, 326 are oversized and that cost savings could be gained by switching to a smaller, less powerful cloud computing instance, the monitoring module may create a new, less powerful (and less expensive) cloud computing instance that includes the storage controller application such that the new, less powerful cloud computing instance can begin operating as the primary controller.

Consider, as an additional example of dynamically sizing the cloud-based storage system 318, an example in which the monitoring module determines that the utilization of the local storage that is collectively provided by the cloud computing instances 340a, 340b, 340n has reached a predetermined utilization threshold (e.g., 95%). In such an example, the monitoring module may create additional cloud computing instances with local storage to expand the pool of local storage that is offered by the cloud computing instances. Alternatively, the monitoring module may create one or more new cloud computing instances that have larger amounts of local storage than the already existing cloud computing instances 340a, 340b, 340n, such that data stored in an already existing cloud computing instance 340a, 340b, 340n can be migrated to the one or more new cloud computing instances and the already existing cloud computing instance 340a, 340b, 340n can be terminated, thereby expanding the pool of local storage that is offered by the cloud computing instances. Likewise, if the pool of local storage that is offered by the cloud computing instances is unnecessarily large, data can be consolidated and some cloud computing instances can be terminated.

Readers will appreciate that the cloud-based storage system 318 may be sized up and down automatically by a monitoring module applying a predetermined set of rules that may be relatively simple of relatively complicated. In fact, the monitoring module may not only take into account the current state of the cloud-based storage system 318, but the monitoring module may also apply predictive policies that are based on, for example, observed behavior (e.g., every night from 10 PM until 6 AM usage of the storage system is relatively light), predetermined fingerprints (e.g., every time a virtual desktop infrastructure adds 100 virtual desktops, the number of IOPS directed to the storage system increase by X), and so on. In such an example, the dynamic scaling of the cloud-based storage system 318 may be based on current performance metrics, predicted workloads, and many other factors, including combinations thereof.

Readers will further appreciate that because the cloud-based storage system 318 may be dynamically scaled, the cloud-based storage system 318 may even operate in a way that is more dynamic. Consider the example of garbage collection. In a traditional storage system, the amount of storage is fixed. As such, at some point the storage system may be forced to perform garbage collection as the amount of available storage has become so constrained that the storage system is on the verge of running out of storage. In contrast, the cloud-based storage system 318 described here can always 'add' additional storage (e.g., by adding more cloud computing instances with local storage). Because the cloud-based storage system 318 described here can always 'add' additional storage, the cloud-based storage system 318 can make more intelligent decisions regarding when to perform garbage collection. For example, the cloud-based storage system 318 may implement a policy that garbage collection only be performed when the number of IOPS being serviced by the cloud-based storage system 318 falls below a certain level. In some embodiments, other system-level functions (e.g., deduplication, compression) may also be turned off and on in response to system load, given that the size of the cloud-based storage system 318 is not constrained in the same way that traditional storage systems are constrained.

Readers will appreciate that embodiments of the present disclosure resolve an issue with block-storage services offered by some cloud computing environments as some cloud computing environments only allow for one cloud computing instance to connect to a block-storage volume at a single time. For example, in Amazon AWS, only a single EC2 instance may be connected to an EBS volume. Through the use of EC2 instances with local storage, embodiments of the present disclosure can offer multi-connect capabilities where multiple EC2 instances can connect to another EC2 instance with local storage ('a drive instance'). In such embodiments, the drive instances may include software executing within the drive instance that allows the drive instance to support I/O directed to a particular volume from each connected EC2 instance. As such, some embodiments of the present disclosure may be embodied as multi-connect block storage services that may not include all of the components depicted in FIG. 3C.

In some embodiments, especially in embodiments where the cloud-based object storage 348 resources are embodied as Amazon S3, the cloud-based storage system 318 may include one or more modules (e.g., a module of computer program instructions executing on an EC2 instance) that are configured to ensure that when the local storage of a particular cloud computing instance is rehydrated with data from S3, the appropriate data is actually in S3. This issue arises largely because S3 implements an eventual consistency model where, when overwriting an existing object, reads of the object will eventually (but not necessarily immediately) become consistent and will eventually (but not necessarily immediately) return the overwritten version of the object. To address this issue, in some embodiments of the present disclosure, objects in S3 are never overwritten. Instead, a traditional 'overwrite' would result in the creation of the new object (that includes the updated version of the data) and the eventual deletion of the old object (that includes the previous version of the data).

In some embodiments of the present disclosure, as part of an attempt to never (or almost never) overwrite an object, when data is written to S3 the resultant object may be tagged with a sequence number. In some embodiments, these sequence numbers may be persisted elsewhere (e.g., in a database) such that at any point in time, the sequence number associated with the most up-to-date version of some piece of data can be known. In such a way, a determination can be made as to whether S3 has the most recent version of some piece of data by merely reading the sequence number associated with an object—and without actually reading the data from S3. The ability to make this determination may be particularly important when a cloud computing instance with local storage crashes, as it would be undesirable to rehydrate the local storage of a replacement cloud computing instance with out-of-date data. In fact, because the cloud-based storage system 318 does not need to access the data to verify its validity, the data can stay encrypted and access charges can be avoided.

The storage systems described above may carry out intelligent data backup techniques through which data stored in the storage system may be copied and stored in a distinct location to avoid data loss in the event of equipment failure or some other form of catastrophe. For example, the storage systems described above may be configured to examine each backup to avoid restoring the storage system to an undesirable state. Consider an example in which malware infects the storage system. In such an example, the storage system may include software resources 314 that can scan each backup to identify backups that were captured before the malware infected the storage system and those backups that were captured after the malware infected the storage system. In such an example, the storage system may restore itself from a backup that does not include the malware—or at least not restore the portions of a backup that contained the malware. In such an example, the storage system may include software resources 314 that can scan each backup to identify the presences of malware (or a virus, or some other undesirable), for example, by identifying write operations that were serviced by the storage system and originated from a network subnet that is suspected to have delivered the malware, by identifying write operations that were serviced by the storage system and originated from a user that is suspected to have delivered the malware, by identifying write operations that were serviced by the storage system and examining the content of the write operation against fingerprints of the malware, and in many other ways.

Readers will further appreciate that the backups (often in the form of one or more snapshots) may also be utilized to perform rapid recovery of the storage system. Consider an example in which the storage system is infected with ransomware that locks users out of the storage system. In such an example, software resources 314 within the storage system may be configured to detect the presence of ransomware and may be further configured to restore the storage system to a point-in-time, using the retained backups, prior to the point-in-time at which the ransomware infected the storage system. In such an example, the presence of ransomware may be explicitly detected through the use of software tools utilized by the system, through the use of a key (e.g., a USB drive) that is inserted into the storage system, or in a similar way. Likewise, the presence of ransomware may be inferred in response to system activity meeting a predetermined fingerprint such as, for example, no reads or writes coming into the system for a predetermined period of time.

Readers will appreciate that the various components depicted in FIG. 3B may be grouped into one or more optimized computing packages as converged infrastructures. Such converged infrastructures may include pools of computers, storage and networking resources that can be shared by multiple applications and managed in a collective manner using policy-driven processes. Such converged infrastructures may minimize compatibility issues between various components within the storage system 306 while also reducing various costs associated with the establishment and operation of the storage system 306. Such converged infrastructures may be implemented with a converged infrastructure reference architecture, with standalone appliances, with a software driven hyper-converged approach (e.g., hyper-converged infrastructures), or in other ways.

Readers will appreciate that the storage system 306 depicted in FIG. 3B may be useful for supporting various types of software applications. For example, the storage system 306 may be useful in supporting artificial intelligence ('AI') applications, database applications, DevOps projects, electronic design automation tools, event-driven software applications, high performance computing applications, simulation applications, high-speed data capture and analysis applications, machine learning applications, media production applications, media serving applications, picture archiving and communication systems ('PACS') applications, software development applications, virtual reality applications, augmented reality applications, and many other types of applications by providing storage resources to such applications.

The storage systems described above may operate to support a wide variety of applications. In view of the fact that the storage systems include compute resources, storage resources, and a wide variety of other resources, the storage systems may be well suited to support applications that are resource intensive such as, for example, AI applications. Such A applications may enable devices to perceive their environment and take actions that maximize their chance of success at some goal. Examples of such A applications can include IBM Watson, Microsoft Oxford, Google DeepMind, Baidu Minwa, and others. The storage systems described above may also be well suited to support other types of applications that are resource intensive such as, for example, machine learning applications. Machine learning applications may perform various types of data analysis to automate analytical model building. Using algorithms that iteratively learn from data, machine learning applications can enable computers to learn without being explicitly programmed. One particular area of machine learning is referred to as reinforcement learning, which involves taking suitable actions to maximize reward in a particular situation. Reinforcement learning may be employed to find the best possible behavior or path that a particular software application or machine should take in a specific situation. Reinforcement learning differs from other areas of machine learning (e.g., supervised learning, unsupervised learning) in that correct input/output pairs need not be presented for reinforcement learning and sub-optimal actions need not be explicitly corrected.

In addition to the resources already described, the storage systems described above may also include graphics processing units ('GPUs'), occasionally referred to as visual processing unit ('VPUs'). Such GPUs may be embodied as specialized electronic circuits that rapidly manipulate and alter memory to accelerate the creation of images in a frame buffer intended for output to a display device. Such GPUs may be included within any of the computing devices that are part of the storage systems described above, including as one of many individually scalable components of a storage system, where other examples of individually scalable components of such storage system can include storage components, memory components, compute components (e.g., CPUs, FPGAs, ASICs), networking components, software components, and others. In addition to GPUs, the storage systems described above may also include neural network processors ('NNPs') for use in various aspects of neural network processing. Such NNPs may be used in place of (or in addition to) GPUs and may be also be independently scalable.

As described above, the storage systems described herein may be configured to support artificial intelligence applications, machine learning applications, big data analytics applications, and many other types of applications. The rapid growth in these sort of applications is being driven by three technologies: deep learning (DL), GPU processors, and Big Data. Deep learning is a computing model that makes use of massively parallel neural networks inspired by the human brain. Instead of experts handcrafting software, a deep learning model writes its own software by learning from lots of examples. A GPU is a modern processor with thousands of cores, well-suited to run algorithms that loosely represent the parallel nature of the human brain.

Advances in deep neural networks have ignited a new wave of algorithms and tools for data scientists to tap into their data with artificial intelligence (AI). With improved algorithms, larger data sets, and various frameworks (including open-source software libraries for machine learning across a range of tasks), data scientists are tackling new use cases like autonomous driving vehicles, natural language processing and understanding, computer vision, machine reasoning, strong AI, and many others. Applications of such techniques may include: machine and vehicular object detection, identification and avoidance; visual recognition, classification and tagging; algorithmic financial trading strategy performance management; simultaneous localization and mapping; predictive maintenance of high-value machinery; prevention against cyber security threats, expertise automation; image recognition and classification; question answering; robotics; text analytics (extraction, classification) and text generation and translation; and many others. Applications of AI techniques has materialized in a wide array of products include, for example, Amazon Echo's speech recognition technology that allows users to talk to their machines, Google Translate™ which allows for machine-based language translation, Spotify's Discover Weekly that provides recommendations on new songs and artists that a user may like based on the user's usage and traffic analysis, Quill's text generation offering that takes structured data and turns it into narrative stories, Chatbots that provide real-time, contextually specific answers to questions in a dialog format, and many others. Furthermore, AI may impact a wide variety of industries and sectors. For example, A solutions may be used in healthcare to take clinical notes, patient files, research data, and other inputs to generate potential treatment options for doctors to explore. Likewise, AI solutions may be used by retailers to personalize consumer recommendations based on a person's digital footprint of behaviors, profile data, or other data.

Training deep neural networks, however, requires both high quality input data and large amounts of computation. GPUs are massively parallel processors capable of operating on large amounts of data simultaneously. When combined into a multi-GPU cluster, a high throughput pipeline may be required to feed input data from storage to the compute engines. Deep learning is more than just constructing and training models. There also exists an entire data pipeline that must be designed for the scale, iteration, and experimentation necessary for a data science team to succeed.

Data is the heart of modern A and deep learning algorithms. Before training can begin, one problem that must be addressed revolves around collecting the labeled data that is crucial for training an accurate AI model. A full scale A deployment may be required to continuously collect, clean, transform, label, and store large amounts of data. Adding additional high quality data points directly translates to more accurate models and better insights. Data samples may undergo a series of processing steps including, but not limited to: 1) ingesting the data from an external source into the training system and storing the data in raw form, 2) cleaning and transforming the data in a format convenient for training, including linking data samples to the appropriate label, 3) exploring parameters and models, quickly testing with a smaller dataset, and iterating to converge on the most promising models to push into the production cluster, 4) executing training phases to select random batches of input data, including both new and older samples, and feeding those into production GPU servers for computation to update model parameters, and 5) evaluating including using a holdback portion of the data not used in training in order to evaluate model accuracy on the holdout data. This lifecycle may apply for any type of parallelized machine learning, not just neural networks or deep learning. For example, standard machine learning frameworks may rely on CPUs instead of GPUs but the data ingest and training workflows may be the same. Readers will appreciate that a single shared storage data hub creates a coordination point throughout the lifecycle without the need for extra data copies among the ingest, preprocessing, and training stages. Rarely is the ingested data used for only one purpose, and shared storage gives the flexibility to train multiple different models or apply traditional analytics to the data.

Readers will appreciate that each stage in the AI data pipeline may have varying requirements from the data hub (e.g., the storage system or collection of storage systems). Scale-out storage systems must deliver uncompromising performance for all manner of access types and patterns—from small, metadata-heavy to large files, from random to sequential access patterns, and from low to high concurrency. The storage systems described above may serve as an ideal AI data hub as the systems may service unstructured workloads. In the first stage, data is ideally ingested and stored on to the same data hub that following stages will use, in order to avoid excess data copying. The next two steps can be done on a standard compute server that optionally includes a GPU, and then in the fourth and last stage, full training production jobs are run on powerful GPU-accelerated servers. Often, there is a production pipeline alongside an experimental pipeline operating on the same dataset. Further, the GPU-accelerated servers can be used independently for different models or joined together to train on one larger model, even spanning multiple systems for distributed training. If the shared storage tier is slow, then data must be copied to local storage for each phase, resulting in wasted time staging data onto different servers. The ideal data hub for the A training pipeline delivers performance similar to data stored locally on the server node while also having the simplicity and performance to enable all pipeline stages to operate concurrently.

A data scientist works to improve the usefulness of the trained model through a wide variety of approaches: more data, better data, smarter training, and deeper models. In many cases, there will be teams of data scientists sharing the same datasets and working in parallel to produce new and improved training models. Often, there is a team of data scientists working within these phases concurrently on the same shared datasets. Multiple, concurrent workloads of data processing, experimentation, and full-scale training layer the demands of multiple access patterns on the storage tier. In other words, storage cannot just satisfy large file reads, but must contend with a mix of large and small file reads and writes. Finally, with multiple data scientists exploring datasets and models, it may be critical to store data in its native format to provide flexibility for each user to transform, clean, and use the data in a unique way. The storage systems described above may provide a natural shared storage home for the dataset, with data protection redundancy (e.g., by using RAID6) and the performance necessary to be a common access point for multiple developers and multiple experiments. Using the storage systems described above may avoid the need to carefully copy subsets of the data for local work, saving both engineering and GPU-accelerated servers use time. These copies become a constant and growing tax as the raw data set and desired transformations constantly update and change.

Readers will appreciate that a fundamental reason why deep learning has seen a surge in success is the continued improvement of models with larger data set sizes. In contrast, classical machine learning algorithms, like logistic regression, stop improving in accuracy at smaller data set sizes. As such, the separation of compute resources and storage resources may also allow independent scaling of each tier, avoiding many of the complexities inherent in managing both together. As the data set size grows or new data sets are considered, a scale out storage system must be able to expand easily. Similarly, if more concurrent training is required, additional GPUs or other compute resources can be added without concern for their internal storage.

Small file performance of the storage tier may be critical as many types of inputs, including text, audio, or images will be natively stored as small files. If the storage tier does not handle small files well, an extra step will be required to pre-process and group samples into larger files. Storage, built on top of spinning disks, that relies on SSD as a caching tier, may fall short of the performance needed. Because training with random input batches results in more accurate models, the entire data set must be accessible with full performance. SSD caches only provide high performance for a small subset of the data and will be ineffective at hiding the latency of spinning drives.

Although the preceding paragraphs discuss deep learning applications, readers will appreciate that the storage systems described herein may also be part of a distributed deep learning ('DDL') platform to support the execution of DDL algorithms. The storage systems described above may also be paired with other technologies such as TensorFlow, an open-source software library for dataflow programming across a range of tasks that may be used for machine learning applications such as neural networks, to facilitate the development of such machine learning models, applications, and so on.

The storage systems described above may also be used in a neuromorphic computing environment. Neuromorphic computing is a form of computing that mimics brain cells. To support neuromorphic computing, an architecture of interconnected "neurons" replace traditional computing models with low-powered signals that go directly between neurons for more efficient computation. Neuromorphic computing may make use of very-large-scale integration (VLSI) systems containing electronic analog circuits to mimic neuro-biological architectures present in the nervous system, as well as analog, digital, mixed-mode analog/digital VLSI, and software systems that implement models of neural systems for perception, motor control, or multisensory integration.

Readers will appreciate that the storage systems described above may be configured to support the storage or use of (among other types of data) blockchains. In addition to supporting the storage and use of blockchain technologies, the storage systems described above may also support the storage and use of derivative items such as, for example, open source blockchains and related tools that are part of the IBM™ Hyperledger project, permissioned blockchains in which a certain number of trusted parties are allowed to access the block chain, blockchain products that enable developers to build their own distributed ledger projects, and others. Blockchains and the storage systems described herein may be leveraged to support on-chain storage of data as well as off-chain storage of data.

Off-chain storage of data can be implemented in a variety of ways and can occur when the data itself is not stored within the blockchain. For example, in one embodiment, a hash function may be utilized and the data itself may be fed into the hash function to generate a hash value. In such an example, the hashes of large pieces of data may be embedded within transactions, instead of the data itself. Readers will appreciate that, in other embodiments, alternatives to blockchains may be used to facilitate the decentralized storage of information. For example, one alternative to a blockchain that may be used is a blockweave. While conventional blockchains store every transaction to achieve validation, a blockweave permits secure decentralization without the usage of the entire chain, thereby enabling low cost on-chain storage of data. Such blockweaves may utilize a consensus mechanism that is based on proof of access (PoA) and proof of work (PoW). While typical PoW systems only depend on the previous block in order to generate each successive block, the PoA algorithm may incorporate data from a randomly chosen previous block. Combined with the blockweave data structure, miners do not need to store all blocks (forming a blockchain), but rather can store any previous blocks forming a weave of blocks (a blockweave). This enables increased levels of scalability, speed and low-cost and reduces the cost of data storage in part because miners need not store all blocks, thereby resulting in a substantial reduction in the amount of electricity that is consumed during the mining process because, as the network expands, electricity consumption decreases because a blockweave demands less and less hashing power for consensus as data is added to the system. Furthermore, blockweaves may be deployed on a decentralized storage network in which incentives are created to encourage rapid data sharing. Such decentralized storage networks may also make use of blockshadowing techniques, where nodes only send a minimal block "shadow" to other nodes that allows peers to reconstruct a full block, instead of transmitting the full block itself.

The storage systems described above may, either alone or in combination with other computing devices, be used to support in-memory computing applications. In-memory computing involves the storage of information in RAM that is distributed across a cluster of computers. Readers will appreciate that the storage systems described above, especially those that are configurable with customizable amounts of processing resources, storage resources, and memory resources (e.g., those systems in which blades that contain configurable amounts of each type of resource), may be configured in a way so as to provide an infrastructure that can support in-memory computing. Likewise, the storage systems described above may include component parts (e.g., NVDIMMs, 3D crosspoint storage that provide fast random access memory that is persistent) that can actually provide for an improved in-memory computing environment as compared to in-memory computing environments that rely on RAM distributed across dedicated servers.

In some embodiments, the storage systems described above may be configured to operate as a hybrid in-memory computing environment that includes a universal interface to all storage media (e.g., RAM, flash storage, 3D crosspoint storage). In such embodiments, users may have no knowledge regarding the details of where their data is stored but they can still use the same full, unified API to address data. In such embodiments, the storage system may (in the background) move data to the fastest layer available—including intelligently placing the data in dependence upon various characteristics of the data or in dependence upon some other heuristic. In such an example, the storage systems may even make use of existing products such as Apache Ignite and GridGain to move data between the various storage layers, or the storage systems may make use of custom software to move data between the various storage layers. The storage systems described herein may implement various optimizations to improve the performance of in-memory computing such as, for example, having computations occur as close to the data as possible.

Readers will further appreciate that in some embodiments, the storage systems described above may be paired with other resources to support the applications described above. For example, one infrastructure could include primary compute in the form of servers and workstations which specialize in using General-purpose computing on graphics processing units ('GPGPU') to accelerate deep learning applications that are interconnected into a computation engine to train parameters for deep neural networks. Each system may have Ethernet external connectivity, InfiniBand external connectivity, some other form of external connectivity, or some combination thereof. In such an example, the GPUs can be grouped for a single large training or used independently to train multiple models. The infrastructure could also include a storage system such as those described above to provide, for example, a scale-out all-flash file or object store through which data can be accessed via high-performance protocols such as NFS, S3, and so on. The infrastructure can also include, for example, redundant top-of-rack Ethernet switches connected to storage and compute via ports in MLAG port channels for redundancy. The infrastructure could also include additional compute in the form of whitebox servers, optionally with GPUs, for data ingestion, pre-processing, and model debugging. Readers will appreciate that additional infrastructures are also possible.

Readers will appreciate that the systems described above may be better suited for the applications described above relative to other systems that may include, for example, a distributed direct-attached storage (DDAS) solution deployed in server nodes. Such DDAS solutions may be built for handling large, less sequential accesses but may be less able to handle small, random accesses. Readers will further appreciate that the storage systems described above may be utilized to provide a platform for the applications described above that is preferable to the utilization of cloud-based resources as the storage systems may be included in an on-site or in-house infrastructure that is more secure, more locally and internally managed, more robust in feature sets and performance, or otherwise preferable to the utilization of cloud-based resources as part of a platform to support the applications described above. For example, services built on platforms such as IBM's Watson may require a business enterprise to distribute individual user information, such as financial transaction information or identifiable patient records, to other institutions. As such, cloud-based offerings of AI as a service may be less desirable than internally managed and offered AI as a service that is supported by storage systems such as the storage systems described above, for a wide array of technical reasons as well as for various business reasons.

Readers will appreciate that the storage systems described above, either alone or in coordination with other computing machinery may be configured to support other AI related tools. For example, the storage systems may make use of tools like ONXX or other open neural network exchange formats that make it easier to transfer models written in different A frameworks. Likewise, the storage systems may be configured to support tools like Amazon's Gluon that allow developers to prototype, build, and train deep learning models. In fact, the storage systems described above may be part of a larger platform, such as IBM™ Cloud Private for Data, that includes integrated data science, data engineering and application building services. Such platforms may seamlessly collect, organize, secure, and analyze data across an enterprise, as well as simplify hybrid data management, unified data governance and integration, data science and business analytics with a single solution.

Readers will further appreciate that the storage systems described above may also be deployed as an edge solution. Such an edge solution may be in place to optimize cloud computing systems by performing data processing at the edge of the network, near the source of the data. Edge computing can push applications, data and computing power (i.e., services) away from centralized points to the logical extremes of a network. Through the use of edge solutions such as the storage systems described above, computational tasks may be performed using the compute resources provided by such storage systems, data may be storage using the storage resources of the storage system, and cloud-based services may be accessed through the use of various resources of the storage system (including networking resources). By performing computational tasks on the edge solution, storing data on the edge solution, and generally making use of the edge solution, the consumption of expensive cloud-based resources may be avoided and, in fact, performance improvements may be experienced relative to a heavier reliance on cloud-based resources.

While many tasks may benefit from the utilization of an edge solution, some particular uses may be especially suited for deployment in such an environment. For example, devices like drones, autonomous cars, robots, and others may require extremely rapid processing so fast, in fact, that sending data up to a cloud environment and back to receive data processing support may simply be too slow. Likewise, machines like locomotives and gas turbines that generate large amounts of information through the use of a wide array of data-generating sensors may benefit from the rapid data processing capabilities of an edge solution. As an additional example, some IoT devices such as connected video cameras may not be well-suited for the utilization of cloud-based resources as it may be impractical (not only from a privacy perspective, security perspective, or a financial perspective) to send the data to the cloud simply because of the pure volume of data that is involved. As such, many tasks that really on data processing, storage, or communications may be better suited by platforms that include edge solutions such as the storage systems described above.

The storage systems described above may alone, or in combination with other computing resources, serves as a network edge platform that combines compute resources, storage resources, networking resources, cloud technologies and network virtualization technologies, and so on. As part of the network, the edge may take on characteristics similar to other network facilities, from the customer premise and backhaul aggregation facilities to Points of Presence (PoPs) and regional data centers. Readers will appreciate that network workloads, such as Virtual Network Functions (VNFs) and others, will reside on the network edge platform. Enabled by a combination of containers and virtual machines, the network edge platform may rely on controllers and schedulers that are no longer geographically co-located with the data processing resources. The functions, as microservices, may split into control planes, user and data planes, or even state machines, allowing for independent optimization and scaling techniques to be applied. Such user and data planes may be enabled through increased accelerators, both those residing in server platforms, such as FPGAs and Smart NICs, and through SDN-enabled merchant silicon and programmable ASICs.

The storage systems described above may also be optimized for use in big data analytics. Big data analytics may be generally described as the process of examining large and varied data sets to uncover hidden patterns, unknown correlations, market trends, customer preferences and other useful information that can help organizations make more-informed business decisions. Big data analytics applications enable data scientists, predictive modelers, statisticians and other analytics professionals to analyze growing volumes of structured transaction data, plus other forms of data that are often left untapped by conventional business intelligence (BI) and analytics programs. As part of that process, semi-structured and unstructured data such as, for example, internet clickstream data, web server logs, social media content, text from customer emails and survey responses, mobile-phone call-detail records, IoT sensor data, and other data may be converted to a structured form. Big data analytics is a form of advanced analytics, which involves complex applications with elements such as predictive models, statistical algorithms and what-if analyses powered by high-performance analytics systems.

The storage systems described above may also support (including implementing as a system interface) applications that perform tasks in response to human speech. For example, the storage systems may support the execution intelligent personal assistant applications such as, for example, Amazon's Alexa, Apple Siri, Google Voice, Samsung Bixby, Microsoft Cortana, and others. While the examples described in the previous sentence make use of voice as input, the storage systems described above may also support chatbots, talkbots, chatterbots, or artificial conversational entities or other applications that are configured to conduct a conversation via auditory or textual methods. Likewise, the storage system may actually execute such an application to enable a user such as a system administrator to interact with the storage system via speech. Such applications are generally capable of voice interaction, music playback, making to-do lists, setting alarms, streaming podcasts, playing audiobooks, and providing weather, traffic, and other real time information, such as news, although in embodiments in accordance with the present disclosure, such applications may be utilized as interfaces to various system management operations.

The storage systems described above may also implement AI platforms for delivering on the vision of self-driving storage. Such A platforms may be configured to deliver global predictive intelligence by collecting and analyzing large amounts of storage system telemetry data points to enable effortless management, analytics and support. In fact, such storage systems may be capable of predicting both capacity and performance, as well as generating intelligent advice on workload deployment, interaction and optimization. Such AI platforms may be configured to scan all incoming storage system telemetry data against a library of issue fingerprints to predict and resolve incidents in real-time, before they impact customer environments, and captures hundreds of variables related to performance that are used to forecast performance load.

The storage systems described above may support the serialized or simultaneous execution of artificial intelligence applications, machine learning applications, data analytics applications, data transformations, and other tasks that collectively may form an AI ladder. Such an AI ladder may effectively be formed by combining such elements to form a complete data science pipeline, where exist dependencies between elements of the AI ladder. For example, AI may require that some form of machine learning has taken place, machine learning may require that some form of analytics has taken place, analytics may require that some form of data and information architecting has taken place, and so on. As such, each element may be viewed as a rung in an A ladder that collectively can form a complete and sophisticated A solution.

The storage systems described above may also, either alone or in combination with other computing environments, be used to deliver an A everywhere experience where A permeates wide and expansive aspects of business and life. For example, AI may play an important role in the delivery of deep learning solutions, deep reinforcement learning solutions, artificial general intelligence solutions, autonomous vehicles, cognitive computing solutions, commercial UAVs or drones, conversational user interfaces, enterprise taxonomies, ontology management solutions, machine learning solutions, smart dust, smart robots, smart workplaces, and many others. The storage systems described above may also, either alone or in combination with other computing environments, be used to deliver a wide range of transparently immersive experiences where technology can introduce transparency between people, businesses, and things. Such transparently immersive experiences may be delivered as augmented reality technologies, connected homes, virtual reality technologies, brain-computer interfaces, human augmentation technologies, nanotube electronics, volumetric displays, 4D printing technologies, or others. The storage systems described above may also, either alone or in combination with other computing environments, be used to support a wide variety of digital platforms. Such digital platforms can include, for example, 5G wireless systems and platforms, digital twin platforms, edge computing platforms, IoT platforms, quantum computing platforms, serverless PaaS, software-defined security, neuromorphic computing platforms, and so on.

Readers will appreciate that some transparently immersive experiences may involve the use of digital twins of various "things" such as people, places, processes, systems, and so on. Such digital twins and other immersive technologies can alter the way that humans interact with technology, as conversational platforms, augmented reality, virtual reality and mixed reality provide a more natural and immersive interaction with the digital world. In fact, digital twins may be linked with the real-world, perhaps even in real-time, to understand the state of a thing or system, respond to changes, and so on. Because digital twins consolidate massive amounts of information on individual assets and groups of assets (even possibly providing control of those assets), digital twins may communicate with each other to digital factory models of multiple linked digital twins.

The storage systems described above may also be part of a multi-cloud environment in which multiple cloud computing and storage services are deployed in a single heterogeneous architecture. In order to facilitate the operation of such a multi-cloud environment, DevOps tools may be deployed to enable orchestration across clouds. Likewise, continuous development and continuous integration tools may be deployed to standardize processes around continuous integration and delivery, new feature rollout and provisioning cloud workloads. By standardizing these processes, a multi-cloud strategy may be implemented that enables the utilization of the best provider for each workload. Furthermore, application monitoring and visibility tools may be deployed to move application workloads around different clouds, identify performance issues, and perform other tasks. In addition, security and compliance tools may be deployed for to ensure compliance with security requirements, government regulations, and so on. Such a multi-cloud environment may also include tools for application delivery and smart workload management to ensure efficient application delivery and help direct workloads across the distributed and heterogeneous infrastructure, as well as tools that ease the deployment and maintenance of packaged and custom applications in the cloud and enable portability amongst clouds. The multi-cloud environment may similarly include tools for data portability.

The storage systems described above may be used as a part of a platform to enable the use of crypto-anchors that may be used to authenticate a product's origins and contents to ensure that it matches a blockchain record associated with the product. Such crypto-anchors may take many forms including, for example, as edible ink, as a mobile sensor, as a microchip, and others. Similarly, as part of a suite of tools to secure data stored on the storage system, the storage systems described above may implement various encryption technologies and schemes, including lattice cryptography. Lattice cryptography can involve constructions of cryptographic primitives that involve lattices, either in the construction itself or in the security proof. Unlike public-key schemes such as the RSA, Diffie-Hellman or Elliptic-Curve cryptosystems, which are easily attacked by a quantum computer, some lattice-based constructions appear to be resistant to attack by both classical and quantum computers.

A quantum computer is a device that performs quantum computing. Quantum computing is computing using quantum-mechanical phenomena, such as superposition and entanglement. Quantum computers differ from traditional computers that are based on transistors, as such traditional computers require that data be encoded into binary digits (bits), each of which is always in one of two definite states (0 or 1). In contrast to traditional computers, quantum computers use quantum bits, which can be in superpositions of states. A quantum computer maintains a sequence of qubits, where a single qubit can represent a one, a zero, or any quantum superposition of those two qubit states. A pair of qubits can be in any quantum superposition of 4 states, and three qubits in any superposition of 8 states. A quantum computer with n qubits can generally be in an arbitrary superposition of up to $2^n$ different states simultaneously, whereas a traditional computer can only be in one of these states at any one time. A quantum Turing machine is a theoretical model of such a computer.

The storage systems described above may also be paired with FPGA-accelerated servers as part of a larger A or ML infrastructure. Such FPGA-accelerated servers may reside near (e.g., in the same data center) the storage systems described above or even incorporated into an appliance that includes one or more storage systems, one or more FPGA-accelerated servers, networking infrastructure that supports communications between the one or more storage systems and the one or more FPGA-accelerated servers, as well as other hardware and software components. Alternatively, FPGA-accelerated servers may reside within a cloud computing environment that may be used to perform compute-related tasks for Aland ML jobs. Any of the embodiments described above may be used to collectively serve as a FPGA-based AI or ML platform. Readers will appreciate that, in some embodiments of the FPGA-based AI or ML platform, the FPGAs that are contained within the FPGA-accelerated servers may be reconfigured for different types of ML models (e.g., LSTMs, CNNs, GRUs). The ability to reconfigure the FPGAs that are contained within the FPGA-accelerated servers may enable the acceleration of a ML or AI application based on the most optimal numerical precision and memory model being used. Readers will appreciate that by treating the collection of FPGA-accelerated servers as a pool of FPGAs, any CPU in the data center may utilize the pool of FPGAs as a shared hardware microservice, rather than limiting a server to dedicated accelerators plugged into it.

The FPGA-accelerated servers and the GPU-accelerated servers described above may implement a model of computing where, rather than keeping a small amount of data in a CPU and running a long stream of instructions over it as occurred in more traditional computing models, the machine learning model and parameters are pinned into the high-bandwidth on-chip memory with lots of data streaming though the high-bandwidth on-chip memory. FPGAs may even be more efficient than GPUs for this computing model, as the FPGAs can be programmed with only the instructions needed to run this kind of computing model.

The storage systems described above may be configured to provide parallel storage, for example, through the use of a parallel file system such as BeeGFS. Such parallel files systems may include a distributed metadata architecture. For example, the parallel file system may include a plurality of metadata servers across which metadata is distributed, as well as components that include services for clients and storage servers. Through the use of a parallel file system, file contents may be distributed over a plurality of storage servers using striping and metadata may be distributed over a plurality of metadata servers on a directory level, with each server storing a part of the complete file system tree. Readers will appreciate that in some embodiments, the storage servers and metadata servers may run in userspace on top of an existing local file system. Furthermore, dedicated hardware is not required for client services, the metadata servers, or the hardware servers as metadata servers, storage servers, and even the client services may be run on the same machines.

The systems described above can support the execution of a wide array of software applications. Such software applications can be deployed in a variety of ways, including container-based deployment models. Containerized applications may be managed using a variety of tools. For example, containerized applications may be managed using Docker Swarm, a clustering and scheduling tool for Docker containers that enables IT administrators and developers to establish and manage a cluster of Docker nodes as a single virtual system. Likewise, containerized applications may be managed through the use of Kubernetes, a container-orchestration system for automating deployment, scaling and management of containerized applications. Kubernetes may execute on top of operating systems such as, for example, Red Hat Enterprise Linux, Ubuntu Server, SUSE Linux Enterprise Servers, and others. In such examples, a master node may assign tasks to worker/minion nodes. Kubernetes can include a set of components (e.g., kubelet, kube-proxy, cAdvisor) that manage individual nodes as a well as a set of components (e.g., etd, API server, Scheduler, Control Manager) that form a control plane. Various controllers (e.g., Replication Controller, DaemonSet Controller) can drive the state of a Kubernetes cluster by managing a set of pods that includes one or more containers that are deployed on a single node. Containerized applications may be used to facilitate a serverless, cloud native computing deployment and management model for software applications. In support of a serverless, cloud native computing deployment and management model for software applications, containers may be used as part of an event handling mechanisms (e.g., AWS Lambdas) such that various events cause a containerized application to be spun up to operate as an event handler.

The systems described above may be deployed in a variety of ways, including being deployed in ways that support fifth generation ('5G') networks. 5G networks may support substantially faster data communications than previous generations of mobile communications networks and, as a consequence may lead to the disaggregation of data and computing resources as modern massive data centers may become less prominent and may be replaced, for example, by more-local, micro data centers that are close to the mobile-network towers. The systems described above may be included in such local, micro data centers and may be part of or paired to multi-access edge computing ('MEC') systems. Such MEC systems may enable cloud computing capabilities and an IT service environment at the edge of the cellular network. By running applications and performing related processing tasks closer to the cellular customer, network congestion may be reduced and applications may perform better. MEC technology is designed to be implemented at the cellular base stations or other edge nodes, and enables flexible and rapid deployment of new applications and services for customers. MEC may also allow cellular operators to open their radio access network ('RAN') to authorized third-parties, such as application developers and content provider. Furthermore, edge computing and micro data centers may substantially reduce the cost of smartphones that work with the 5G network because customer may not need devices with such intensive processing power and the expensive requisite components.

Readers will appreciate that 5G networks may generate more data than previous network generations, especially in view of the fact that the high network bandwidth offered by 5G networks may cause the 5G networks to handle amounts and types of data (e.g., sensor data from self-driving cars, data generated by AR/VR technologies) that weren't as feasible for previous generation networks. In such examples, the scalability offered by the systems described above may be very valuable as the amount of data increases, adoption of emerging technologies increase, and so on.

Figure 3D:
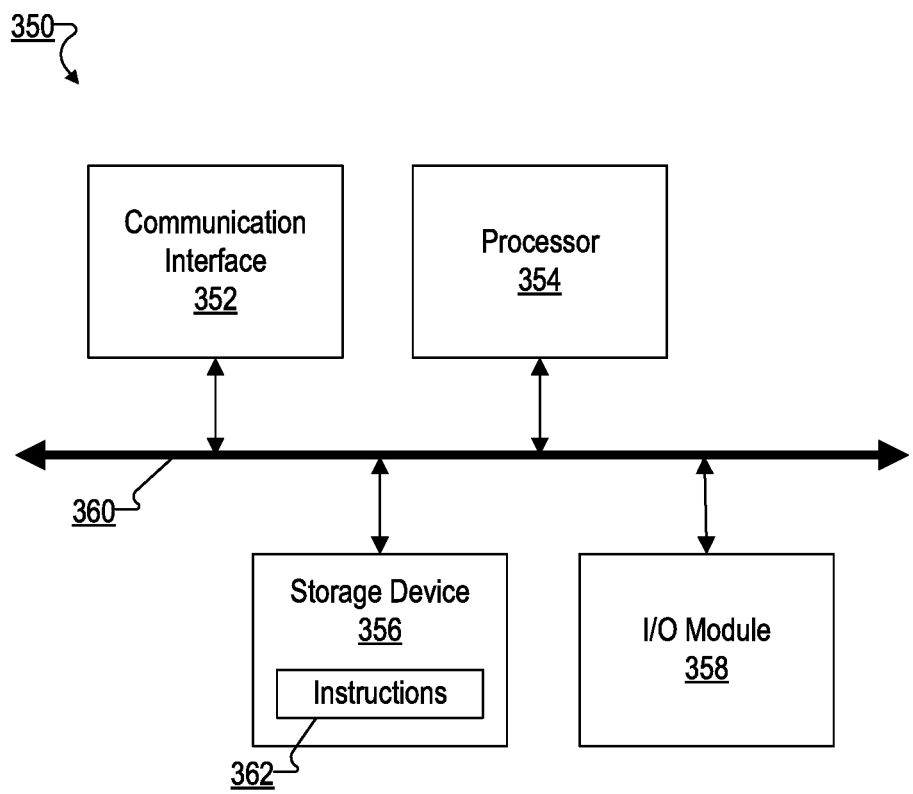
FIG. 3D illustrates an exemplary computing device that may be specifically configured to perform one or more of the processes described herein.

For further explanation, FIG. 3D illustrates an exemplary computing device 350 that may be specifically configured to perform one or more of the processes described herein. As shown in FIG. 3D, computing device 350 may include a communication interface 352, a processor 354, a storage device 356, and an input/output ("I/O") module 358 communicatively connected one to another via a communication infrastructure 360. While an exemplary computing device 350 is shown in FIG. 3D, the components illustrated in FIG. 3D are not intended to be limiting. Additional or alternative components may be used in other embodiments. Components of computing device 350 shown in FIG. 3D will now be described in additional detail.

Communication interface 352 may be configured to communicate with one or more computing devices. Examples of communication interface 352 include, without limitation, a wired network interface (such as a network interface card), a wireless network interface (such as a wireless network interface card), a modem, an audio/video connection, and any other suitable interface.

Processor 354 generally represents any type or form of processing unit capable of processing data and/or interpreting, executing, and/or directing execution of one or more of the instructions, processes, and/or operations described herein. Processor 354 may perform operations by executing computer-executable instructions 362 (e.g., an application, software, code, and/or other executable data instance) stored in storage device 356.

Storage device 356 may include one or more data storage media, devices, or configurations and may employ any type, form, and combination of data storage media and/or device. For example, storage device 356 may include, but is not limited to, any combination of the non-volatile media and/or volatile media described herein. Electronic data, including data described herein, may be temporarily and/or permanently stored in storage device 356. For example, data representative of computer-executable instructions 362 configured to direct processor 354 to perform any of the operations described herein may be stored within storage device 356. In some examples, data may be arranged in one or more databases residing within storage device 356.

I/O module 358 may include one or more I/O modules configured to receive user input and provide user output. I/O module 358 may include any hardware, firmware, software, or combination thereof supportive of input and output capabilities. For example, I/O module 358 may include hardware and/or software for capturing user input, including, but not limited to, a keyboard or keypad, a touchscreen component (e.g., touchscreen display), a receiver (e.g., an RF or infrared receiver), motion sensors, and/or one or more input buttons.

I/O module 358 may include one or more devices for presenting output to a user, including, but not limited to, a graphics engine, a display (e.g., a display screen), one or more output drivers (e.g., display drivers), one or more audio speakers, and one or more audio drivers. In certain embodiments, I/O module 358 is configured to provide graphical data to a display for presentation to a user. The graphical data may be representative of one or more graphical user interfaces and/or any other graphical content as may serve a particular implementation. In some examples, any of the systems, computing devices, and/or other components described herein may be implemented by computing device 350.

Figure 4:
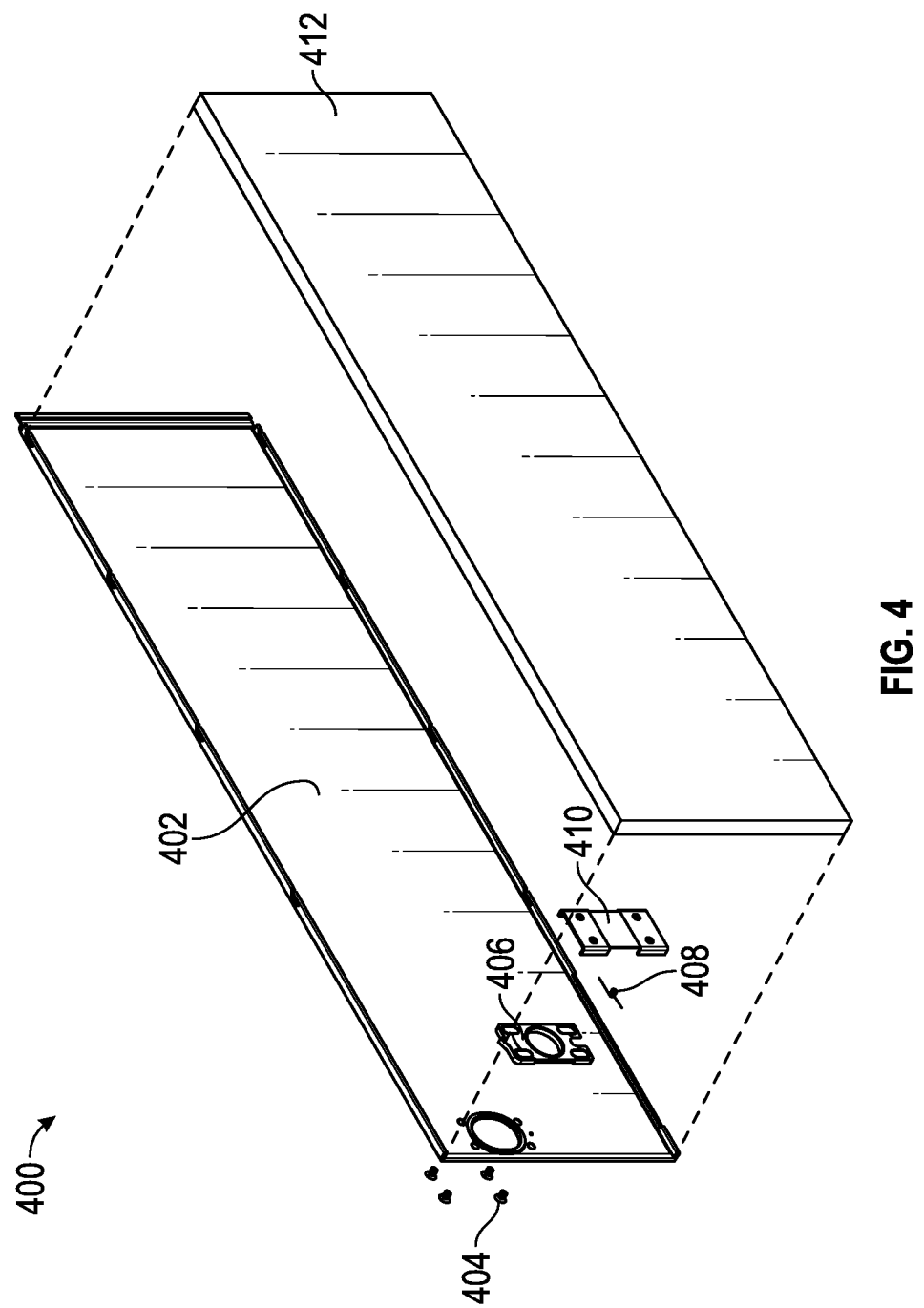
FIG. 4 is an illustration of an example of a storage system enclosure including a low profile latching mechanism in accordance with embodiments of the disclosure.

FIG. 4 is an illustration of an example of a storage system enclosure 400 including a low profile latching mechanism in accordance with embodiments of the disclosure. Components of the storage system enclosure 400 are shown for illustrative purposes and the present disclosure is not limited to the illustrated embodiments. In embodiments, the storage system enclosure 400 may be utilized by the storage systems described at FIGS. 1A-3D. For example, the storage system enclosure 400 may be used as a blade server housing.

The storage system enclosure 400 includes a cover 402 and a base 412 to protect components within the storage system enclosure 400. As previously described, the cover 402 may be removable from the base 412 to allow access to the components within the storage system enclosure 400. In embodiments, the cover 402 and/or base 412 may be formed from a metal or metallic alloy material.

A latching mechanism may be coupled to the cover 402. The latching mechanism may include a latch housing 410, a mechanical energy storage component 408 and a latch 406. In embodiments, the mechanical energy storage component 408 may be a torsion spring or a leaf spring. In some embodiments, the mechanical energy storage component 408 may be an integrated feature of latch 406. For example, the mechanical energy storage component 408 may be a torsion spring that is formed as an integrated feature of the latch 406. In an embodiment, the mechanical energy storage component 408 may be an extension or compression spring. In embodiments, the mechanical energy storage component 408 may be any component configured to absorb and provide mechanical energy to latch 406 of the latching mechanism. In some embodiments, multiple mechanical energy storage components 408 may be used.

In embodiments, the storage system enclosure 400 includes couplings 404 to couple the latching mechanism to the cover 402. In embodiments, the couplings 404 may be threaded couplings, such as screws or bolts. In some embodiments, other types of couplings may be used, such as magnets, rivets, adhesives, or the like, to couple the latching mechanism to cover 402. The components of the storage system enclosure 400 are discussed in additional detail below.

Figure 5B:
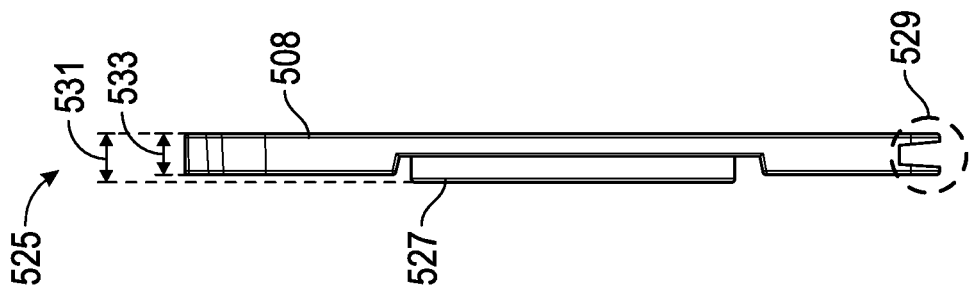
FIG. 5B is a side-profile view of an example of a latch of a low profile latching mechanism, in accordance with embodiments of the disclosure.
Figure 5A:
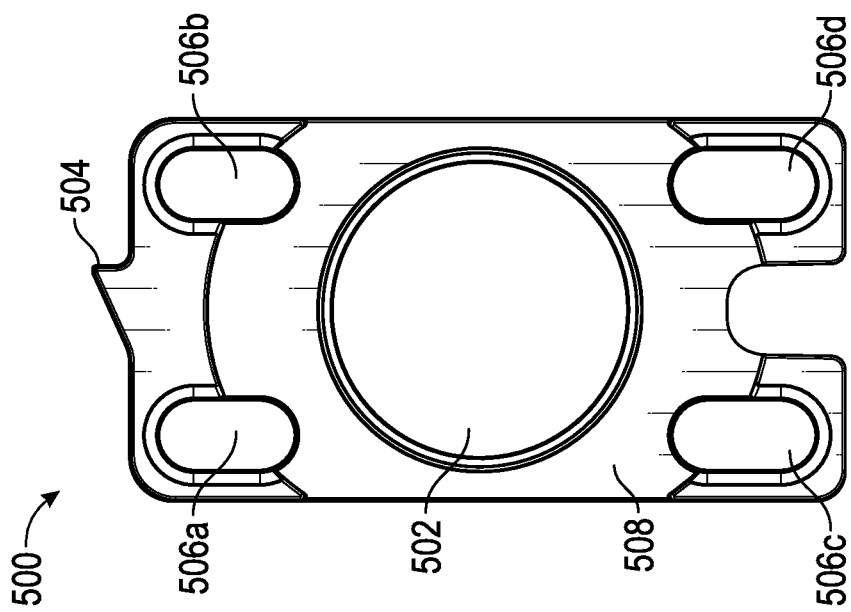
FIG. 5A is a top-down view of an example of a latch of a low profile latching mechanism, in accordance with embodiments of the disclosure.

FIG. 5A is a top-down view of an example of a latch 500 of a low profile latching mechanism, in accordance with embodiments of the disclosure. In embodiments, latch 500 may correspond to latch 406, as previously described at FIG. 4. The latch 500 may include a body 508 formed of a rigid material. In embodiments, the body 508 may be formed of any moldable or machinable material. In some embodiments, the body 508 may be formed of a metal or metallic alloy material. For example, the body 508 may be formed of steel, stainless steel, copper, brass, aluminum, etc. In an embodiment, the body 508 may be formed of a plastic or polymeric material. For example, the body may be formed of nylon, high-density polyethylene (HDPE), polyvinyl chloride (PVC), etc. In embodiments, the body 508 may be formed of a layered material that is baked with an epoxy, such as carbon fiber.

The body 508 may include a first opening 502 that may be positioned near the center of the body 508 of the latch 500. The first opening 502 and second openings 506a-d may correspond to volumes of space of latch 500 where there is an absence of the material of body 508. In embodiments, the first opening 502 may be a circular opening. In an embodiment, the first opening 502 may have a diameter of approximately 0.79 inches. In some embodiments, the first opening 502 may be an elliptical opening. In an embodiment, the first opening 502 may be a rectangular opening. In embodiments, the first opening 502 may be an opening having any type of geometry.

The body 508 may include a ridge 504 that protrudes from a side of the body 508 of latch 500. In embodiments, the ridge 504 may have a same or substantially similar height to the body 508 of latch 500. In some embodiments, the ridge 504 may have a smaller height than the body 508 of latch 500.

The body 508 may further include second openings 506a-d that may be positioned near the perimeter of body 508 of the latch 500. In embodiments, the second openings 506a-d may be elliptical openings. In some embodiments, the second openings 506a-d may have a diameter of approximately 0.18 inches. In an embodiment, the second openings 506a-d may be rectangular openings. In embodiments, the second openings 506a-d may be openings having any type of geometry.

FIG. 5B is a side-profile view of an example of a latch 525 of a low profile latching mechanism, in accordance with embodiments of the disclosure. Latch 525 may correspond to latch 500, as previously described at FIG. 5A. The latch 525 includes a body 508 having a height 533. In embodiments, the height 533 may be less than 0.20 inches. In some embodiments, the height 533 may be approximately 0.10 inches.

In embodiments, the body 508 of latch 525 may include a lip 527 around the perimeter of first opening 502 of FIG. 5A, where the lip 527 has a height 531. In some embodiments, the height 531 of lip 527 may be greater than the height 533 of body 508. In some embodiments, the height 531 may be approximately 0.125 inches. In embodiments, the height 531 of lip 527 may be the same as height 533 of body 508.

In some embodiments, the body 508 may include grooves 529 to interface with a mechanical energy storage component (e.g., mechanical energy storage component 408 of FIG. 4). For example, the mechanical energy storage component 408 may be a torsion spring and each end of the torsion spring may reside in one of grooves 529 of body 508. In an embodiment, the grooves 529 may be on an opposite side of body 508 as ridge 504 of FIG. 5A.

Figure 6A:
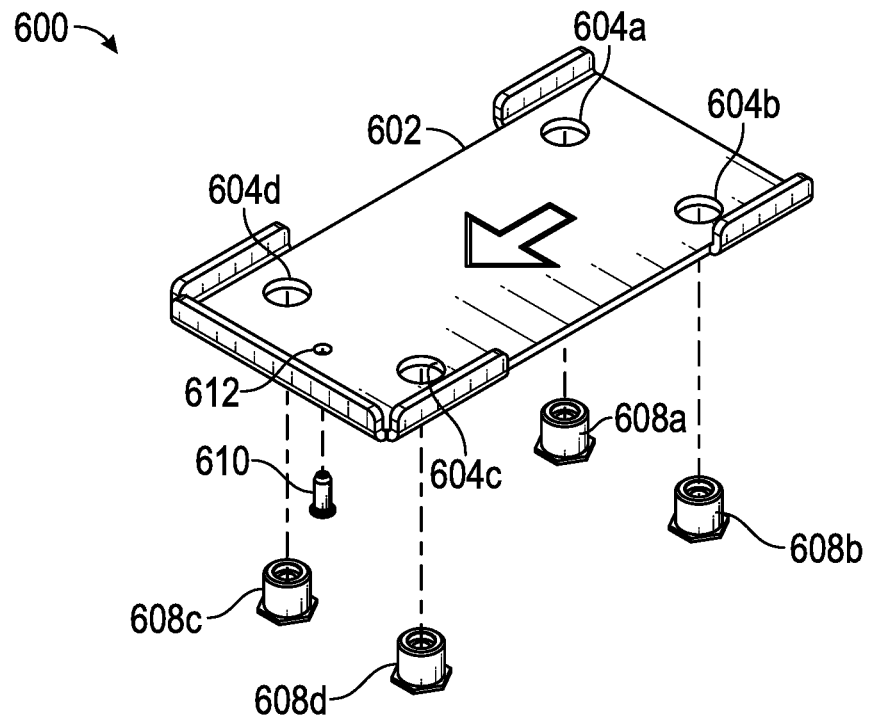
FIG. 6A is an illustration of an example of a latch housing of a low profile latching mechanism, in accordance with embodiments of the disclosure.

FIG. 6A is an illustration of an example of a latch housing 600 of a low profile latching mechanism, in accordance with embodiments of the disclosure. In embodiments, latch housing 600 may correspond to latch housing 410, as previously described at FIG. 4. The latch housing 600 may include a body 602 formed of a rigid material. In embodiments, the body 602 may be formed of any moldable or machinable material. In some embodiments, the body 602 may be formed of a metal or metallic alloy material. For example, the body 602 may be formed of steel, stainless steel, copper, brass, aluminum, etc. In an embodiment, the body 602 may be formed of a plastic or polymeric material. For example, the body may be formed of nylon, high-density polyethylene (DPE), polyvinyl chloride (PVC), etc.

The latch housing 600 may include standoffs 608a-d to couple the latch housing 600 to a cover (not shown) of a storage system enclosure. In embodiments, the standoffs 608a-d may be inserted through corresponding openings 604a-d in the body 602 of the latch housing 600. In other embodiments, the standoffs 608a-d may be manufactured features of the body 602 of the latch housing 600. In some embodiments, the standoffs 608a-d may be threaded standoffs that couple to threaded couplings (e.g., threaded couplings 404 of FIG. 4). In some embodiments, the threads of threaded standoffs may have a determined depth to prevent the threaded couplings from being over-tightened when coupling the latch housing 600 to the cover of the storage system enclosure.

In some embodiments, the latch housing 600 may include a pin 610 that interfaces with a mechanical energy storage component (e.g., mechanical energy storage component 408 of FIG. 4). For example, if the mechanical energy storage component is a torsion spring, the torsion spring may be placed over pin 610 to hold the torsion spring in a desired location within the latch housing 600. In embodiments, the pin 610 may be inserted through an opening 612 in body 602 of latch housing 600. In other embodiments, pin 610 may be a manufactured feature of the body 602 of the latch housing 600.

Figure 6B:
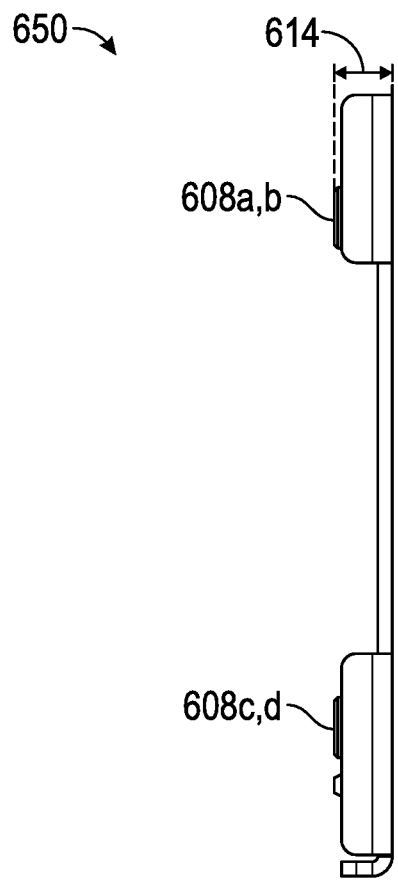
FIG. 6B is a side profile view of an example of a latch housing of a low profile latching mechanism, in accordance with embodiments of the disclosure.

FIG. 6B is a side profile view of an example of a latch housing 650 of a low profile latching mechanism, in accordance with embodiments of the disclosure. In embodiments, the latch housing 650 may have a height 614 that corresponds to the height of standoffs 608a-d. In some embodiments, the height 614 of the latch housing 600 may be less than 0.20 inches.

Figure 7:
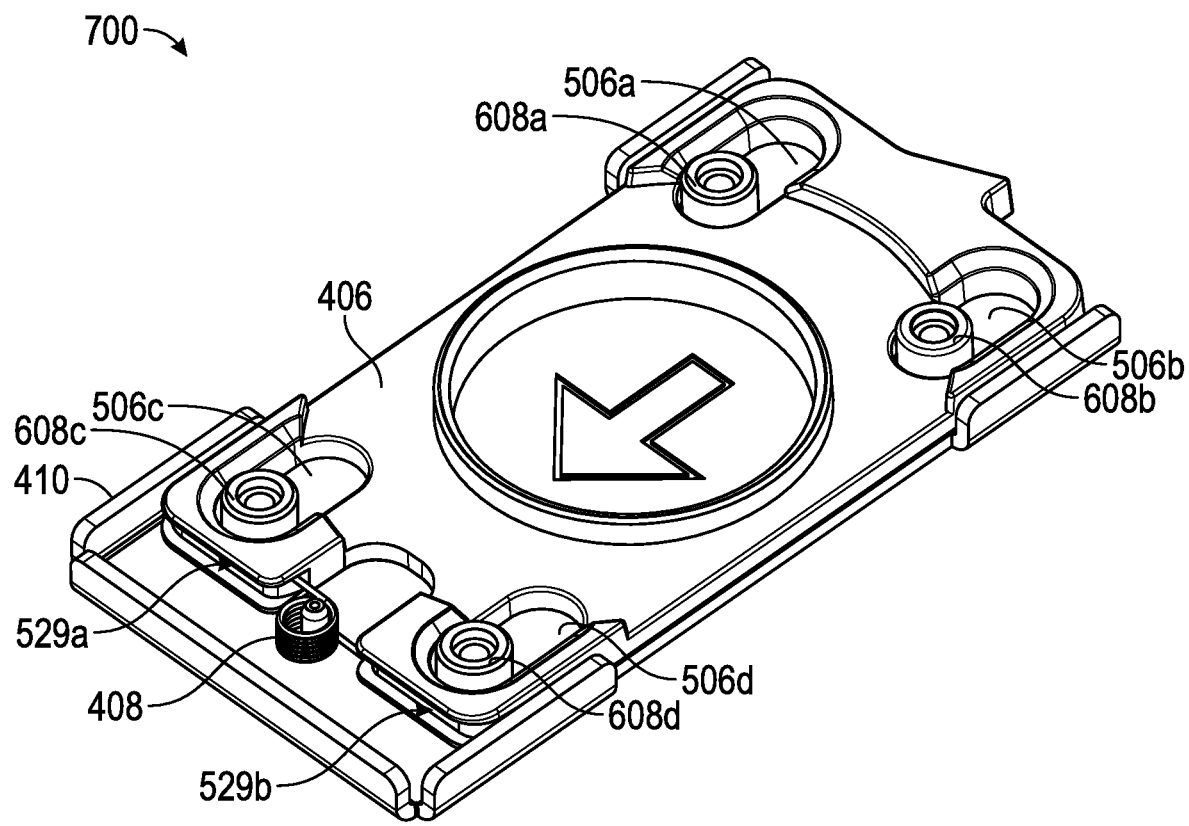
FIG. 7 is an illustration of a low profile latching mechanism assembly in accordance with embodiments of the disclosure.

FIG. 7 is an illustration of a low profile latching mechanism assembly 700 in accordance with embodiments of the disclosure. The low profile latching mechanism assembly 700 may include latch 406, mechanical energy storage component 408 and latch housing 410 of FIG. 4. As previously described, latch 406 may include grooves 529a, b that interface with the mechanical energy storage component 408. For example, a first end of the mechanical energy storage component 408 may reside in groove 529a, while a second end of the mechanical energy storage component 408 may reside in groove 529b.

The standoffs 608a-d of the latch housing 410 may protrude through the openings 506a-d of the latch 406 and may serve as guides for the latch 406 as the latch 406 is moved laterally with respect to the latch housing 410 to engage/disengage the low profile latching mechanism. Aspects of the engagement/disengagement of the low profile latching mechanism as discussed in further detail below.

FIG. 8A is a top-down view of an example of a cover 800 of a storage system enclosure in accordance with embodiments of the disclosure. In embodiments, cover 800 may correspond to cover 402 of FIG. 4. The cover 800 may include a body 802 formed of a rigid material. In some embodiments, the body 802 may be formed of a metal or metallic alloy material. For example, the body 802 may be formed of steel, stainless steel, copper, brass, aluminum, etc. In an embodiment, the body 802 may be formed of a plastic or polymeric material. For example, the body may be formed of nylon, high-density polyethylene (HDPE), polyvinyl chloride (PVC), etc.

A first opening 804 may be formed in the body 802 of the cover 800. The first opening 804 may be positioned over opening 502 of latch 500 of FIG. 5A to enable a user to engage/disengage the latch 500 by moving the latch 500 in a lateral direction. In embodiments, second openings 806a-d may be formed in the body 802 of the cover 800. The second openings may be positioned over standoffs 608a-d of the latch housing 600 of FIG. 6A to facilitate the coupling of the latch housing 600 to the cover 800 via one or more threaded couplings.

In some embodiments, to minimize the impact of the heads of the threaded couplings on the height of the storage system enclosure, the second openings 806a-d may include countersinks 808a-d, respectively. The countersinks 808a-d may bevel the rim of openings 806a-d such that a portion of the heads of the threaded couplings reside within the countersinks 808a-d, reducing the height of the storage system enclosure and preventing interference when the storage system enclosures are added/removed from a rack (e.g., blade enclosure) of the storage system.

FIG. 8B is a side-profile view of a cover 850 of a storage system enclosure in accordance with embodiments of the disclosure. The cover 850 may include a ridge 852 that secures one end of the cover 850 to a base (e.g., base 412 of FIG. 4) of a storage system enclosure via physical interference between the cover 850 and the base. In embodiments, the sides of cover 850 may include one or more slots 854 that may interface with guidance pins of the base to guide the cover 850 into the proper locking position, as will be described in further detail below.

Figure 9A:
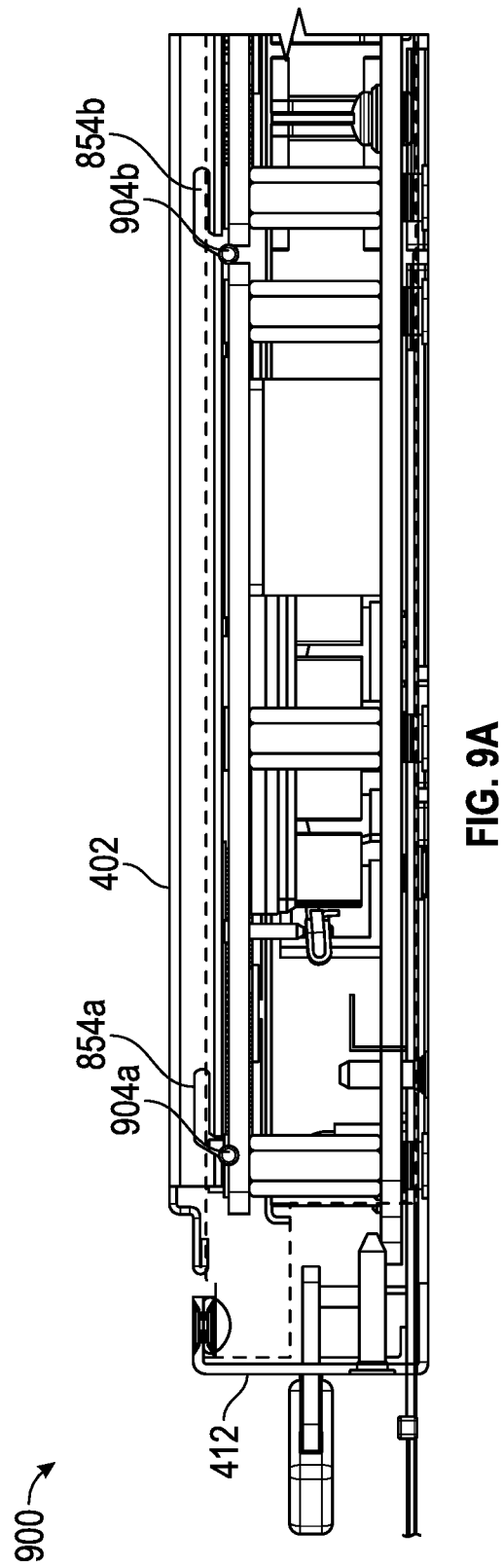
FIG. 9A is an illustration of an example of placing a cover of a storage system enclosure onto a base of the storage system enclosure in accordance with embodiments of the disclosure.

FIG. 9A is an illustration 900 of an example of placing a cover of a storage system enclosure onto a base of the storage system enclosure in accordance with embodiments of the disclosure. Illustration 900 includes a cover 402 and base 412 of a storage system enclosure. To begin closing the storage system enclosure, the cover 402 may be placed on the base 412. The sides of cover 402 may rest on guidance pins 904a, b of the base 412. The sides of cover 402 may also include slots 854a, b to interface with guidance pins 904a, b of the base 412. The cover 402 may move in a lateral direction while resting on guidance pins 904a, b until the openings in slots 854a, b are in alignment with guidance pins 904a, b, respectively.

Figure 9B:
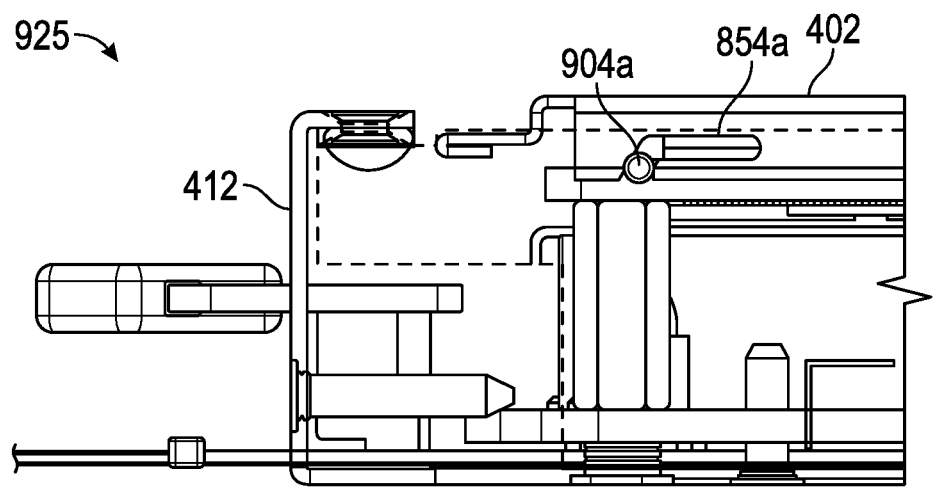
FIG. 9B is an illustration of an example of openings in slots of a cover being in alignment with guidance pins of a base of a storage system enclosure in accordance with embodiments of the disclosure.

FIG. 9B is an illustration 925 of an example of openings in slots of a cover being in alignment with guidance pins of a base of a storage system enclosure in accordance with embodiments of the disclosure. Upon moving the cover 402 laterally along guidance pin 904a, the opening of slot 854a is in alignment with guidance pin 904a. Once the guidance pin 904a is in alignment with the opening of slot 854a, the guidance pin 904a may enter slot 854a, causing cover 402 to lower.

Figure 9C:
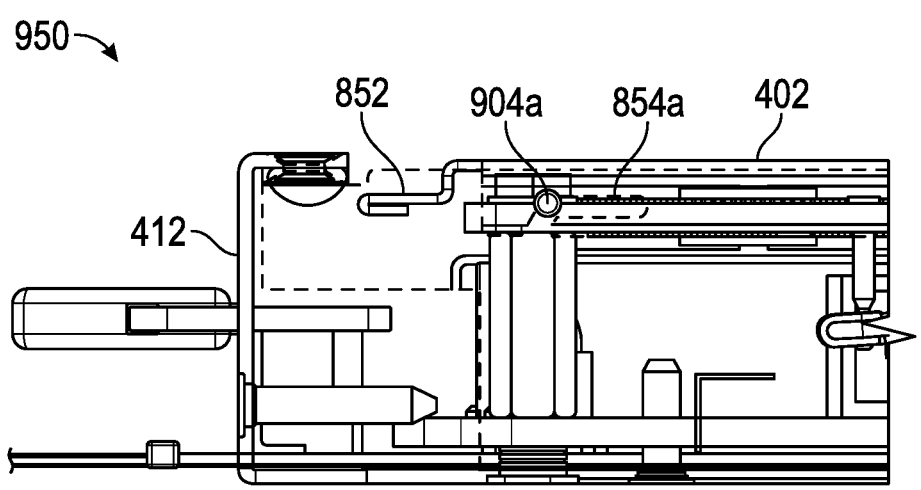
FIG. 9C is an illustration of an example of closing a portion of a storage system enclosure, in accordance with embodiments of the disclosure.

FIG. 9C is an illustration 950 of an example of closing a portion of a storage system enclosure, in accordance with embodiments of the disclosure. Upon cover 402 lowering into guidance pin 904a, cover 402 may continue to move laterally along guidance pin 904a until ridge 852 of cover 402 interfaces with base 412. Physical interference between the ridge 852 of the cover 402 and the base 412 of the storage system enclosure may secure cover 402 to the base 412.

Figure 10A:
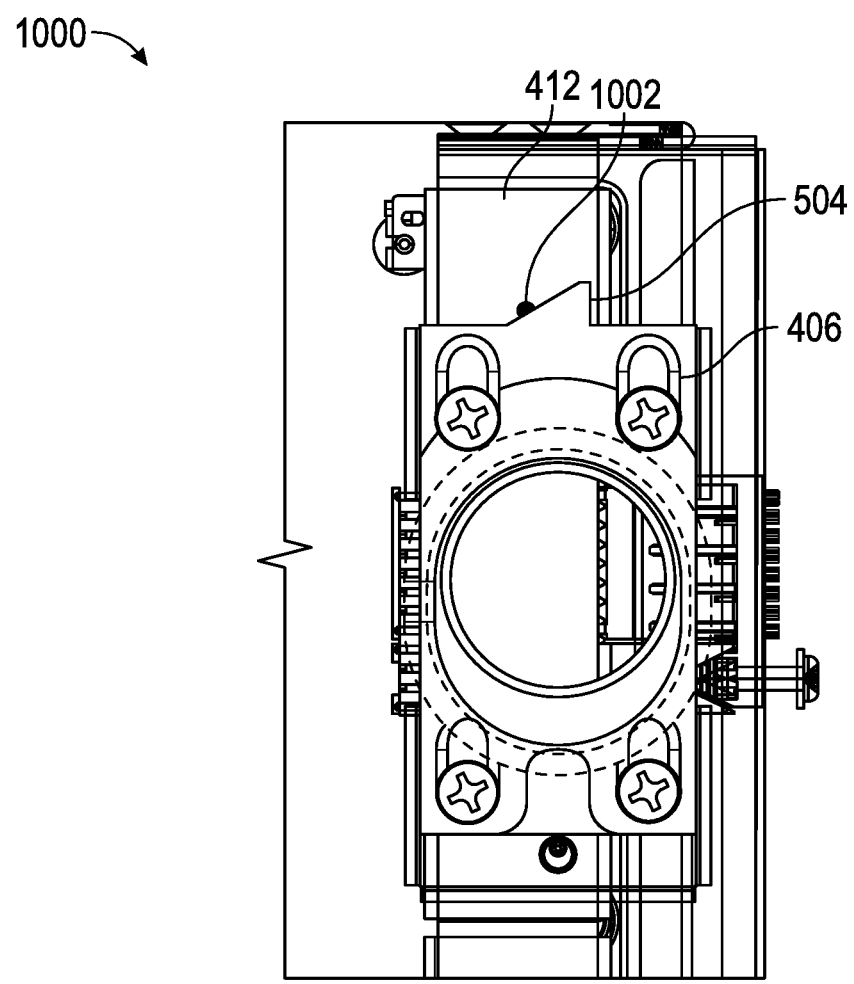
FIG. 10A is an illustration of an example of engaging a low profile latching mechanism in accordance with embodiments of the disclosure.
Figure 10C:
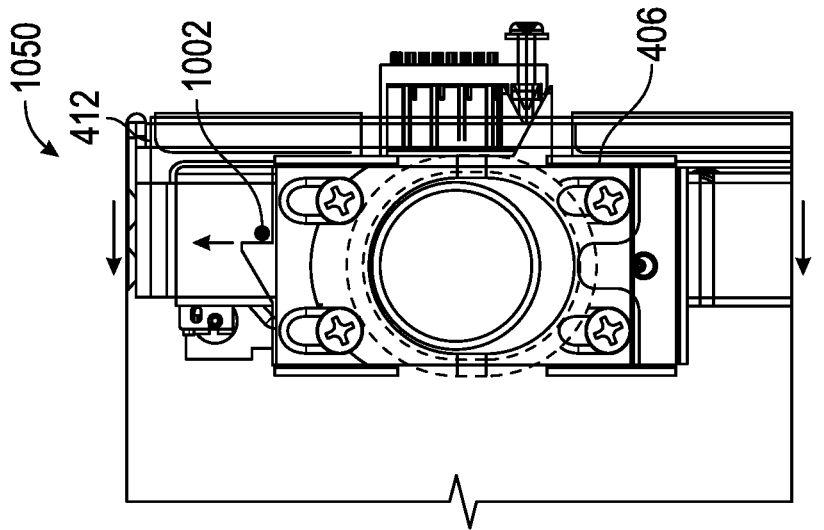
FIG. 10C is an illustration of an example of a low profile latching mechanism locking a cover of a storage system enclosure in accordance with embodiments of the disclosure.
Figure 10B:
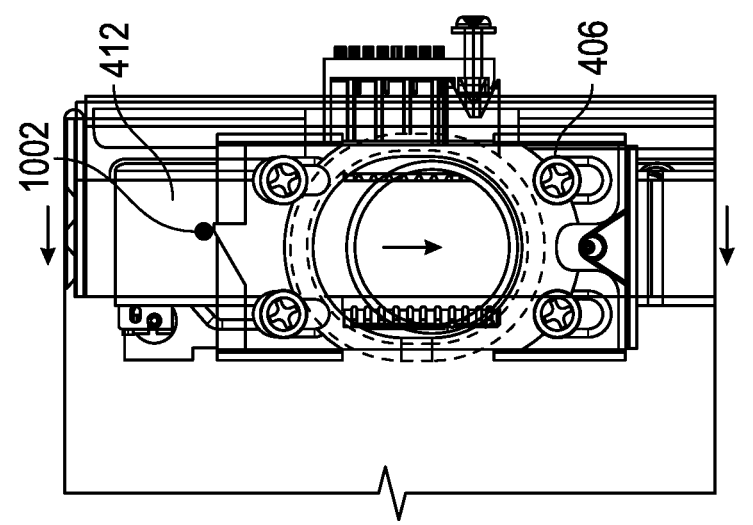
FIG. 10B is an illustration of an example of closing a storage system enclosure having a low profile latching mechanism in accordance with embodiments of the disclosure.

FIGS. 10A-C illustrate a process of engaging a low profile latching mechanism in accordance with aspects of the disclosure. Aspects illustrated in FIGS. 10A-C may occur at a same or substantially similar time to the process illustrated in FIGS. 9A-C. The illustrations in FIGS. 10A-C may occur at a different position of the storage system enclosure than the position of the storage system enclosure illustrated in FIGS. 9A-C. For example, the process illustrated in FIGS. 9A-C may occur at one end of a storage system enclosure while the process illustrated in FIGS. 10A-C may occur at the opposite end of the storage system enclosure. For clarity, the cover of the storage system enclosure is not shown.

FIG. 10A is an illustration 1000 of an example of engaging a low profile latching mechanism in accordance with embodiments of the disclosure. As the cover of the storage system enclosure is slid laterally along the guidance pins of the base of the storage system enclosure, the ridge 504 of latch 406 may come into contact with a locking pin 1002 of the base 412 of the storage system enclosure. In embodiments, to prevent material shavings from being deposited in the storage system enclosure during the engaging/disengaging of the low profile latching mechanism, the material of locking pin 1002 may have a hardness that is higher than the hardness of the material of latch 406.

FIG. 10B is an illustration 1025 of an example of closing a storage system enclosure having a low profile latching mechanism in accordance with embodiments of the disclosure. In illustration 1025, the cover of the storage system is slid laterally (to the left) along the guidance pins of the base 412 of the storage system enclosure, as previously described at FIGS. 9A-C. As the cover is slid laterally, physical interference between the locking pin 1002 of the base 412 and the latch 406 may cause the latch 406 to travel in a downward direction. As the latch 406 travels in the downward direction, the mechanical energy storage component (not shown) stores mechanical energy generated by the travel of the latch 406.

FIG. 10C is an illustration 1050 of an example of a low profile latching mechanism locking a cover of a storage system enclosure in accordance with embodiments of the disclosure. When the cover of the storage system enclosure has reached the closed position, the edge of the ridge of latch 406 may move past the locking pin 1002. Upon the edge of the ridge of latch 406 moving past the locking pin 1002, the mechanical energy storage component may transmit the stored mechanical energy to the latch 406, causing the latch 406 to move in an upward direction. While in the upper position, physical interference between the ridge of latch 406 and the locking pin 1002 may prevent the cover of the storage system enclosure from opening (e.g., moving to the right). To open the storage system enclosure, a user may disengage the low profile latching mechanism by applying a downward force to the latch 406 of the low profile latching mechanism and sliding the cover to the right.

FIG. 11A is an illustration 1100 of an example of a mechanical energy storage component providing mechanical energy to a latch of a low profile latching mechanism in accordance with embodiments of the disclosure. In illustration 1100, the mechanical energy storage component 408 is shown as a torsion spring. However, in embodiments of the disclosure the mechanical energy storage component 408 may be any component configured to store and provide mechanical energy to/from the latch 406 of the low profile latching mechanism.

Illustration 1100 shows latch 406 in an upper position, as previously described at FIG. 10C. While in the upper position, the mechanical energy storage component 408 may provide mechanical energy to the latch 406. The mechanical energy may hold the latch 406 of the low profile latching mechanism in the upper position.

FIG. 11B is an illustration 1150 of an example of a mechanical energy storage component storing mechanical energy generated by movement of a latch of a low profile latching mechanism in accordance with embodiments of the disclosure. In illustration 1150, latch 406 has moved laterally in a downward direction. As the latch 406 moves in a downward direction, the ends of the mechanical energy storage component 408 are deflected in a downward direction, causing the mechanical energy storage component 408 to store the mechanical energy generated by the downward movement of latch 406.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular embodiments may vary from these exemplary details and still be contemplated to be within the scope of the present disclosure.

Reference throughout this specification to "one embodiment" or "an embodiment" means that a particular feature, structure, or characteristic described in connection with the embodiments included in at least one embodiment. Thus, the appearances of the phrase "in one embodiment" or "in an embodiment" in various places throughout this specification are not necessarily all referring to the same embodiment.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize. The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such. Furthermore, the terms "first," "second," "third," "fourth," etc. as used herein are meant as labels to distinguish among different elements and may not necessarily have an ordinal meaning according to their numerical designation.

What is claimed is:

1. A storage system enclosure comprising:
a base comprising a locking pin; and
one or more solid-state storage devices, non-volatile random access memory (NVRAM), and one or more storage controllers coupled to the base, wherein the one or more storage controllers are operatively coupled to the one or more solid-state storage devices and the NVRAM to perform storage operations; and
a cover comprising a latching mechanism, the latching mechanism comprising:
a latch housing comprising a plurality of standoffs;
a mechanical energy storage component operatively coupled to the latch housing; and
a latch positioned inside the latch housing and operatively coupled to the mechanical energy storage component on a first side of the latch, the latch comprising a first opening positioned near a center of a body of the latch to enable a user to engage and disengage the latch by moving the latch in a lateral direction, a plurality of second openings positioned near a perimeter of the body of the latch and a ridge on a second side of the latch, wherein each of the plurality of standoffs protrude into a corresponding second opening of the plurality of second openings and wherein the latch moves in the lateral direction relative to the latch housing to interface the ridge with the locking pin of the base to secure the cover of the storage system enclosure.

2. The storage system enclosure of claim 1, wherein the base comprises a plurality of guidance pins and wherein the cover comprises a first plurality of slots on a first side of the cover and a second plurality of slots on the second side of the cover, wherein the first plurality of slots and the second plurality of slots interface with the plurality of guidance pins to align the cover relative to the base.

3. The storage system enclosure of claim 1, wherein the locking pin is comprised of a first material having a first hardness and wherein the latch is comprised of a second material having a second hardness that is less than the first hardness.

4. The storage system enclosure of claim 3, wherein the first material comprises a metal or metallic alloy and the second material comprises a plastic material or a polymeric material.

5. The storage system enclosure of claim 1, wherein the mechanical energy storage component comprises a torsion spring.

6. The storage system enclosure of claim 5, wherein the latch comprises a first groove on the first side of the latch and a second groove on the first side of the latch, wherein a first end of the torsion spring resides in the first groove and wherein a second end of the torsion spring resides in the second groove.

7. The storage system enclosure of claim 1, wherein the latch housing has a height of less than 0.20 inches.

8. The storage system enclosure of claim 1, wherein the latch has a height of less than 0.15 inches.

\* \* \* \* \*